US009001516B2

(12) United States Patent
Nakayama et al.

(10) Patent No.: US 9,001,516 B2
(45) Date of Patent: Apr. 7, 2015

(54) ELECTRONIC CIRCUIT UNIT TO BE MOUNTED ON AUTOMATIC TRANSMISSION FOR VEHICLE AND MANUFACTURING METHOD THEREOF

(75) Inventors: Osamu Nakayama, Yokkaichi (JP); Kouichi Matsumoto, Yokkaichi (JP)

(73) Assignees: Autonetworks Technologies Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 275 days.

(21) Appl. No.: 13/818,233

(22) PCT Filed: Sep. 9, 2011

(86) PCT No.: PCT/JP2011/005091
§ 371 (c)(1),
(2), (4) Date: Feb. 21, 2013

(87) PCT Pub. No.: WO2012/032789
PCT Pub. Date: Mar. 15, 2012

(65) Prior Publication Data
US 2013/0148313 A1     Jun. 13, 2013

(30) Foreign Application Priority Data

Sep. 9, 2010   (JP) ................................ 2010-202049
Sep. 13, 2010  (JP) ................................ 2010-204051

(51) Int. Cl.
*H05K 5/00*       (2006.01)
*H05K 13/00*      (2006.01)
*F16H 61/00*      (2006.01)

(52) U.S. Cl.
CPC .......... *H05K 5/0073* (2013.01); *F16H 61/0006* (2013.01); *H05K 5/0069* (2013.01); *H05K 5/0082* (2013.01); *H05K 13/00* (2013.01)

(58) Field of Classification Search
USPC .............. 361/747; 74/335, 473.1; 701/51, 67; 137/511; 29/832, 893.1; 251/129.01
See application file for complete search history.

(56) References Cited

U.S. PATENT DOCUMENTS 8,317,541 B2 * 11/2012 Kikuchi ........................ 439/595
2004/0055783 A1   3/2004 Masuda
(Continued)

FOREIGN PATENT DOCUMENTS

JP    U-4-115785      10/1992
JP    A-2001-244007    9/2001
(Continued)

OTHER PUBLICATIONS

Dec. 13, 2011 International Search Report issued in International Application No. PCT/JP2011/005091.

*Primary Examiner* — Hung S Bui
*Assistant Examiner* — Michael Matey
(74) *Attorney, Agent, or Firm* — Oliff PLC

(57) ABSTRACT

Provided is an electronic circuit unit to be mounted within a casing of an automatic transmission for a vehicle. An electronic circuit body including circuit-side terminals protruding in an outward direction from a main-body, connectors to be connected to the electronic circuit body, a cover, and a base member having a placing face on which the cover, the electronic circuit body and the connectors are placed. The cover is provided with a main-body covering part, fitting-portion covering parts and which cover a fitting-portion of the circuit-side terminals and fitting parts of the wire-side terminals from a side opposing to the placing face, and a restricting part for regulating the detachment of the connectors from the fitting position to the detached position.

21 Claims, 26 Drawing Sheets

(56) References Cited

U.S. PATENT DOCUMENTS

2006/0023426 A1* 2/2006 Murakami et al. ............ 361/715
2012/0240396 A1* 9/2012 Becker et al. .................. 29/841
2013/0323955 A1* 12/2013 Nishio et al. .................. 439/325

FOREIGN PATENT DOCUMENTS

| JP | A-2003-272754 | 9/2003 |
| JP | A-2004-95974 | 3/2004 |
| JP | A-2005-235538 | 9/2005 |

* cited by examiner

ELECTRONIC CIRCUIT UNIT TO BE MOUNTED ON AUTOMATIC TRANSMISSION FOR VEHICLE AND MANUFACTURING METHOD THEREOF

TECHNICAL FIELD

The present invention relates to an electronic control unit which is mounted on an automatic transmission for a vehicle and which has a built-in electronic circuit for controlling the automatic transmission for a vehicle.

BACKGROUND ART

Conventionally, as an electronic circuit body having a built-in electronic circuit, the type described in Patent Document 1 is known. FIGS. 31 and 32 are schematic diagrams of the electronic circuit body described in Patent Document 1.

The electronic circuit body 10 shown in FIGS. 31 and 32 includes a circuit board 12, a plurality of first circuit-side terminals 14A and a plurality of second circuit-side terminals 14B, and a resin package 16. The circuit board 12 is of a rectangular shape. A plurality of circuit elements 11 that form an electronic circuit are mounted on the circuit board 12. Each of the first circuit-side terminals 14A and the second circuit-side terminals 14B is a male terminal for connecting the electronic circuit and an external circuit. The resin package 16 integrally covers the circuit board 12 and both circuit-side terminals 14A, 14B. Each of the circuit-side terminals 14A, 14B is configured, for example, from a narrow bus bar which extends linearly. These circuit-side terminals 14A, 14B are electrically connected to the circuit board 12, for instance, via a bonding wire 18.

In addition to the electronic circuit body including a plurality of male terminals as described in Patent Document 1, Patent Document 2 discloses an electronic circuit unit (described as an electronic circuit sealing member in Patent Document 2) comprising a connector for connecting the respective male terminals and an external circuit. The connector includes female terminals which are fixed to respective ends of a plurality of wires, and a connector housing for holding the female terminals. The respective female terminals retained by the connector housing fit with the respective male terminals of the electronic circuit body. The electronic circuit body and the connector are mounted on a proper place of a vehicle in a state of being retained above a common base member.

When the electronic circuit unit described in Patent Document 2 is to be used for controlling an automatic transmission for a vehicle, the electronic circuit unit is preferably housed inside a casing of the automatic transmission for the sake of simplification of wiring. Besides, oil is circulating in the casing of an automatic transmission. This oil contains small foreign material made of conducting substance, for example, metal abrasion powder. For the foreign material that may build up, for instance, in spaces between the male terminals of the electronic circuit body so that the clogged part may function as a conductive medium, it would lead some troubles such as a short circuit of the terminals.

Patent Document 1: Japanese Patent Application Publication No. 2004-095974

Patent Document 2: Japanese Patent Application Publication No. 2001-244007

SUMMARY OF THE INVENTION

Accordingly, an object of the present invention is to provide an electronic circuit unit to be provided in a casing of an automatic transmission for a vehicle and which can effectively obviate troubles caused by the foreign material contained in the oil in the casing.

In order to achieve the foregoing object, the electronic circuit unit to be mounted on an automatic transmission for a vehicle of the present invention is an electronic circuit unit to be provided in a casing of an automatic transmission for a vehicle, including: an electronic circuit body including a main-body and a plurality of circuit-side terminals, the main-body having a build-in electronic circuit, the circuit-side terminals being mutually protruding outwardly from the main-body in a common direction; a connector including a plurality of wire-side terminals and a connector housing, the wire-side terminals each having a fitting part adapted to fit with the respective circuit-side terminals, and the wire-side terminals being fixed to respective ends of a plurality of wires, the connector housing being adapted to hold the wire-side terminals in an array corresponding to an array of the circuit-side terminals; a base member including a placing face on which the electronic circuit body and the connector are to be placed, and the electronic circuit body being fixed on the placing face; and a cover placed on the placing face and fastened to the base member, wherein the cover includes: a main-body covering part adapted to cover the main-body of the electronic circuit body from a side opposing to the placing face in an assembled state where the cover and the electronic circuit body are placed on the placing face and where the circuit-side terminals fit on the fitting parts; a fitting-portion covering part extending from the main-body covering part in a protruding direction of the circuit-side terminals, the fitting-portion covering part being adapted to cover a fitting-portion of the circuit-side terminals and the fitting parts from a side opposing to the placing face in the assembled state; and a connector holder adapted to hold the connector at a fitting position where the circuit-side terminals fit with the fitting parts in the assembled state.

According to the foregoing electronic circuit unit, the electronic circuit main body and the fitting-portion are protected from either side based on the coordination of the cover and the base member. Thus, it is possible to obviate foreign material containing oil flowing within the casing of the automatic transmission from infiltrating the electronic circuit main-body and the fitting-portion side from the outside of the electronic circuit body. In particular, the fitting-portion covering part of the cover has a shape of extending from the main-body covering part to the protruding direction of the circuit-side terminals. Thus, it is possible to effectively obviate foreign material from infiltrating the fitting-portion side from the outside of the electronic circuit main body. Consequently, troubles caused by such foreign material can be obviated.

BEST MODE FOR CARRYING OUT THE INVENTION

The preferred first embodiment of the present invention is now explained with reference to the drawings.

Figure 1:
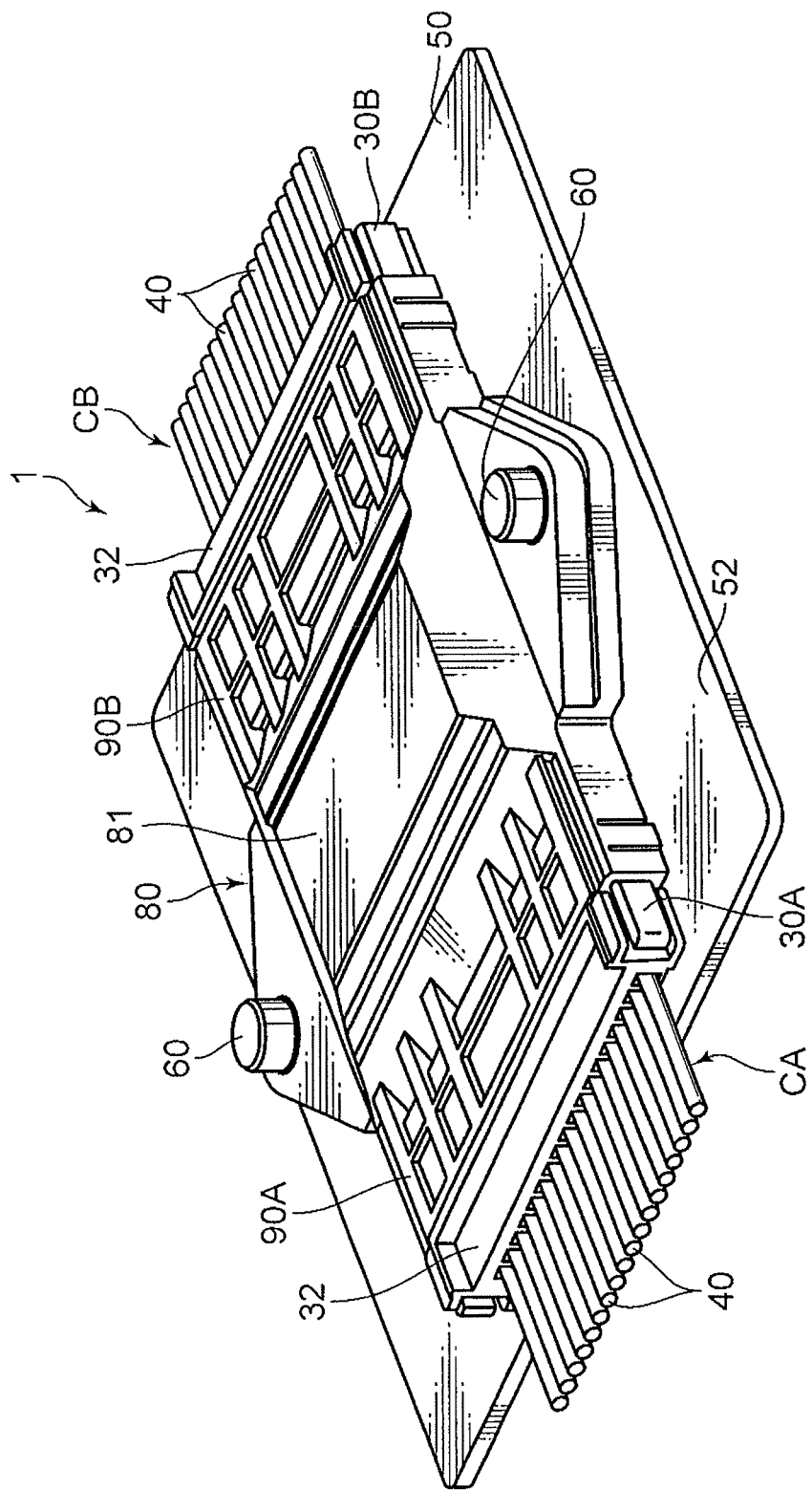
FIG. 1 is a schematic perspective view showing the electronic circuit unit according to the first embodiment of the present invention.
Figure 2:
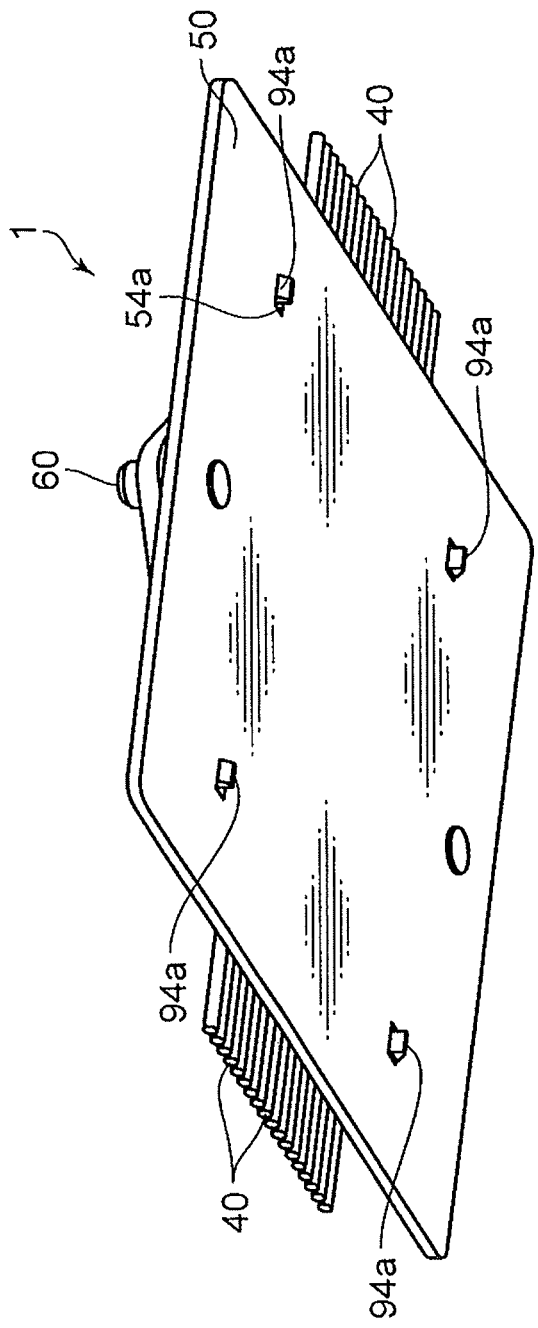
FIG. 2 is a rear view of FIG. 1.
Figure 3:
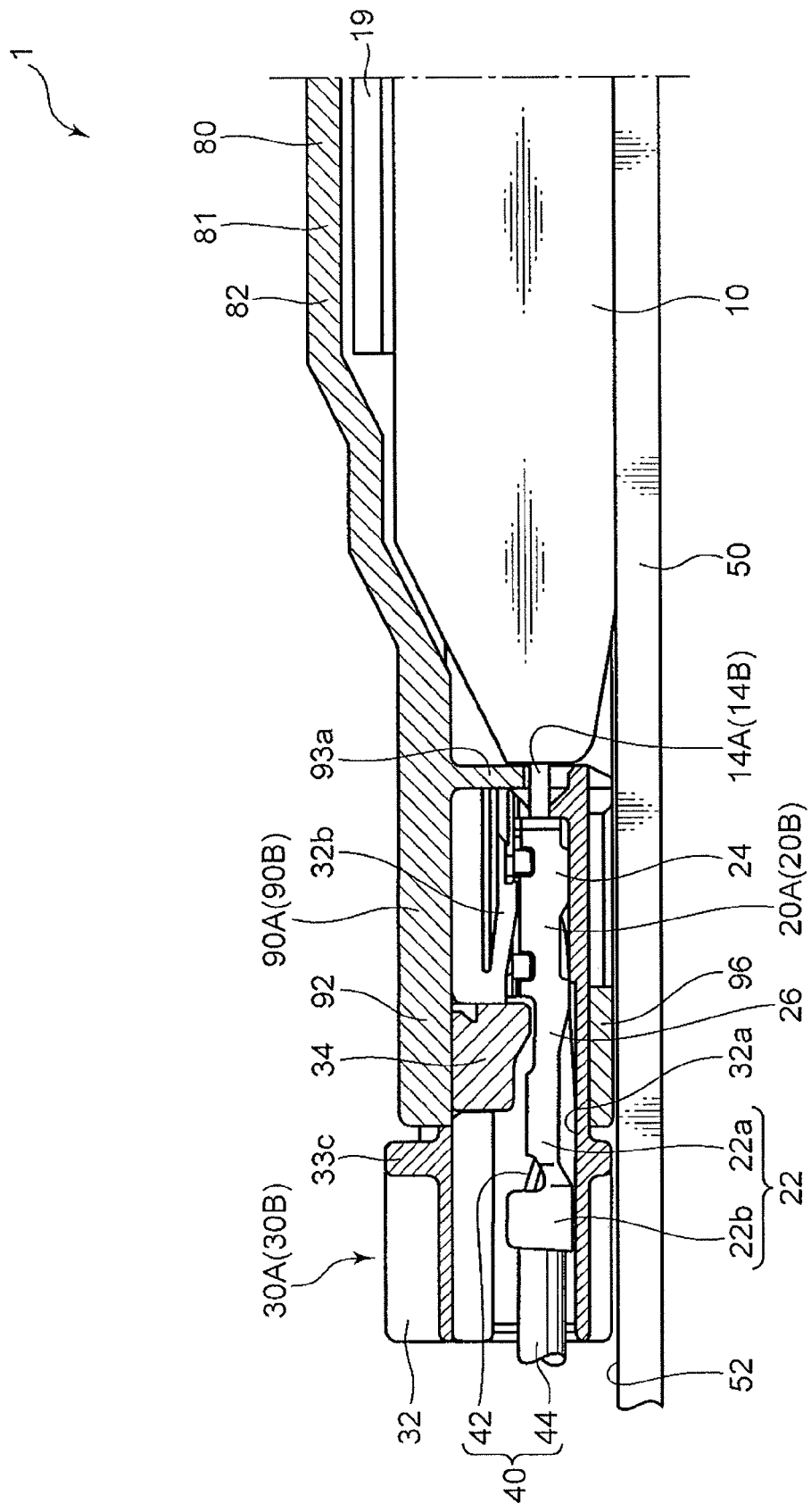
FIG. 3 is a cross-sectional view of FIG. 1.
Figure 4:
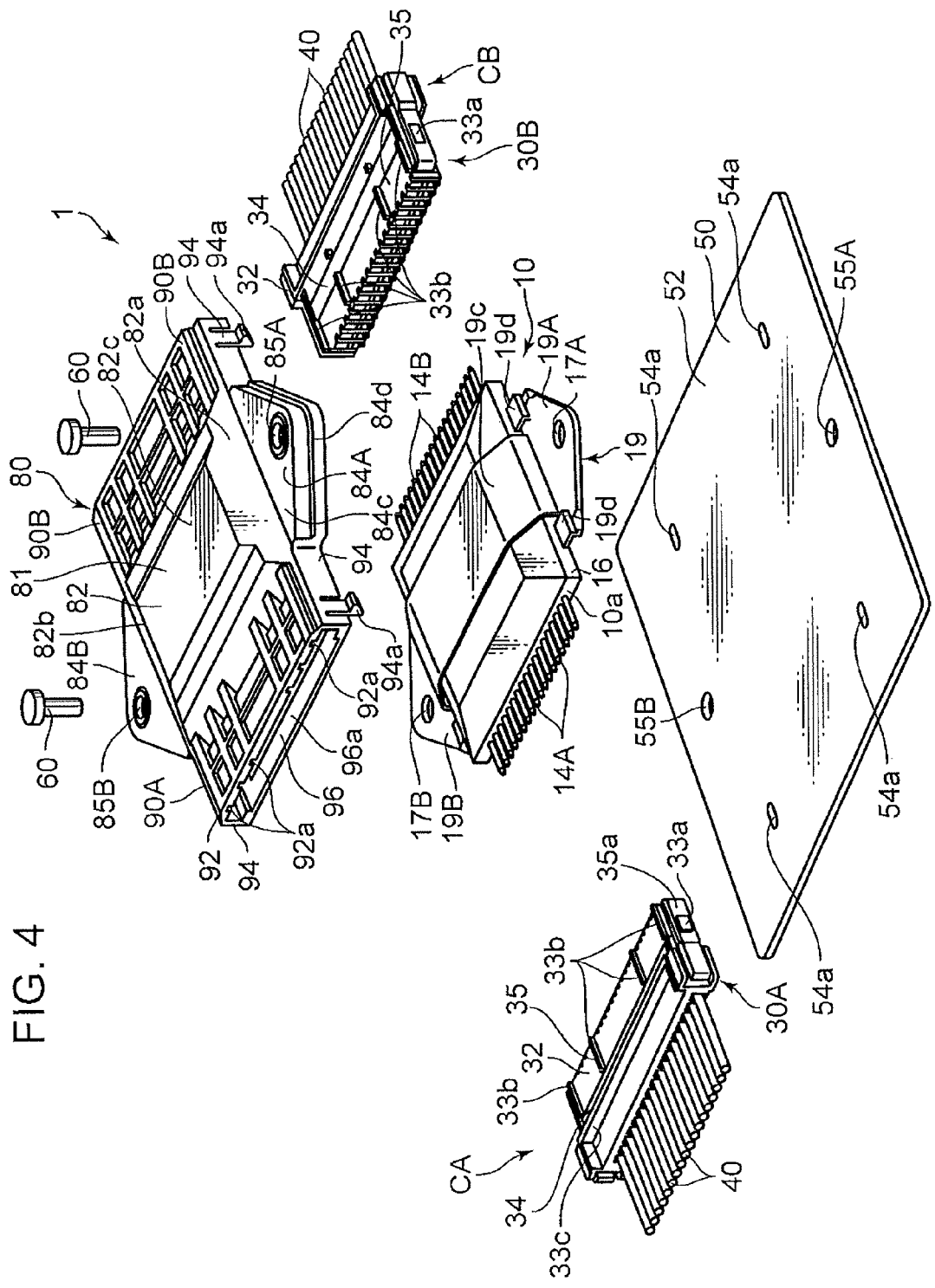
FIG. 4 is an exploded perspective view of the electronic circuit unit shown in FIG. 1.
Figure 5:
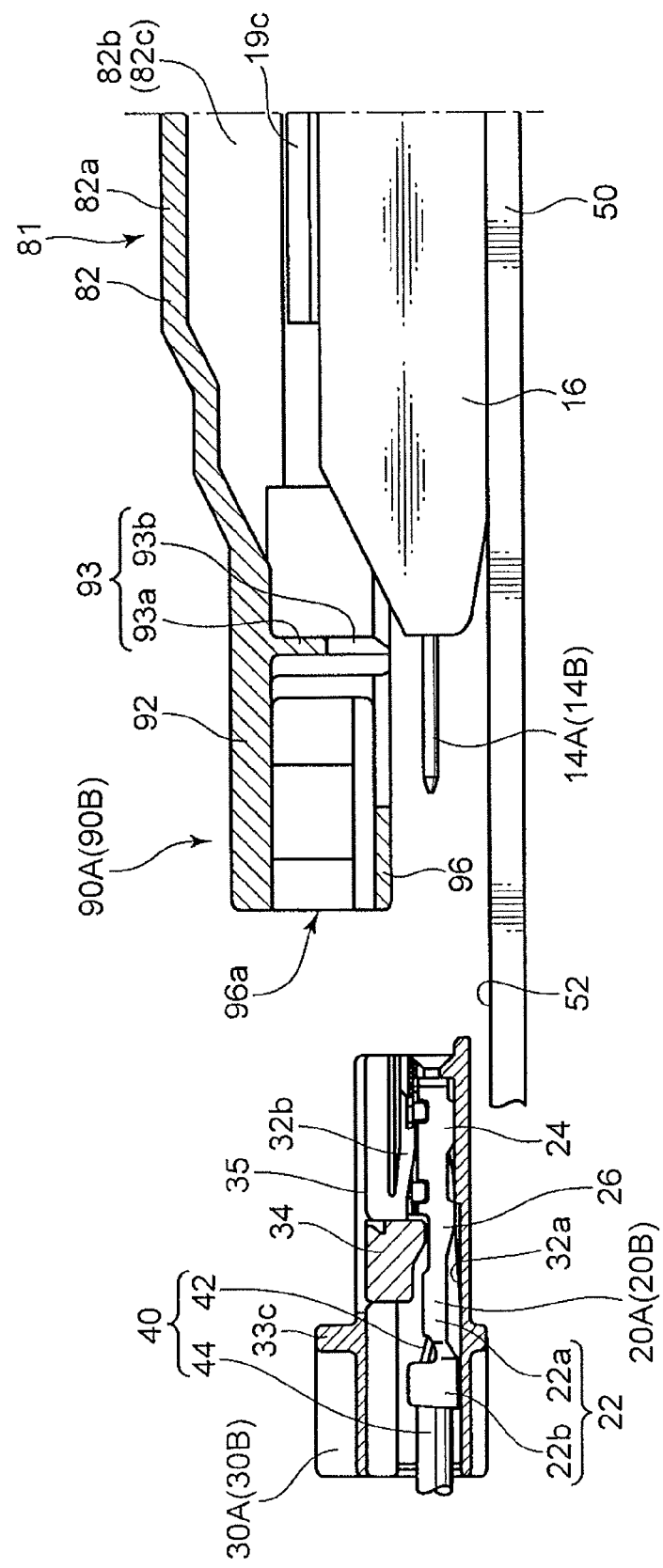
FIG. 5 is a cross-sectional view showing a state before the assembly of the electronic circuit unit shown in FIG. 1.

FIG. 1 is a schematic perspective view showing the electronic circuit unit 1 according to the first embodiment of the present invention. FIG. 2 is a rear view of FIG. 1. FIG. 3 is a cross-sectional view of FIG. 1. FIG. 4 is an exploded perspective view of the electronic circuit unit 1. FIG. 5 is a schematic exploded cross-sectional view of the electronic circuit unit 1.

The electronic circuit unit 1 includes an electronic circuit body 10, a first connector CA, a second connector CB, a base member 50, and a cover 80.

The base member 50 retains the electronic circuit body 10, both connectors CA, CB, and the cover 80. In the first embodiment, the base member 50 is a flat plate made of a metal material. One face of either a front face or a rear face of the base member 50 (face on the left side in FIG. 1) configures a placing face 52. The electronic circuit body 10, both connectors CA, CB and the cover 80 are placed on the placing face 52.

The base member 50 includes a pair of bolt through-holes 55A, 55B and a plurality of cover locking holes 54a. Each of these holes 55A, 55B, and 54a penetrates the base member 50 in a plate thickness direction. A bolt (fastening member) 60 for connecting the electronic circuit body 10 and the cover 80 to the base member 50 is inserted through the inner side of the bolt through-holes 55A, 55B. A cover locked protrusion 94a described later of the cover 80 is inserted through the inner side of the cover locking hole 54a. In the first embodiment, the base member 50 includes four cover locking holes 54a.

Figure 31:
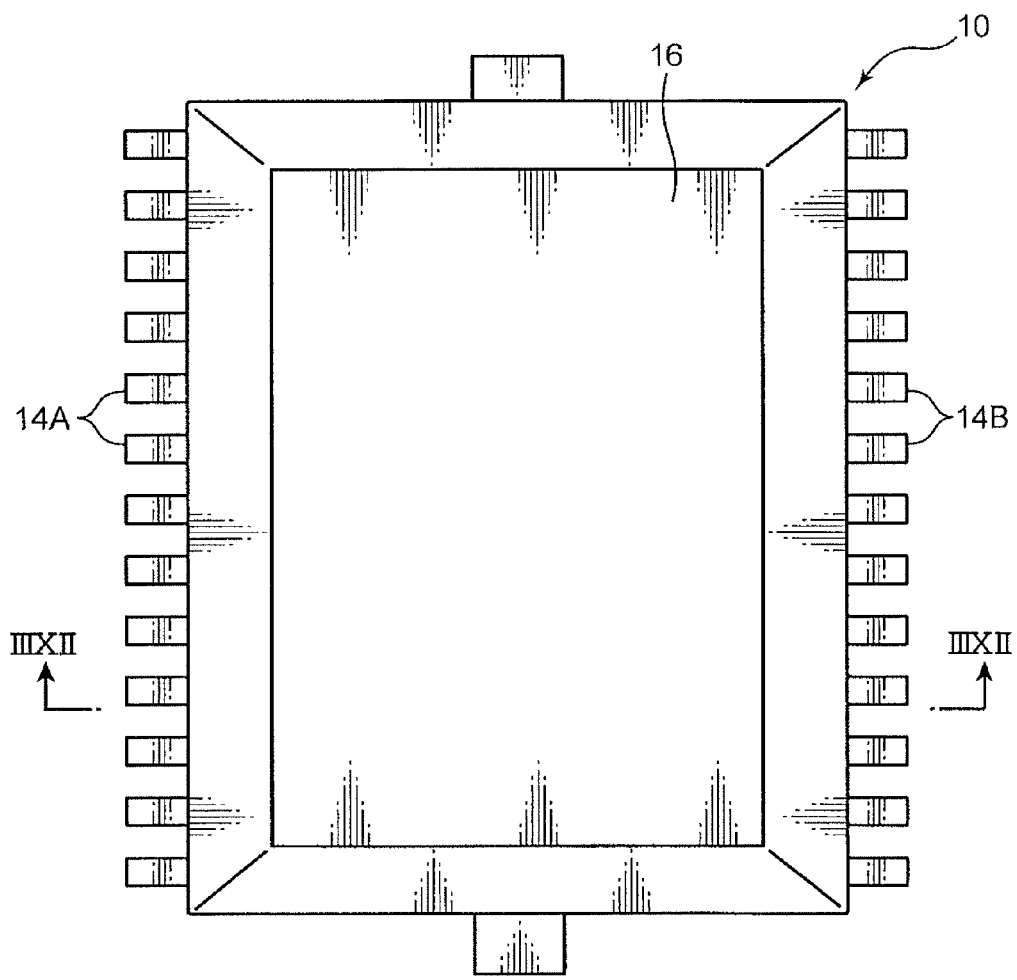
FIG. 31 is a plan view showing an example of a conventionally known electronic circuit body.
Figure 32:
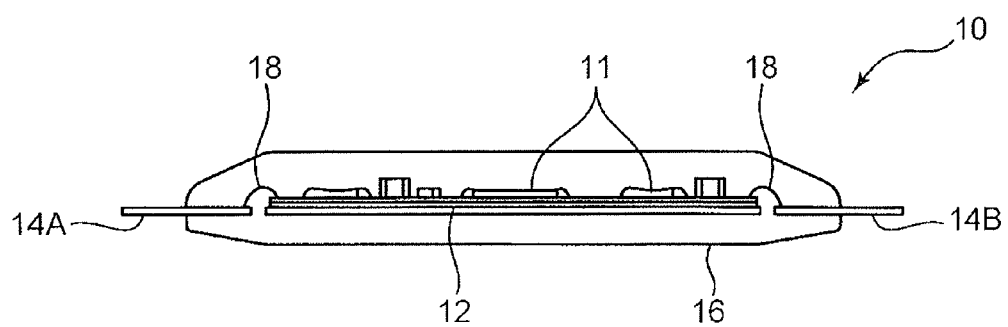
FIG. 32 is a side view of line IIIXII-IIIXII of FIG. 31.

In the first embodiment, as the electronic circuit body 10, a type having the same basic structure as the electronic circuit body 10 shown in FIG. 31 and FIG. 32 and described in Patent Document 1 is being used. In other words, the electronic circuit body 10 includes an electronic circuit main body (main-body) 10a having a built-in electronic circuit, a plurality of first circuit-side terminals 14A, and a plurality of second circuit-side terminals 14B. The electronic circuit main body 10a includes a circuit board 12 and a resin package 16.

The circuit board 12 is of a rectangular shape. A plurality of circuit elements 11 are mounted on the circuit board 12. The resin package 16 integrally covers the circuit board 12 and the circuit element 11.

Each of the first circuit-side terminals 14A is connected to the circuit board 12. Each of the first circuit-side terminals 14A protrudes from a predetermined end face configuring one side of the rectangular shape of the electronic circuit main body 10a to an outward direction (first protruding direction) that is orthogonal to the foregoing end face. Each of the first circuit-side terminals 14A extends linearly in the first protruding direction. In the ensuing explanation, the end face from which the first circuit-side terminals 14A protrude among the end faces of the electronic circuit main body 10a may be referred to as a "first end face". These first circuit-side terminals 14A are arranged along one side of the electronic circuit main body 10a.

Each of the second circuit-side terminals 14B is connected to the circuit board 12. Each of the second circuit-side terminals 14B protrudes from an end face on a side opposing to the first end face of the electronic circuit main body 10a to an outward direction (second protruding direction) that is orthogonal to the foregoing end face. Each of the second circuit-side terminals 14B extends linearly in the second protruding direction. In the ensuing explanation, the end face from which the second circuit-side terminals 14B protrude among the end faces of the electronic circuit main body 10a may be referred to as a "second end face". The second circuit-side terminals 14B are arranged along a side opposing to the side of the electronic circuit main body 10a from which the first circuit-side terminals 14A are protruding.

However, the electronic circuit body according to the present invention is not limited to the foregoing structure. In other words, there is no particular limitation regarding the internal structure of the electronic circuit body so as long as it has a main-body having a built-in electronic circuit, and the circuit-side terminals protrude from the main-body in an outward direction. Moreover, the circuit-side terminals are not limited to a type including the first circuit-side terminals and the second circuit-side terminals, and the second circuit-side terminals may be omitted from the configuration. Moreover, the circuit-side terminals may also be a type where the first circuit-side terminals and the second circuit-side terminals protrude orthogonally from adjacent sides. Moreover, the circuit-side terminals may also be a type including, in addition to the first circuit-side terminals and the second circuit-side terminals, third circuit-side terminals or the like protruding outwardly from another side of the circuit board 12.

In the first embodiment, the electronic circuit body 10 is placed on the placing face 52 in a posture where the array direction of the respective circuit-side terminals 14A, 14B and the placing face 52 become parallel. Thus, the unit dimension (thickness dimension) in a direction that is orthogonal to the placing face 52 is suppressed.

In the ensuing explanation, the direction that is orthogonal to the placing face 52 is referred to as a "vertical direction", the side that the electronic circuit body 10 and the like are placed is referred to as an "upper side", and the side opposite thereto is referred to as a "lower side". Moreover, the first protruding direction in a state where the electronic circuit body 10 is placed on the placing face 52 is referred to as "rearward", and the second protruding direction is referred to as "forward". Moreover, the array direction of the respective circuit-side terminals 14A, 14B is also referred to as a "horizontal direction".

The electronic circuit body 10 according to the first embodiment is configured by a placing member 19 being additionally added to the electronic circuit body 10 shown in FIG. 31 and FIG. 32. The placing member 19 is configured by processing a metal plate as shown in FIG. 4 and so on. The placing member 19 includes a pair of placing parts 19A, 19B, a coupling part 19c, and a connecting part 19d. The placing parts 19A, 19B are provided to either end of the placing member 19 with respect to left and right direction. The coupling part 19c couples both placing parts 19A, 19B across the resin package 16. The connecting part 19d respectively connects the respective placing parts 19A, 19B and the resin package 16.

The coupling part 19c extends along the top face of the electronic circuit main body 10a. Both placing parts 19A, 19B are positioned more on the outer left and right sides than the electronic circuit main body 10a. The both placing parts 19A, 19B take on a plate shape that spreads on a face that is substantially equal to the face on which the circuit-side terminals 14A and the second circuit-side terminals 14B are arranged. Both placing parts 19A, 19b include bolt through-holes (fastening member through-holes, through-holes) 17A, 17B that open the placing parts 19A, 19b in the plate thickness direction. A bolt 60 is inserted through the inner side of these bolt through-holes 17A, 17B. As a result of a nut 62 being mounted on the end of the bolt 60 that was inserted into the bolt through-holes 17A, 17B and the bolt through-holes 55A, 55B of the base member 50, respectively, the electronic circuit body 10 is retained by the base member 50. Note that the placing member 19 is not necessarily essential. For example, in substitute for the placing member 19, the bolt through-holes 17A, 17B may be provided directly to the electronic circuit body. Moreover, a rivet may be used in substitute for the bolt 60.

As a result of connecting to the electronic circuit body 10, the first connector CA and the second connector CB respectively connect a plurality of wires 40 to the first circuit-side terminals 14A and the second circuit-side terminals 14B of the electronic circuit body 10. In the first embodiment, the first connector CA and the second connector CB mutually have the same shape and structure.

The first connector CA includes a plurality of first wire-side terminals 20A, and a first connector housing 30A. Each of the first wire-side terminals 20A is mounted on a terminal of the respective wires 40. Similarly, the second connector CB includes a plurality of second wire-side terminals 20B, and a second connector housing 30B. Each of the second wire-side terminals 20B is mounted on a terminal of the respective wires 40.

The first wire-side terminal 20A and the second wire-side terminal 20B are configured by processing a metal plate. The first wire-side terminal 20A and the second wire-side terminal 20B mutually have the same shape and structure. As shown in FIG. 3, the first wire-side terminal 20A and the second wire-side terminal 20B respectively and integrally include a wire pressure bonding part 22, a female-type electrical contacted part 24, and a coupling part 26.

The wire pressure bonding part 22 is pressure-bonded to the terminal of the corresponding wire 40. The wire pressure bonding part 22 includes a conductive barrel 22a, and an insulation barrel 22b. The wires 40 according to the first embodiment are covered electric wires including a conducting body 42, and an insulating coating 44 which coats the conducting body 42. The insulating coating 44 has been removed from the terminal of the wires 40, and the conducting body 42 is exposed. The conductive barrel 22a is pressure-bonded to the conducting body 42 in a state of embracing the exposed conducting body 42. Based on the foregoing pressure bonding, the conducting body 42 and the wire-side terminal 20A (20B) become conducted. The insulation barrel 22b is pressure-bonded to the insulating coating 44 in a state of embracing the insulating coating 44 that is adjacent to the exposed portion of the conducting body 42.

The electrical contacted part 24 is a female-type fitting part (first fitting part, second fitting part) that enables to fit with the corresponding circuit-side terminal (first circuit-side terminal 14A regarding the first wire-side terminal 20A, and second circuit-side terminal 14B regarding the second wire-side terminal 20B). The electrical contacted part 24 comes into contact with the circuit-side terminal 14A (14B) and becomes conducted by fitting with the fitting part.

Specifically, the electrical contacted part 24 takes on a box shape extending in a predetermined axial direction. The circuit-side terminal 14A (14B) is inserted from an opening at the tip of the electrical contacted part 24 in the axial direction to the inner side of the electrical contacted part 24 along the axial direction of the electrical contacted part 24, and then comes into contact with the electrical contacted part 24. Here, in the first embodiment, the circuit-side terminal 14A (14B) extends linearly from the electronic circuit main body 10a in the protruding direction (first protruding direction, second protruding direction) thereof. Subsequently, the circuit-side terminal 14A (14B) is inserted into the electrical contacted part 24 in the axial direction. Thus, the axial direction of the electrical contacted part 24 and the direction that the circuit-side terminal 14A (14B) is inserted into the electrical contacted part 24; that is, the fitting direction of the circuit-side terminal 14A (14B) and the electrical contacted part 24 and the protruding direction (front-back direction) of the circuit-side terminal 14A (14B) coincide completely. In the ensuing explanation, the fitting direction of the circuit-side terminal 14A (14B) and the electrical contacted part 24 may be simply referred to as a "fitting direction".

The coupling part 26 of the wire-side terminal 20A (20B) is interposed between and couples the wire pressure bonding part 22 and the electrical contacted part 24. In the first embodiment, the coupling part 26 extends linearly between the electrical contacted part 24 and the wire pressure bonding part 22. Consequently, the axial direction of the electrical contacted part 24 and the axial direction of the wire 40 to which the wire pressure bonding part 22 is pressure-bonded will coincide.

Note that the axial direction of the wire 40 and the axial direction of the electrical contacted part 24 do not need to coincide. For example, the coupling part 26 may be bent midway, and the axial direction of the wire 40 and the axial direction of the electrical contacted part 24 may be orthogonal.

The first connector housing 30A and the second connector housing 30B mutually have the same shape and structure. Each of the connector housings 30A, 30B includes a housing main-body 32 and a retainer 34. The housing main-body 32 and the retainer 34 are formed from an insulation material such as synthetic resin (for example, PA66, PA6T).

The housing main-body 32 collectively holds the respective wire-side terminals 20A (20B) in a posture that enables fitting with the circuit-side terminals 14A (14B). The outer shape of the housing main-body 32 is a substantial rectangular parallelepiped extending in a direction (horizontal direction) that is parallel to the array direction of the circuit-side terminal 14A (14B). A plurality of terminal housing chambers 32a arranged with respect to left and right direction are formed on the inner side of the housing main-body 32.

Each of the wire-side terminals 20A (20B) is housed in the terminal housing chamber 32a, and held by the housing main-body 32 in a posture of being arranged in a direction (horizontal direction) that is parallel to the array direction of the circuit-side terminal 14A (14B). Each of the terminal housing chambers 32a is opened in the front-back direction. The wire-side terminals 20A are respectively inserted inside the terminal housing chamber 32a from one opening of the terminal housing chamber 32a. In the ensuing explanation, the insertion direction of the wire-side terminal 20A (20B) into the terminal housing chamber 32a may be referred to as a "terminal insertion direction".

The housing main-body 32 includes lances 32b which respectively expand toward the inner side of each of the terminal housing chambers 32a. The lance 32b locks the wire-side terminal 20A (20B) that was inserted into the terminal housing chamber 32a. The wire-side terminal 20A (20B) is held in the terminal housing chamber 32a by being locked by the lance 32b.

The circuit-side terminal 14A (14B) is inserted into the terminal housing chamber 32a from an opening on a side opposing to the opening of the terminal housing chamber 32a into which the wire-side terminal 20A (20B) is inserted. Being inserted into the terminal housing chamber 32a, the circuit-side terminal 14A (14B) is inserted into the electrical contacted part 24 of the wire-side terminal 20A (20B) that is housed in the terminal housing chamber 32a, and thereby fiting with the electrical contacted part 24 of the wire-side terminal 20A (20B). In the ensuing explanation, a state where the circuit-side terminal 14A (14B) fit with the electrical contacted part 24 of the wire-side terminal 20A (20B) may be referred to as a "fit state".

The terminal insertion direction front end face of the housing main-body 32 faces the end face from which the circuit-side terminal 14A (14B) of the electronic circuit main body 10a protrudes in the fit state. Specifically, the terminal insertion direction front end face of the first wire-side terminal 20A of the housing main-body 32 of the first connector housing 30A faces the first end face. The terminal insertion direction front end face of the second wire-side terminal 20B of the housing main-body 32 of the second connector housing 30B faces the second end face.

Figure 12:
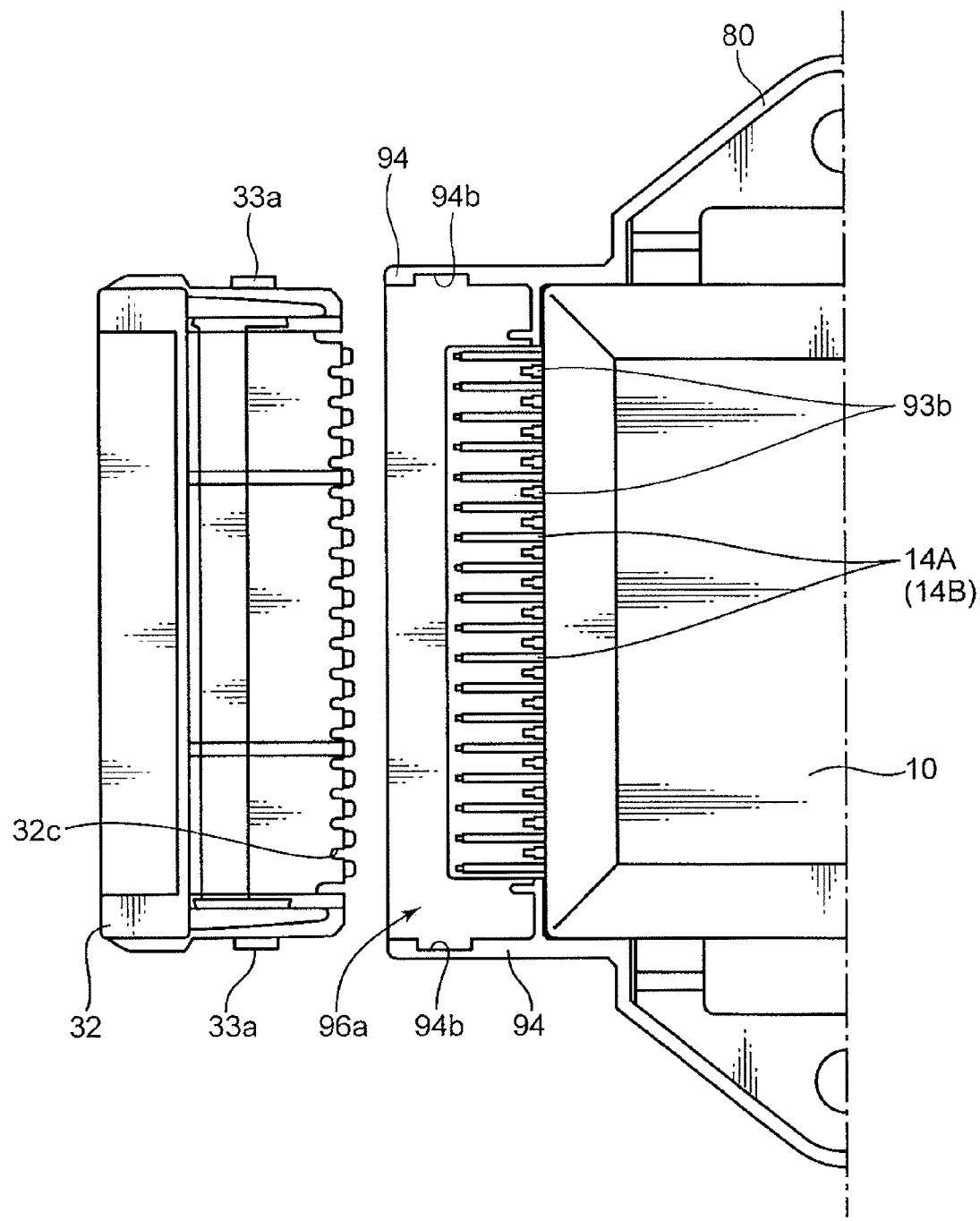
FIG. 12 is a schematic side view of FIG. 11.
Figure 13:
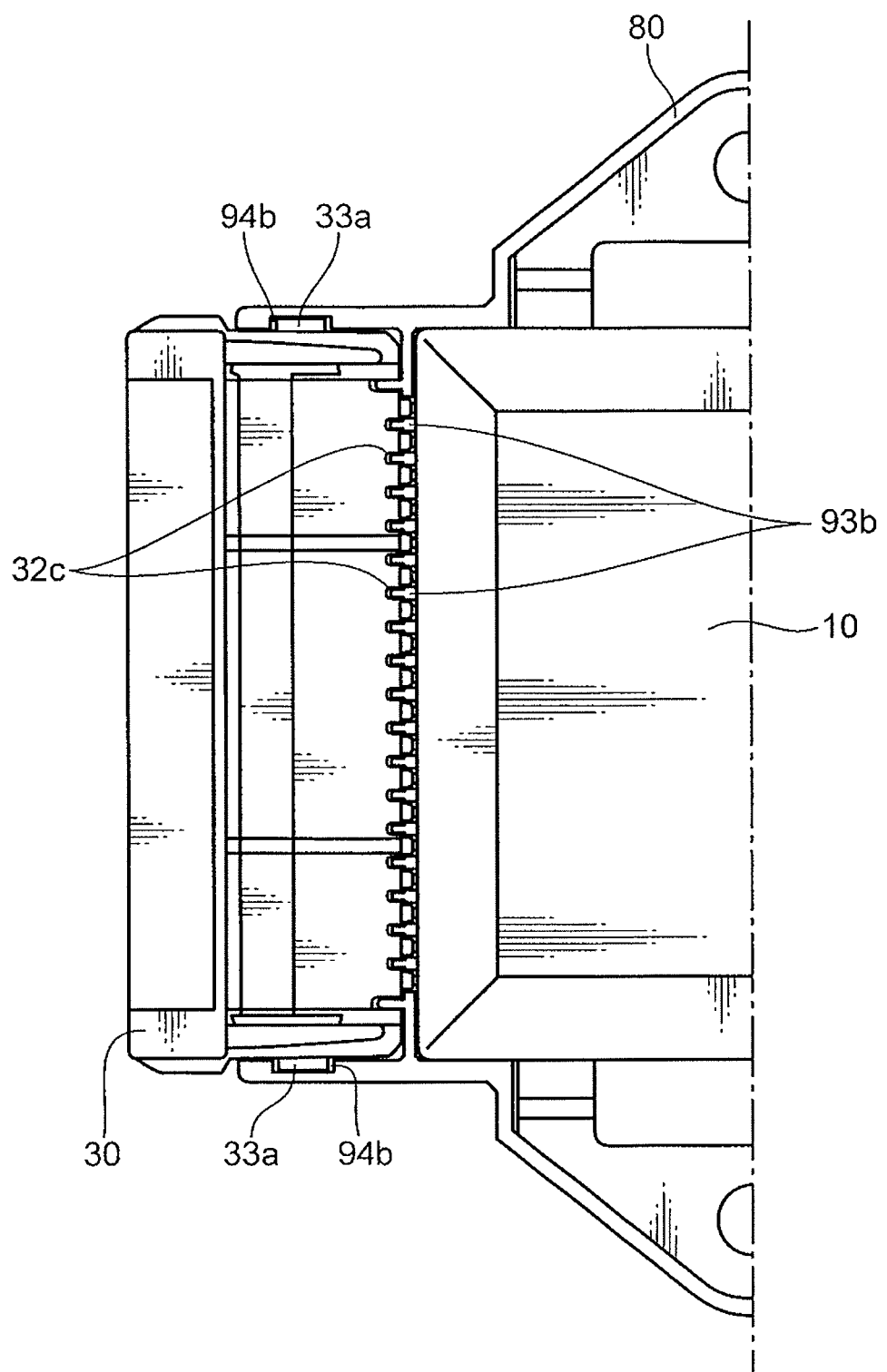
FIG. 13 is a cross-sectional view corresponding to FIG. 11 in a state where the circuit-side terminals fit with the wire-side terminals.

Of the terminal insertion direction front end face of the housing main-body 32, the portion between the respective terminal housing chamber 32a and by extension the portion (opposing face) 32c between the wire-side terminals 20A (20B) housed in the terminal housing chamber 32a are concaved toward the rearward terminal insertion direction, and configure a groove (refer to FIG. 12 and FIG. 13). In the first embodiment, of the terminal insertion direction front end face of the housing main-body 32, all portions 32c between the respective terminal housing chambers 32a are grooves. In the ensuing explanation, this groove portion is referred to as a "detachment groove 32c".

The housing main-body 32 includes a flange 33c. The flange 33c raises upward from an upper side wall of the housing main-body 32 and extends horizontally. The flange 33c is provided in a terminal insertion direction that is more rearward (more on the wire 40 side) than the portion of the housing main-body 32 housing the electrical contacted part 24.

The portion of the housing main-body 32 in a terminal insertion direction that is more forward than the flange 33c configures a housing main-body covering part 35. The housing main-body covering part 35 is covered, in the assembled state described later, by the fitting-portion covering part 90A (90B) described later of the cover 80 from a side opposing to the placing face 52. An assembled state is a state (first assembled state, second assembled state) where the cover 80 and the electronic circuit body 10 are placed on the placing face 52, the connector CA (CB) and the electronic circuit body 10 are connected, and the circuit-side terminal 14A (14B) fit with the electrical contacted part 24 of the wire-side terminal 20A (20B).

Moreover, the portion in a termination insertion direction that is more rearward than the housing main-body covering part 35 of the left and right walls of the housing main-body 32 protrudes more on the outer left and right sides than the portion in a terminal insertion direction that is more forward than the housing main-body covering part 35 of the left and right walls of the housing main-body 32.

The housing main-body covering part 35 includes connector locked protrusions (locked protrusions) 33a. The connector locked protrusions (locked protrusions) 33a respectively protrude to the outer left and right sides from the left and right walls 35a of the housing main-body covering part 35. Each of the connector locked protrusions 33a engages with the connector locking hole (locking hole, connector holder) 94b described later of the cover 80. Each of the connector locked protrusions 33a flexurally deforms from a state of protruding to the outer left and right sides to a direction opposing to the protruding direction; that is, a direction that approaches the left and right walls 35a of the housing main-body covering part 35.

A plurality of slide parts 33b are provided to the upper side wall of the housing main-body covering part 35. Each of the slide parts 33b protrudes upward from the upper side wall of the housing main-body covering part 35 and extends along the fitting direction (front-back direction). In the first embodiment, four slide parts 33b are provided, horizontally, at mutually separated positions on the upper side walls of each of the housing main-body covering parts 35.

The retainer 34 retains the wire-side terminal 20A (20B) within the terminal housing chamber 32a. The retainer 34 comes into contact with the terminal insertion direction rear end of the electrical contacted part 24 toward the forward terminal insertion direction. An opening in communication with the inside of each of the terminal housing chambers 32a is formed on the upper side wall of the housing main-body 32. The retainer 34 is inserted into this opening, and consequently comes into contact with the electrical contacted part 24 of the wire-side terminal 20A (20B) in each of the terminal housing chambers 32a. Based on this contact, the retainer 34 restricts the wire-side terminal 20A (20B) from coming off of the terminal housing chamber 32a.

The cover 80 coordinates with the placing face 52 of the base member 50 and obviates foreign material and the like from infiltrating the fitting-portion of the first circuit-side terminal 14A and the first wire-side terminal 20A and the fitting-portion of the second circuit-side terminal 14B and the second wire-side terminal 20B. In the assembled state, the cover 80 covers the electronic circuit main body 10a and the fitting-portion from a side opposing to the placing face 52. The cover 80 includes a main-body covering part 81 and a first fitting-portion covering part 90A and a second fitting-portion covering part 90B, which are mutually and integrally formed. The cover 80 is formed, for example, from synthetic resin such as PPS, PA66.

Figure 6:
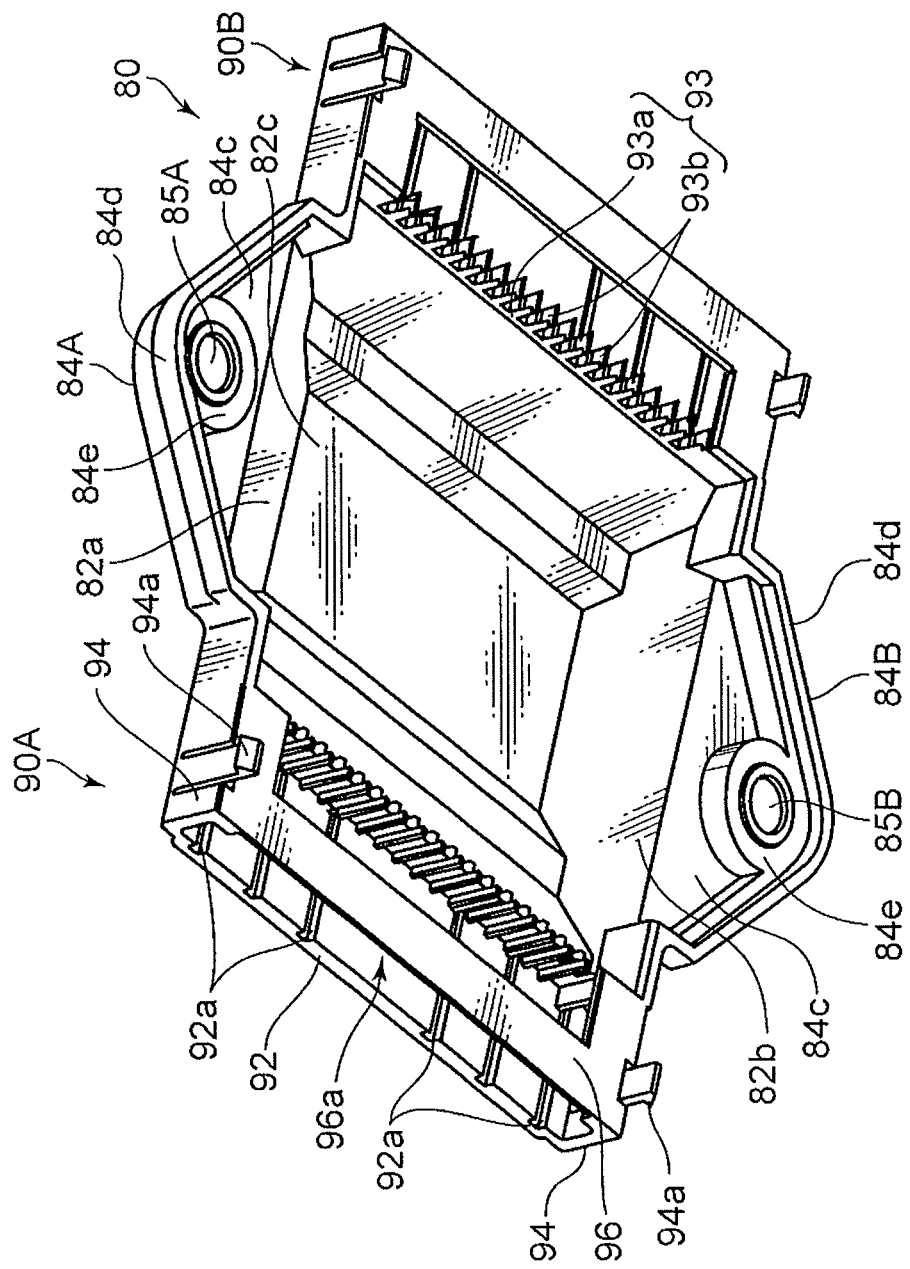
FIG. 6 is a schematic perspective view in which the cover of the electronic circuit unit shown in FIG. 1 is viewed from the lower side.

The specific structure of the main-body covering part 81 of the cover 80 is now explained with reference to FIG. 4, FIG. 6, and so on.

The main-body covering part 81 covers the electronic circuit main body 10a from a side opposing to the placing face 52. In the first embodiment, the main-body covering part 81 of the cover 80 includes a main-body part 82 and a pair of placing parts 84A, 84B. The main-body part 82 of the main-body covering part 81 covers the electronic circuit main body 10a, and the coupling part 19c of the placing member 19 disposed on the electronic circuit main body 10a. The placing parts 84A, 84B of the main-body covering part 81 respectively cover the placing parts 19A, 19B of the placing member 19 from a side opposing to the placing face 52. The main-body covering part 81 covers the placing parts 19A, 19B of the placing member 19 in addition to the electronic circuit main body 10a.

The main-body part 82 of the main-body covering part 81 includes an upper wall 82c and side walls 82a, 82b. The upper wall 82c extends along the top face of the electronic circuit main body 10a, and the top face of the coupling part 19c of the placing member 19 disposed on the electronic circuit main body 10a. The side walls 82a, 82b respectively extend downward from the left and right edges of the upper wall 82c of the main-body covering part 81. The coupling part 19c of the electronic circuit main body 10a and the placing member 19 is housed in a region that is encompassed by the upper wall 82c and the side walls 82a, 82b.

The placing parts 84A, 84B of the main-body covering part 81 respectively include upper walls 84c and side walls 84d. Each of the upper wall 84c protrudes outward in a horizontal direction from the side walls 82a, 82b of the main-body part 82 of the main-body covering part 81. Each of the upper walls 84c extends along the top face of the placing parts 19A, 19B of the placing member 19. Each of the side walls 84d extends downward from the left and right edges of each of the upper walls 84c. The placing parts 19A, 19B of the placing member 19 are housed in a region that is encompassed by the upper wall 84c and the side wall 84d.

The region encompassed by the respective walls 82a, 82b, 82c of the main-body part 82 of the main-body covering part 81 and the region encompassed by the respective wall 84c, 84d of the placing parts 84A, 84B of the main-body covering part 81 are in communication. The electronic circuit main body 10a and the placing member 19 are housed in a region that is encompassed by these walls 82c, 82a, 82b, 84c, 84d.

Bolt through-hole (fastening member through-holes, through-holes) 85A, 85B penetrating vertically are respectively formed on each of the upper walls 84c of the placing parts 84A, 84B of the main-body covering part 81. The position of these bolt through-holes 85A, 85B corresponds to the position of the bolt through-holes 17A, 17B of the electronic circuit body 10 in the assembled state. The bolt 60 is inserted through the bolt through-holes 85A, 85B. In the first embodiment, cylindrical parts 84e are respectively formed on the inner side of the placing parts 84A, 84B of the main-body covering part 81. In the assembled state, each of the cylindrical parts 84e extends from each of the upper walls 84c of the placing parts 84A, 84B of the main-body covering part 81 to the top face of the placing parts 19A, 19B of the placing member 19, and encompass the bolt 60 that was inserted through the bolt through-holes 85A, 85B.

The specific configuration of the fitting-portion covering parts 90A, 90B of the cover 80 is now explained.

The first fitting-portion covering part 90A covers the fitting-portion of the first circuit-side terminal 14A and the first wire-side terminal 20A from a side opposing to the placing face 52. The first fitting-portion covering part 90A extends rearward (first protruding direction) from the rear end of the main-body covering part 81; that is, the end on the first circuit-side terminal 14A side. The second fitting-portion covering part 90B covers the fitting-portion of the second circuit-side terminal 14B and the second wire-side terminal 20B from a side opposing to the placing face 52. The second fitting-portion covering part 90B extends forward (second protruding direction) from the front end of the main-body covering part 81; that is, the end on the second circuit-side terminal 14B side.

The first fitting-portion covering part 90A and the second fitting-portion covering part 90B have a symmetrical shape and structure in the front-back direction. The first fitting-portion covering part 90A includes an upper wall 92, side walls 94, a guiding plate (guiding part) 96, and a terminal isolating part 93. The upper wall 92 of the first fitting-portion covering part 90A extends rearward (first protruding direction) from the upper wall 82c of the main-body part 82 of the main-body covering part 81. The side walls 94 of the first fitting-portion covering part 90A respectively extend downward from the left and right edges of the upper wall 92 and rearward from the side walls 82a, 82b of the main-body part 82 of the main-body covering part 81. The guiding plate 96 extends toward the left and right center from the lower end of the side walls 94. The terminal isolating part 93 protrudes downward from the upper wall 92. A part of the guiding plate 96 connects the rear ends of the side walls 94.

As with the first fitting-portion covering part 90A, the second fitting-portion covering part 90B includes an upper wall 92, side walls 94, a guiding plate (guiding part) 96, and a terminal isolating part 93. Note that the upper wall 92 of the second fitting-portion covering part 90B extends forward (second protruding direction) from the upper wall 82c of the main-body part 82 of the main-body covering part 81.

Each of the walls 92, 94, 96 of the fitting-portion covering part 90A (90B) covers the circuit-side terminal 14A (14B) in a state where the electronic circuit main body 10a is housed in the main-body covering part 81 of the cover 80. Specifically, in a housed state where the electronic circuit main body 10a is housed in the main-body covering part 81 of the cover 80, the upper wall 92 of the fitting-portion covering part 90A (90B) is positioned above the circuit-side terminal 14A (14B). In the housed state, the side walls 94 of the fitting-portion covering part 90A (90B) are positioned at the outer left and right sides of the circuit-side terminal 14A (14B). In the housed state, the guiding plate 96 of the fitting-portion covering part 90A (90B) is positioned below the circuit-side terminal 14A (14B). The length of the upper wall 92 and the side walls 94 of the fitting-portion covering part 90A (90B) in the front-back direction is longer than the protruding dimension of the circuit-side terminal 14A (14B) from the electronic circuit main body 10a.

The housing main-body covering part 35 of the connector housing 30A (30B) is inserted into a region that is encompassed by each of the walls 92, 94, 96 of the fitting-portion covering part 90A (90B). The housing main-body covering part 35 of the connector housing 30A (30B) is inserted up to the fitting position (first fitting position, second fitting position) where the circuit-side terminal 14A (14B) fit with the electrical contacted part 24.

The distance between the bottom face of the upper wall 92 of the fitting-portion covering part 90A (90B) and the top face of the guiding plate 96 is not less than the height dimension of the housing main-body covering part 35. The distance of the horizontally opposing faces of the side walls 94 of the fitting-portion covering part 90A (90B) is not less than the length dimension between the left and right walls 35a of the housing main-body covering part 35. The length dimension of the upper wall 92 and the side walls 94 of the fitting-portion covering part 90A (90B) in the front-back direction is a length that is substantially equal to the length of the housing main-body covering part 35 in the front-back direction. Thus, in the region encompassed by the respective walls 92, 94, 96 of the fitting-portion covering part 90A (90B) and the region encompassed by the placing face 52 in a state where the cover 80 is placed on the placing face 52 and the upper wall 92 and the side walls 94 of the fitting-portion covering part 90A (90B), formed is an insertion space into which the housing main-body covering part 35 is inserted up to the fitting position from the insertion opening 96a encompassed by the rear end (front end) of each of the walls 92, 94, 96 of the fitting-portion covering part 90A (90B) along the front-back direction; that is, along the fitting direction.

Here, the distance between the bottom face of the upper wall 92 of the fitting-portion covering part 90A (90B) and the top face of the guiding plate 96 is substantially the same as the height dimension of the housing main-body covering part 35. The distance of the horizontally opposing faces of the side walls 94 of the fitting-portion covering part 90A (90B) is substantially the same as the length dimension between the left and right walls 35a of the housing main-body covering part 35. The height dimension of the portion of the housing main-body 32 to which the flange 33c is provided is greater than the distance between the bottom face of the upper wall 92 of the fitting-portion covering part 90A (90B) and the top face of the guiding plate 96.

Connector locking holes 94b are respectively formed on the left and right walls 94 of the fitting-portion covering part 90A (90B) (refer to FIG. 12 and FIG. 13). Specifically, each of the connector locking holes 94b is formed on the inner side face of the fitting-portion covering part 90A (90B); that is, on the left side face of the right side wall and on the right side face of the left side wall. Each of the connector locking holes 94b engages with the connector locked protrusion 33a in a state where the housing main-body covering part 35 is in the fitting position.

The protruding dimension of the connector locked protrusion 33a is set to a dimension where, upon the housing main-body covering part 35 being inserted into the fitting-portion covering part 90A (90B), the connector locked protrusion 33a flexurally deforms by being pressed by the side wall 94 of the fitting-portion covering part 90A (90B) until the connector locked protrusion 33a reaches the position (fitting position) of the connector locking hole 94b, and the connector locked protrusion 33a elastically returns and engages with the connector locking hole 94b when the connector locked protrusion 33a reaches the position of the connector locking hole 94b.

Cover locked protrusions 94a protruding downward are respectively provided to the left and right walls 94 of the fitting-portion covering part 90A (90B). The cover locked protrusion 94a engages with the cover locking hole 54a of the base member 50. The cover locked protrusion 94a comes into contact with the bottom face of the base member 50, from below, in a state of being inserted through the cover locking hole 54a.

The terminal isolating part 93 includes a coupling part 93a, and a plurality of detachment protrusions 93b arranged horizontally. The coupling part 93a is of a plate shape extending with respect to left and right direction. Each of the detachment protrusions 93b protrudes downward from the coupling part 93a. The distance between the detachment protrusions 93b with respect to left and right direction is the same as the distance between the circuit-side terminals 14A (14B) with respect to left and right direction. As shown in FIG. 12, each of the detachment protrusions 93b is interposed between the circuit-side terminals 14A (14B) in a state where the electronic circuit body 10 is housed in the cover 80. In a state of being interposed between the circuit-side terminals 14A (14B), each of the detachment protrusions 93b extends from a position above the circuit-side terminal 14A (14B) to a position below the circuit-side terminal 14A (14B).

In the first embodiment, in a state where the electronic circuit body 10 is housed in the cover 80, each of the detachment protrusions 93b extends in the protruding direction (first protruding direction, second protruding direction) of the circuit-side terminal 14A (14B) from a position of coming into contact with the end face, from which the circuit-side terminal 14A (14B) is protruding, of the electronic circuit main body 10a.

The tip portion of each of the detachment protrusions 93b is disposed in each of the detachment grooves 32c in the assembled state. Specifically, the dimension of the housing main-body 32 in the front-back direction is set to a value where, in the assembled state, the terminal insertion direction front end face thereof will become slightly separated from the electronic circuit main body 10a in the terminal protruding direction. The dimension of each of the detachment protrusions 93b in the front-back direction is set to substantially the same dimension as the detachment groove 32c in the front-back direction. Thus, in the assembled state, each of the detachment protrusions 93b extends from the main-body 10a of the electronic circuit body 10 up to the inner side of each of the detachment grooves 32c. The outer side face of each of the detachment protrusions 93b extends along the inner side face of each of the detachment grooves 32c in a state of being disposed in each of the detachment grooves 32c.

A plurality of guiding grooves (guiding parts) 92a extending in the front-back direction (fitting direction) are formed on the bottom face of the upper wall 92 of the fitting-portion covering part 90A (90B). Each of the slide parts 33b slides within each of the guiding grooves 92a in the front-back direction. Based on this sliding, the slide part 33b and, by extension, the connector CA (CB) are guided in the fitting direction. In the first embodiment, four guiding grooves 92a are provided at horizontally separated positions corresponding to the slide parts 33b.

The manufacturing method (assembly method) of the electronic circuit unit 1 is now explained. In the first embodiment, an assembly jig 100 is used.

Figure 7:
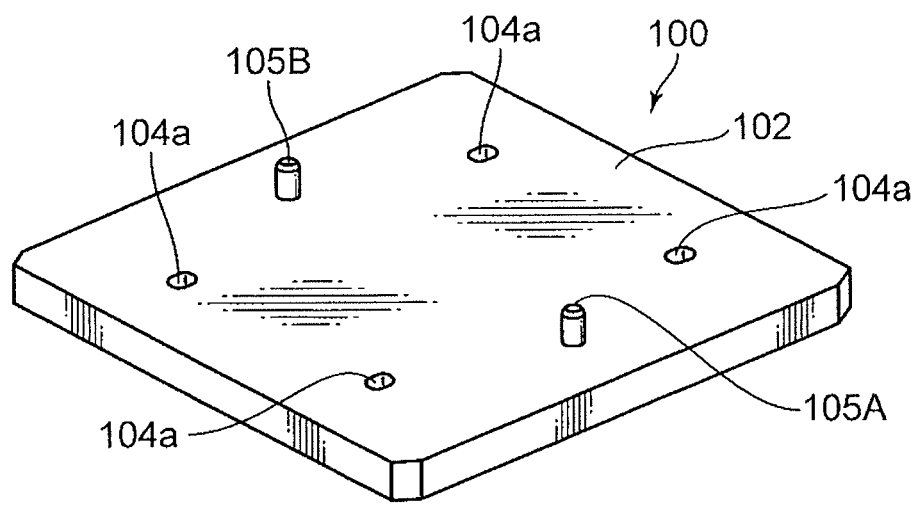
FIG. 7 is a schematic perspective view of the assembly jig.

FIG. 7 is a schematic perspective view of the assembly jig 100. The base member 50 is placed on the top face 102 of the assembly jig 100.

The assembly jig 100 includes a pair of temporary locking protrusions 105A, 105B. The position of the temporary locking protrusions 105A, 105B corresponds with the position of the bolt through-holes 55A, 55B of the base member 50 in a state where the base member 50 is placed on the top face 102 of the assembly jig 100. The outer diameter of the temporary locking protrusions 105A, 105B is smaller than the outer diameter of the bolt 60.

The assembly jig 100 includes a plurality of locking protrusion insertion holes 104a. The position of each of the locking protrusion insertion holes 104a corresponds to the position of each of the cover locking holes 54a of the base member 50 in a state where the base member 50 is placed on the top face 102 of the assembly jig 100. The hole system of the locking protrusion insertion hole 104a includes a locking protrusion insertion hole 104a having a hole diameter that is greater than the cover locking hole 54a.

The assembly method of the electronic circuit unit 1 using the assembly jig 100 includes the following steps.

1) Connecting Step of Connecting the Wire 40 to the Respective Connectors CA, CB In this step, the wires 40 are respectively connected to the first connector CA and the second connector CB. Specifically, the wire-side terminals 20A, 20B are pressure-bonded in advance to the terminal of the respective wires 40. The wire-side terminals 20A, 20B are respectively inserted into the terminal housing chamber 32a. The wire-side terminals 20A, 20B are locked within the terminal housing chamber 32a by using the lance 32b. The retainer 34 is affixed to the housing main-body 32. The retainers 34 retain the wire-side terminals 20A, 20B within the terminal housing chamber 32a.

2) Fastening Step

Figure 8:
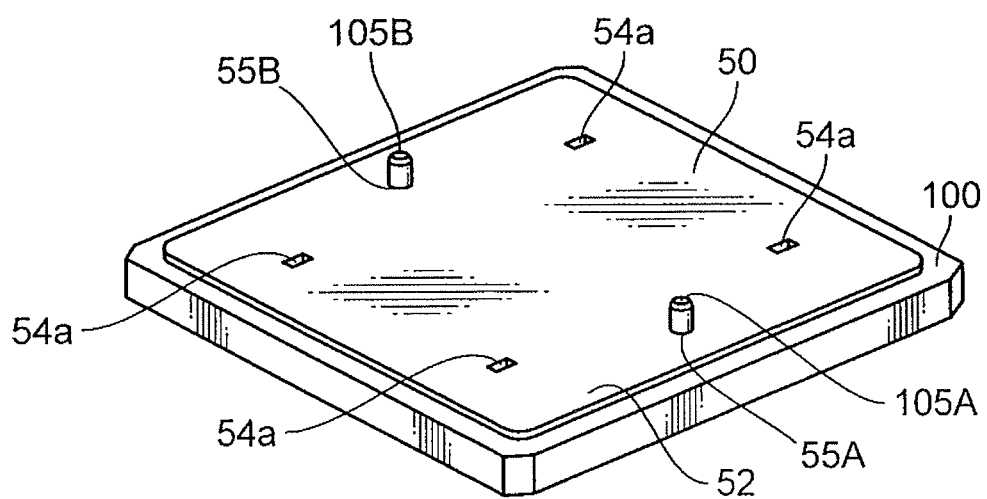
FIG. 8 is a schematic perspective view showing a state where the assembly jig shown in FIG. 7 is temporarily locked with the base member.

In this step, as shown in FIG. 8, the base member 50 is placed on the top face 102 of the assembly jig 100 in a posture where the placing face 52 faces upward. Here, the temporary locking protrusions 105A, 105B are respectively inserted into the bolt through-holes 55A, 55B of the base member 50. Based on the foregoing insertion, the base member 50 is temporarily locked to the assembly jig 100. In the foregoing state, each of the locking protrusion insertion holes 104a coincides with each of the coyer locking holes 54a.

Figure 9:
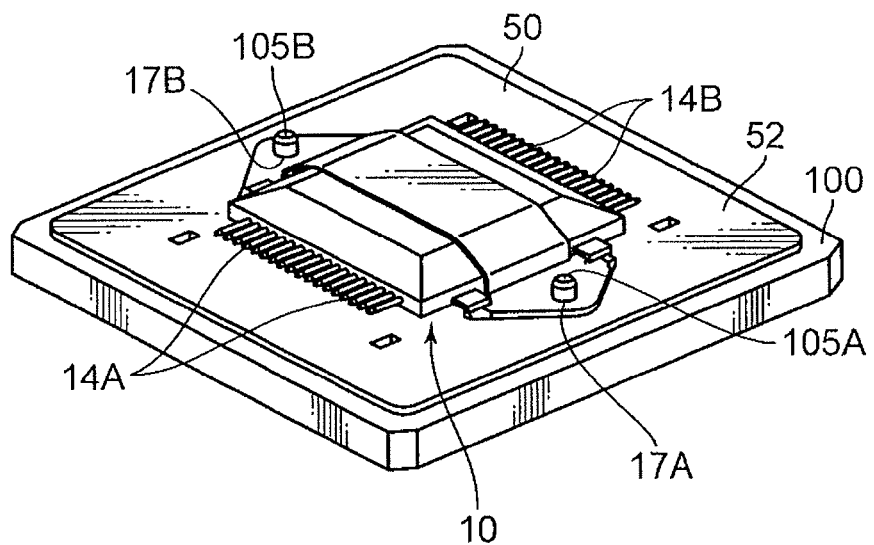
FIG. 9 is a schematic perspective view showing a state where the electronic circuit body is placed on the placing face of the base member in the state shown in FIG. 8.

Next, as shown in FIG. 9, the electronic circuit body 10 is placed on the placing face 52 in a posture where the array direction of the first circuit-side terminal 14A and the array direction of the second circuit-side terminal 14B become parallel with the placing face 52. Here, the temporary locking protrusions 105A, 105B are respectively inserted into the bolt through-holes 17A, 17B of the electronic circuit body 10. Based on the foregoing insertion, the electronic circuit body 10 is temporarily locked to the assembly jig 100.

Figure 10:
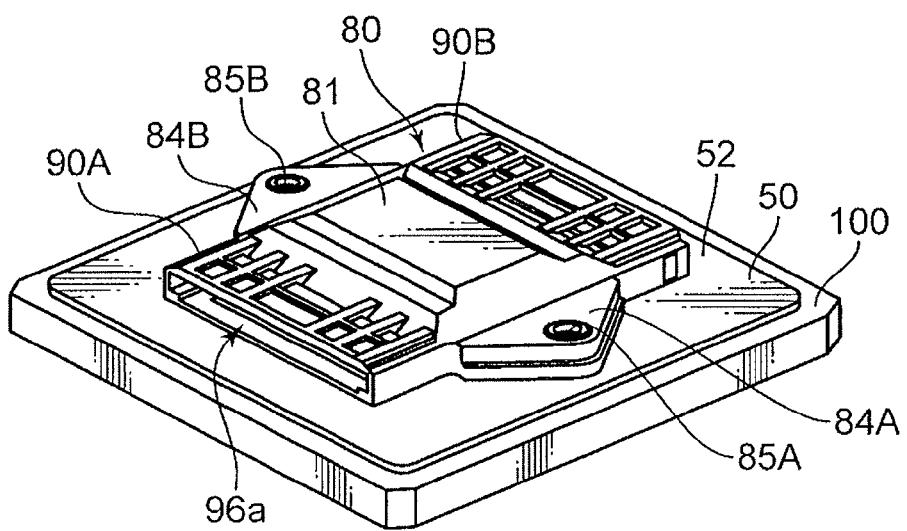
FIG. 10 is a schematic perspective view showing a state where the cover is mounted on the base member in the state shown in FIG. 9.

Next, as shown in FIG. 10, the cover 80 is placed on the placing face 52. Here, the temporary locking protrusions 105A, 105B are respectively inserted into the bolt through-holes 85A, 85B of the cover 80. Moreover, each of the cover locked protrusion 94a is inserted into each of the cover locking holes 54a and each of the locking protrusion insertion holes 104a.

As described above, the hole diameter of the locking protrusion insertion hole 104a is greater than the hole diameter of the cover locking hole 54a. Thus, the cover locked protrusion 94a comes into contact with the bottom face of the base member 50, from below, in the cover locking hole 54a. Based on the foregoing contact, the cover 80 is fixed to the base member 50.

In the first embodiment, in a state where the cover 80 is placed on the placing face 52, the lower end of each of the side walls 82a, 82b, 84d of the main-body covering part 81, the lower end of each of the side walls 94 of the fitting-portion covering part 90A (90B), and the entire lower end of the guiding plate 96 come into contact with the placing face 52.

In a state where the cover 80 is placed on the placing face 52, the placing member 19 of the electronic circuit main body 10a and the electronic circuit body 10 is covered by the main-body covering part 81 of the cover 80 from a side (upper side) opposing to the placing face 52. The first circuit-side terminal 14A is covered with the first fitting-portion covering part 90A of the cover 80 from a side opposing to the placing face 52. The second circuit-side terminal 14B is covered with the second fitting-portion covering part 90B of the cover 80 from a side opposing to the placing face 52. As shown in FIG. 12, the respective detachment protrusions 93b are disposed between the first circuit-side terminals 14A and between the second circuit-side terminals 14B.

Subsequently, the temporary locking protrusions 105A, 105B are removed from each of the bolt through-holes 85A, 85B, 17A, 17B, 55A, 55B of the cover 80, the electronic circuit body 10 and the base member 50, and the base member 50 on which the electronic circuit body 10 and the cover 80 are placed is thereby removed from the assembly jig 100.

Figure 11:
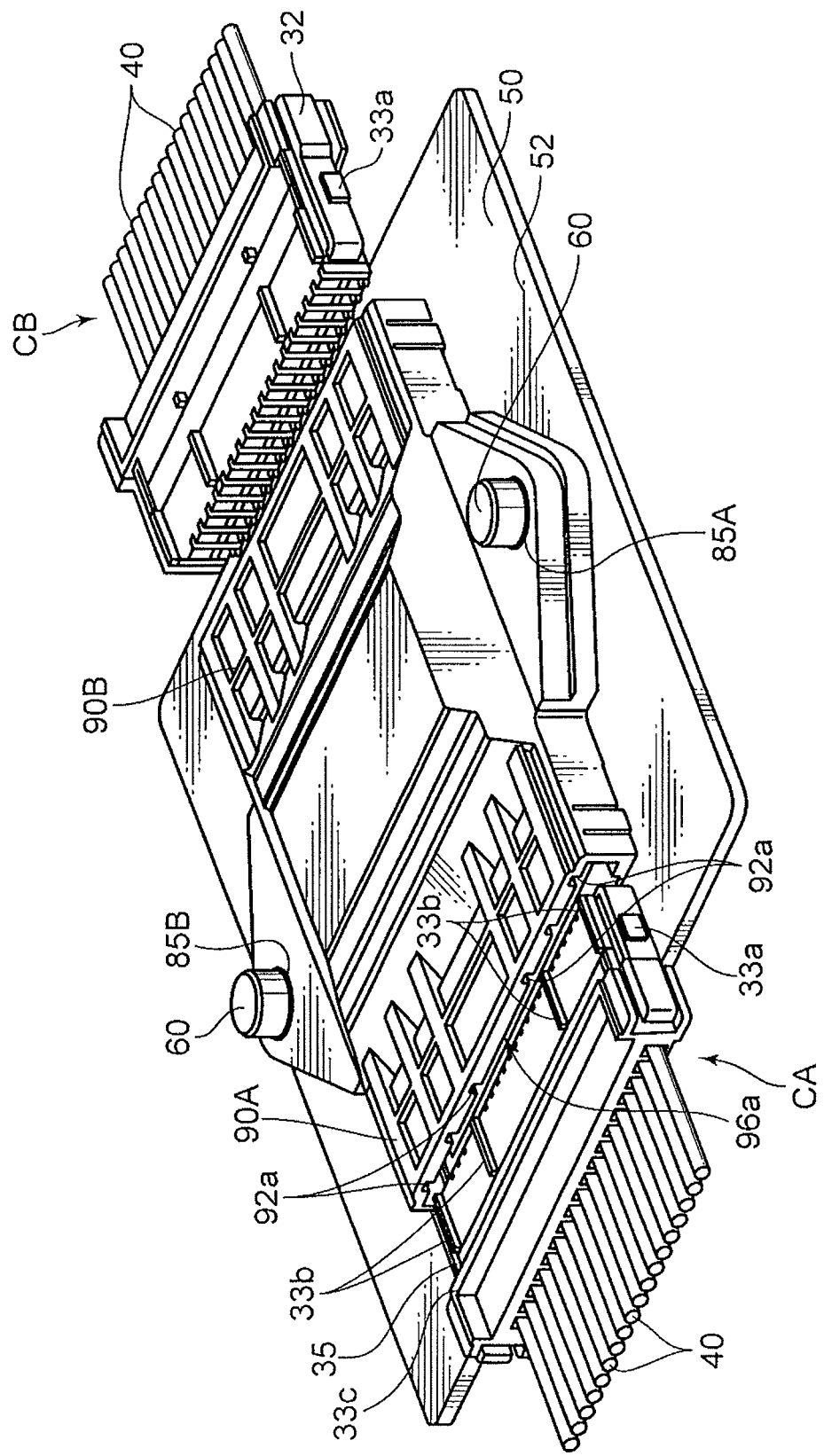
FIG. 11 is a schematic perspective view showing a state before the cover is inserted between the base member and the placing face in the state shown in FIG. 10.

Next, as shown in FIG. 11, the electronic circuit body 10 and the cover 80 are fixed to the base member 50 in a mutually connected state. Specifically, the bolt 60 is inserted through each of the bolt through-holes 85A, 85B, 17A, 17B, 55A, 55B of the cover 80, the electronic circuit body 10 and the base member 50, and a nut is fastened to the end of the bolt 60.

3) Fitting Holding Step

In this step, as shown in FIG. 11 and FIG. 12, the first connector CA in a detached position (first detached position) where the first wire-side terminal 20A and the first circuit-side terminal 14A are detached is disposed at the first fitting position as shown in FIG. 13 so as to fit the first wire-side terminal 20A and the first circuit-side terminal 14A. Moreover, the first connector CA is retained by the cover 80. Similarly, the second connector CA in a detached position (second detached position) where the second wire-side terminal 20B and the second circuit-side terminal 14B are detached is disposed at the second fitting position so as to fit the second wire-side terminal 20B and the second circuit-side terminal 14B. Moreover, the second connector CB is retained by the cover 80.

Specifically, the housing main-body covering part 35 of the first connector CA is disposed within the insertion opening 96a of the first fitting-portion covering part 90A. Thereafter, each of the slide parts 33b is caused to slide along each of the guiding grooves 92a, and the first connector CA is pressed forward (toward the electronic circuit body 10 side), and the housing main-body covering part 35 is thereby inserted between the first fitting-portion covering part 90A and the placing face 52. Consequently, the first circuit-side terminal 14A is inserted into the terminal housing chamber 32a of the first connector CA. When the first connector CA is pressed until reaching the first fitting position, the first circuit-side terminal 14A comes to fit with the electrical contacted part 24 of the first wire-side terminal 20A. Here, in a state where the outer side face of each of the detachment protrusions 93*b* is positioned along the inner side face of each of the detachment grooves 32*c*, each of the detachment protrusions 93*b* is disposed within each of the detachment groove 32*c* of the first connector CA.

Up to the time that the first connector CA reaches the first fitting position, each of the connector locked protrusions 33*a* flexurally deforms to the housing main-body covering part 35 side by being pressed by the side walls 94 of the first fitting-portion covering part 90A. When the housing main-body covering part 35 reaches the first fitting position, each of the connector locked protrusions 33*a* reaches the position of each of the connector locking holes 94*b*. Upon reaching this position, each of the connector locked protrusions 33*a* elastically returns and engages with each of the connector locking holes 94*b*. Based on the foregoing engagement, the first connector CA is retained by the cover 80.

Moreover, the housing main-body covering part 35 of the second connector CB is disposed within the insertion opening 96*a* of the second fitting-portion covering part 90B. Thereafter, each of the slide parts 33*b* is caused to slide along each of the guiding grooves 92*a*, and the second connector CB is pressed rearward (toward the electronic circuit body 10 side), and the housing main-body covering part 35 is thereby inserted between the second fitting-portion covering part 90B and the placing face 52. Consequently, the second circuit-side terminal 14B is inserted into the terminal housing chamber 32*a* of the second connector CB. When the second connector CB is pressed until reaching the second fitting position, the second circuit-side terminal 14B comes to fit with the electrical contacted part 24 of the second wire-side terminal 20B. Here, in a state where the outer side face of each of the detachment protrusions 93*b* is positioned along the inner side face of each of the detachment grooves 32*c*, each of the detachment protrusions 93*b* is disposed within each of the detachment groove 32*c* of the second connector CB.

Up to the time that the second connector CB reaches the second fitting position, each of the connector locked protrusions 33*a* flexurally deforms to the housing main-body covering part 35 side by being pressed by the side walls 94 of the second fitting-portion covering part 90B. When the housing main-body covering part 35 reaches the second fitting position, each of the connector locked protrusions 33*a* reaches the position of each of the connector locking holes 94*b*. Upon reaching this position, each of the connector locked protrusions 33*a* elastically returns and engages with each of the connector locking holes 94*b*. Based on the foregoing engagement, the second connector CB is retained by the cover 80.

Here, in the first embodiment, as described above, the distance between the bottom face of the upper wall 92 of the fitting-portion covering part 90A (90B) and the top face of the guiding plate 96 is set to be substantially the same as the height dimension of the housing main-body covering part 35. Accordingly, while the connector CA (CB) is moving, each of the slide parts 33 slides along each of the guiding grooves 92*a* as described above, and the bottom face of the connector CA (CB) slides along the guiding plate 96. Thus, the second wire-side terminal 20B retained by the connector CA (CB) is accurately guided to the corresponding circuit-side terminal 14A (14B).

Moreover, in the first embodiment, each of the detachment protrusions 93*b* is disposed beach the respective circuit-side terminals 14A (14B). Thus, each of the detachment protrusions 93*b* obviates the deformation of the circuit-side terminal 14A (14B). Accordingly, the circuit-side terminal 14A (14B) and the wire-side terminal 20A (20B) can fit more reliably.

The assembly of the electronic circuit unit 1 is thereby complete.

In a state where the assembly is complete, the housing main-body covering part 35 of the first connector CA and by extension the fitting-portion of the electrical contacted part 24 of the first wire-side terminal 20A and the first circuit-side terminal 14A are covered by the first fitting-portion covering part 90A from a side opposing to the placing face 52. Moreover, the housing main-body covering part 35 of the second connector CB and by extension the fitting-portion of the electrical contacted part 24 of the second wire-side terminal 20B and the second circuit-side terminal 14B are covered by the second fitting-portion covering part 90B from a side opposing to the placing face 52. Moreover, the end face of the first fitting-portion covering part 90A in which the insertion opening 96*a* is opened is covered from the rear side by the front end face (including the front end face of the flange 33*c*) of the first connector CA of the portion that is more on the rear side than the housing main-body covering part 35. Moreover, the end face of the second fitting-portion covering part 90B in which the insertion opening 96*a* is opened is covered from the front side by the rear end face (including the rear end face of the flange 33*c*) of the second connector CB of the portion that is more on the front side than the housing main-body covering part 35.

As described above, with the electronic circuit unit 1 according to the first embodiment, the fitting-portion of the wire-side terminals 20A, 20B and the circuit-side terminals 14A, 14B is covered from either side by the placing face 52 of the base member 50 and the fitting-portion covering parts 90A, 90B of the cover 80. Thus, with a simple configuration of providing the cover 80 including the fitting-portion covering parts 90A, 90B, it is possible to effectively obviate the foreign material contained in the oil flowing within the casing from infiltrating the fitting-portion and by extension between the respective terminals in a usage state where the electronic circuit unit 1 is housed within the casing of the automatic transmission. It is thereby possible to prevent troubles such as the short-circuit between circuits with the foreign material acting as the medium. To put it differently, with the electronic circuit unit 1, the electronic circuit unit 1 and the wire (for instance, heat-resistant wire) 40 can be connected while obviating, based on a simple structure, troubles caused by the foreign material existing within the casing of the automatic transmission (specifically, preventing the infiltration of foreign material with an inexpensive structure).

In particular, the cover 80 includes a main-body covering part 81 for covering the electronic circuit main body 10*a*, and the fitting-portion covering parts 90A, 90B have a shape of extending from the main-body covering part 81 to the protruding direction of the circuit-side terminals 14A, 14B. Thus, the infiltration of foreign material from the electronic circuit main body 10*a* side to the fitting-portion side can be effectively obviated.

In addition, the cover 80 is provided with connector locking holes 94*b* for locking the connector locked protrusion 33*a* of the connectors CA, CB. Thus, the connectors CA, CB can be retained in the fitting position by using the cover 80.

Moreover, with the electronic circuit unit 1 according to the first embodiment, an insertion space is formed between the fitting-portion covering parts 90A, 90B and the placing face 52 which enables the insertion of the connectors CA, CB. Thus, with a simple procedure of inserting the connectors CA, CB between the fitting-portion covering parts 90A, 90B and the placing face 52 after the electronic circuit body 10 and the cover 80 are fixed to the base member 50, the connectors CA, CB can be disposed at the fitting position. In other words, the terminals can be easily and reliably fit. Moreover, the fitting-portion can be reliably covered with the fitting-portion covering parts 90A, 90B.

Here, the guiding plate 96 may be omitted. However, if the guiding plate 96 is provided and the connectors CA, CB are moved along the top face of the guiding plate 96, the connectors CA, CB can be more easily and reliably disposed at the fitting position. Similarly, the guiding groove 92a and the slide part 33b may also be omitted. However, if the connectors CA, CB are guided to the fitting position by the guiding groove 92a, the connectors CA, CB can be more easily and reliably disposed at the fitting position.

Moreover, the terminal isolating part 93 and the detachment protrusion 93b may be omitted. However, if the detachment protrusion 93b is interposed between the circuit-side terminals 14A, 14B, the detachment protrusion 93b can more reliably obviate the short-circuit of the circuit-side terminals 14A, 14B. Moreover, the terminal isolating part 93 obviates the deformation of the circuit-side terminals 14A, 14B. Thus, the circuit-side terminals 14A, 14B and the wire-side terminals 20A, 20B can fit more reliably. In particular, if the terminal isolating part 93 comes into contact with the end face of the electronic circuit main body 10a and extends from that end face in the terminal protruding direction as with the first embodiment, it is possible to obviate the foreign material or the like from becoming interposed between the terminals along the foregoing end face.

Moreover, the detachment groove 32c may be omitted. However, if the detachment groove 32c is provided and the detachment protrusion 93b is disposed within the detachment groove 32c in a state where the outer side face thereof is positioned along the inner side face of the detachment groove 32c, the distance between the adjacent terminals in a direction along the end face 32c of the housing main-body 32 will increase. Thus, it is possible to more reliably obviate the short-circuit of the terminals. In other words, a so-called labyrinth structure is formed between the respective terminals by the detachment groove 32c and the detachment protrusion 93b, and the foreign material and the like cannot enter the other terminal side without going through the gap between the detachment groove 32c and the detachment protrusion 93b. Accordingly, the infiltration of the foreign material and the like can be more reliably obviated.

Moreover, the structure of causing the cover 80 to retain the connectors CA, CB is not limited to the structure described above. However, if the connector locking hole 94b and the flexurally deformable connector locked protrusions 33a, 33b are used, with a simple procedure of moving the connectors CA, CB while flexurally deforming the connector locked protrusions 33a, 33b, it is possible to fit the respective terminal and engage the connector locked protrusions 33a, 33b and the connector locking hole 94b, thereby fix the connectors CA, CB at the fitting position.

Moreover, the method of assembling the electronic circuit unit 1 is not limited to the method described above. For example, it is not necessary to use the assembly jig 100. Specifically, in the assembly method according to the first embodiment, the step of temporarily locking the base member 50 and the electronic circuit body 10 to the assembly jig 100, and the step of inserting the temporary locking protrusions 105A, 105B into the bolt through-holes 85A, 85B of the cover 80 may be omitted. However, if the assembly jig 100 is used and the temporary locking protrusions 105A, 105B of the assembly jig 100 are respectively inserted into the bolt through-holes of the base member 50 and the electronic circuit body 10 to temporarily lock the base member 50 and the electronic circuit body 10 to the assembly jig 100 and the temporary locking protrusions 105A, 105B are inserted into the bolt through-holes of the cover 80, the positioning accuracy of the base member 50, the electronic circuit body 10 and the cover 80 can be improved. Consequently, the cover 80 can be reliably disposed at a position of covering the circuit-side terminals 14A, 14B and by extension the fitting-portion.

The preferred second embodiment of the present invention is now explained with reference to the drawings.

Figure 14:
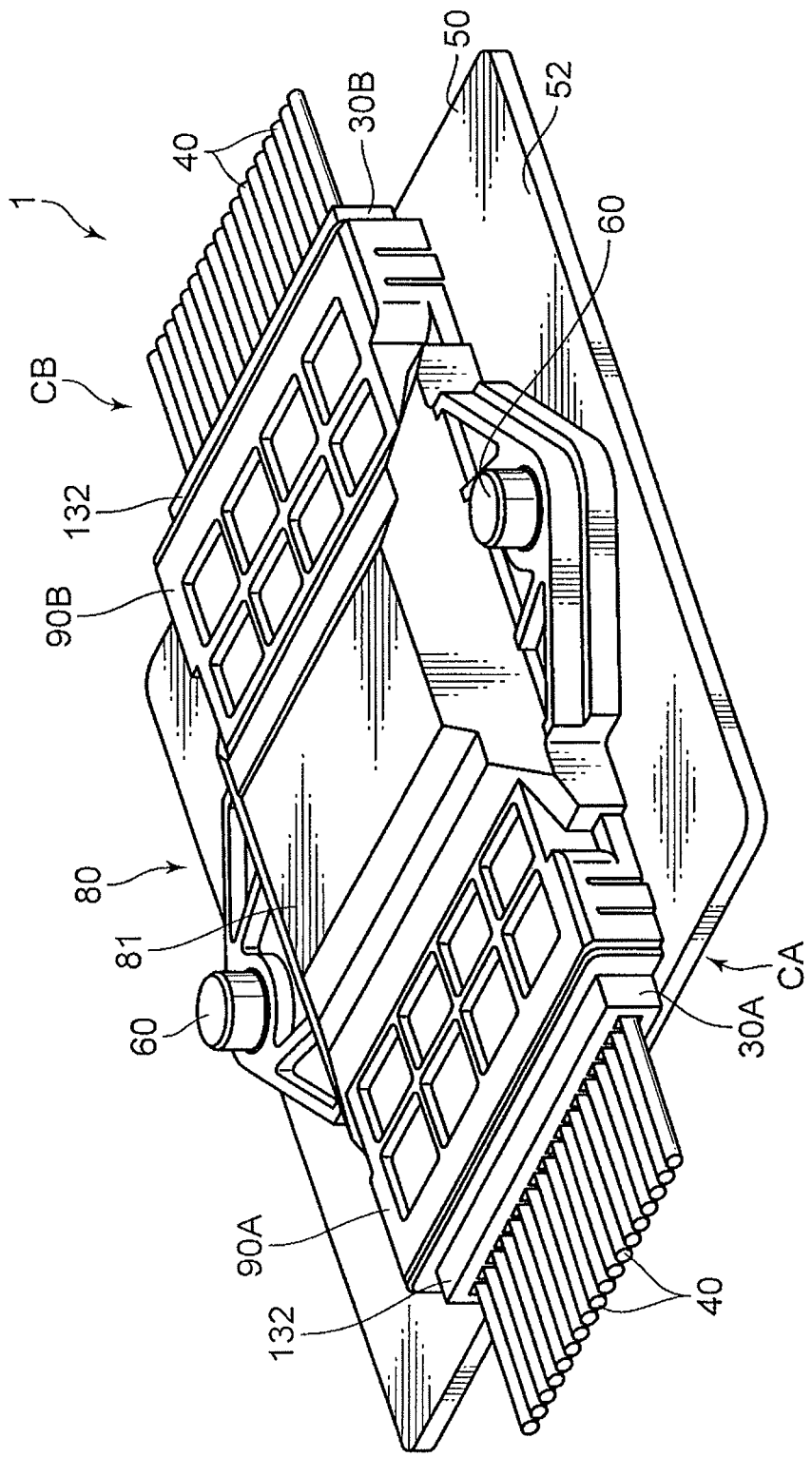
FIG. 14 is a schematic perspective view showing the electronic circuit unit according to the second embodiment of the present invention.
Figure 15:
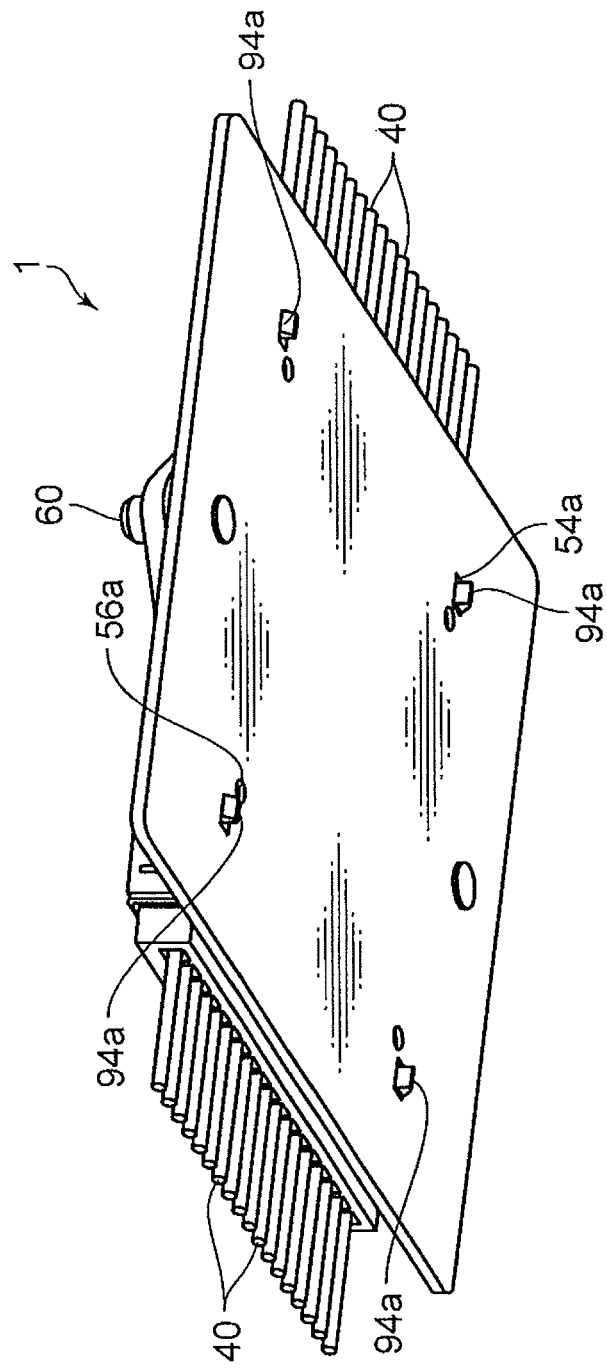
FIG. 15 is a rear view of FIG. 14.
Figure 16:
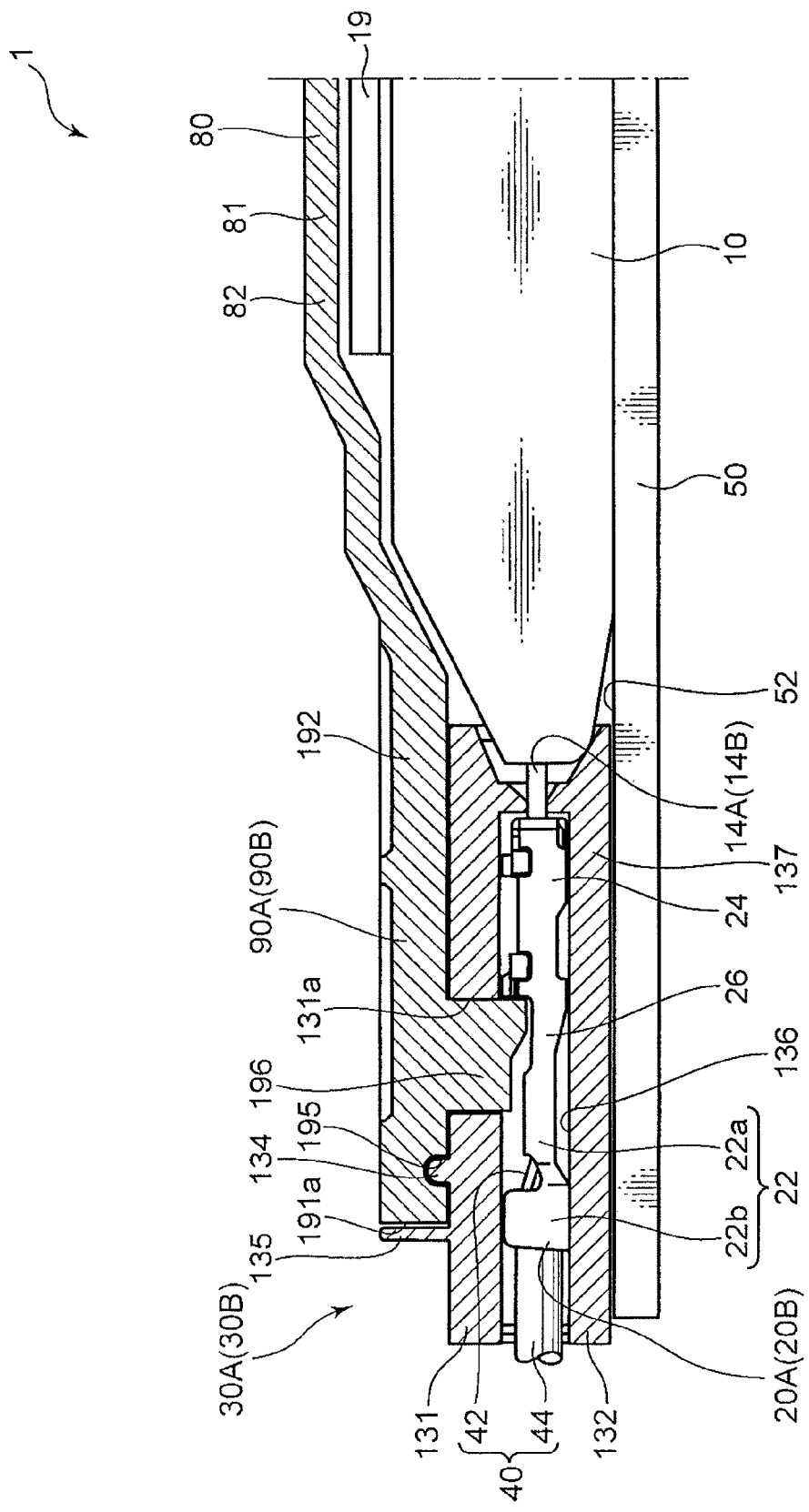
FIG. 16 is a cross-sectional view of FIG. 14.
Figure 17:
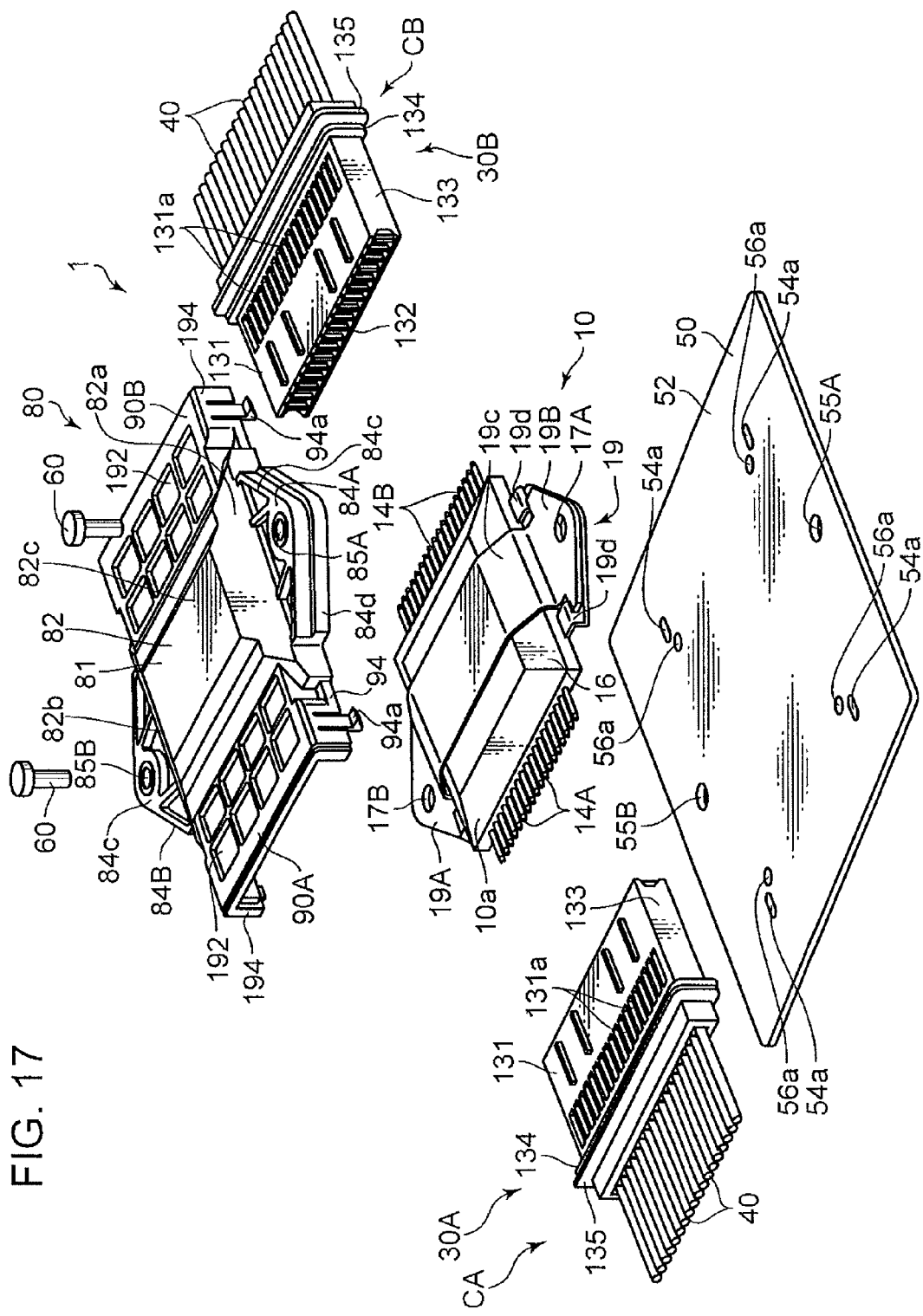
FIG. 17 is an exploded perspective view of the electronic circuit unit shown in FIG. 14.
Figure 18:
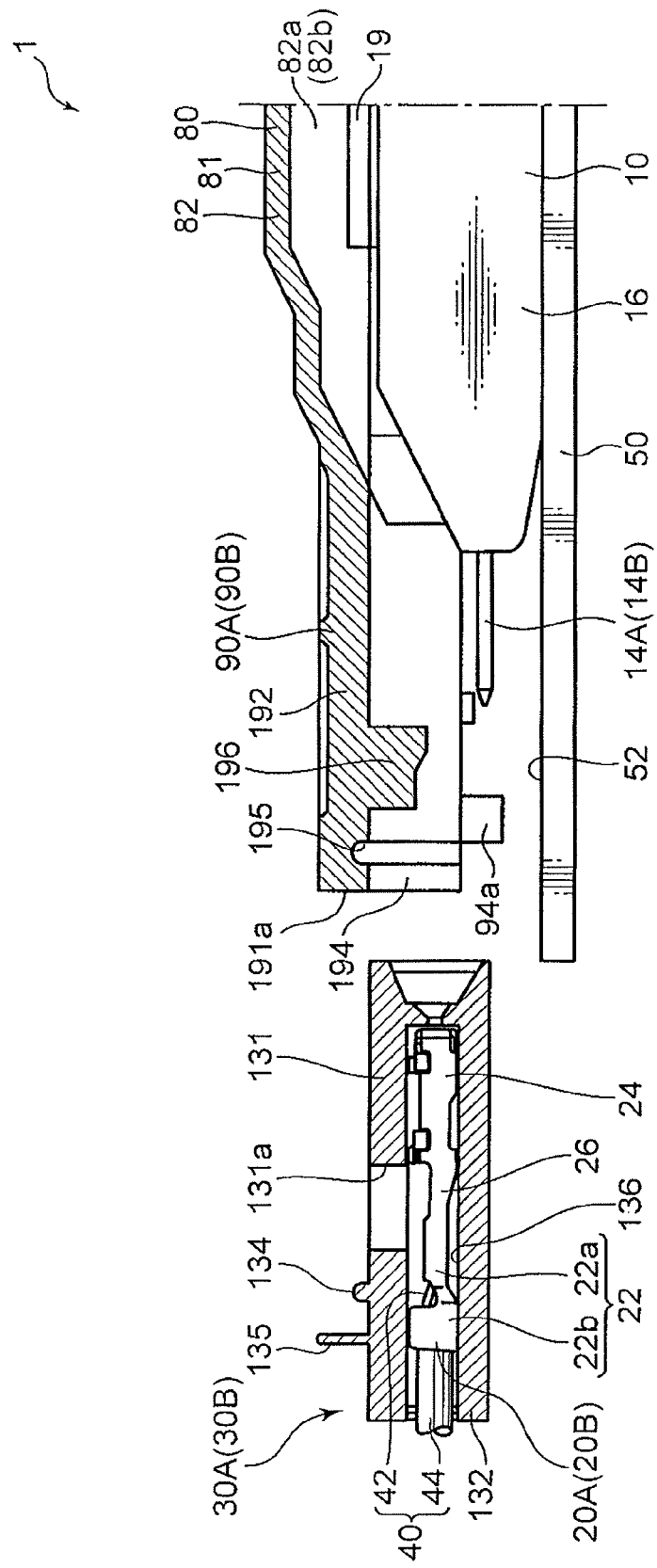
FIG. 18 is a cross-sectional view showing a state before the assembly of the electronic circuit unit shown in FIG. 14.
Figure 19:
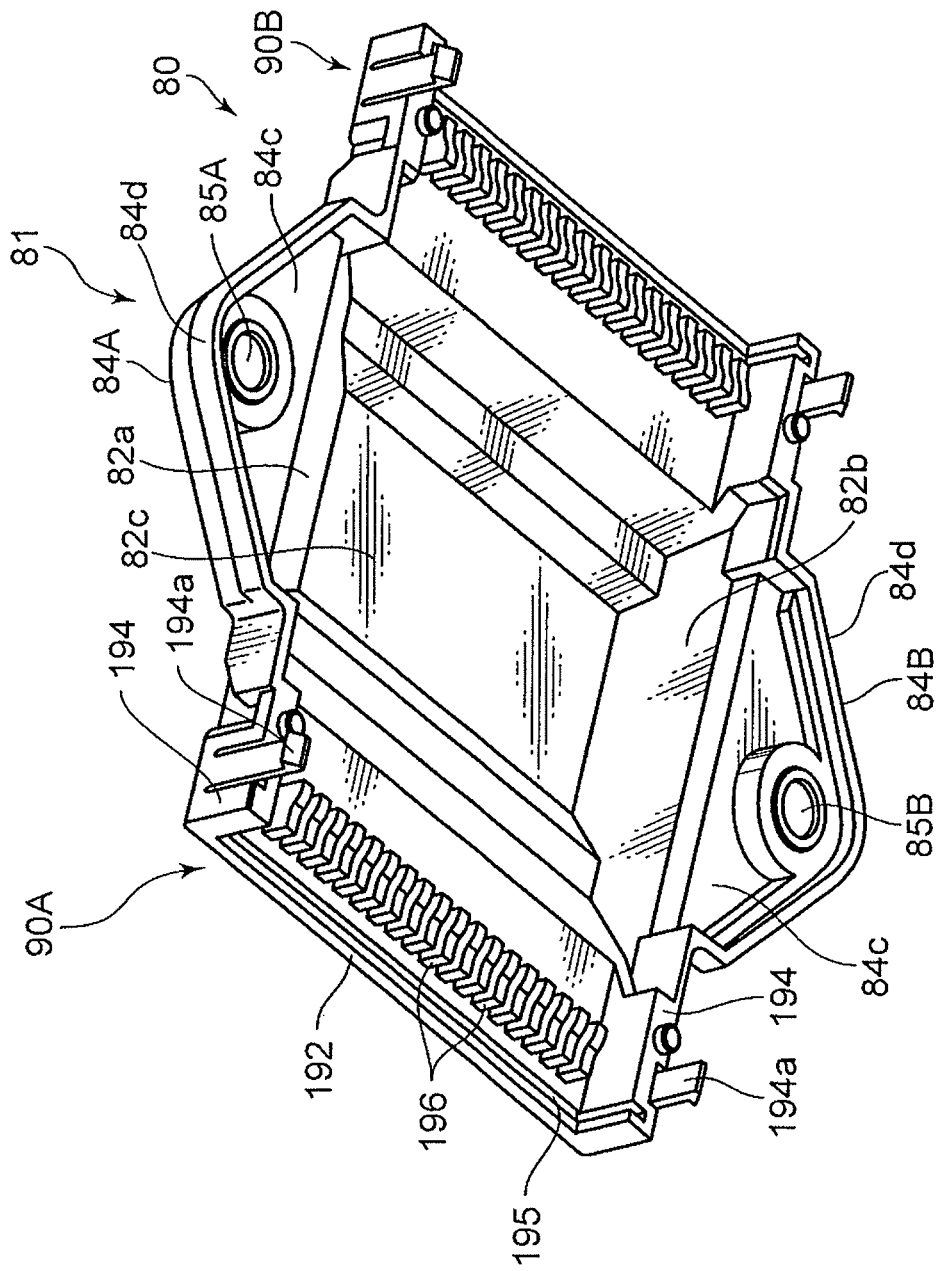
FIG. 19 is a schematic perspective view in which the cover of the electronic circuit unit shown in FIG. 14 is viewed from the lower side.

FIG. 14 is a schematic perspective view showing the electronic circuit unit 1 according to the second embodiment. FIG. 15 is a rear view of FIG. 14. FIG. 16 is a side view of FIG. 14. FIG. 17 is a schematic exploded perspective view of the electronic circuit unit 1. FIG. 18 is a schematic exploded side view of the electronic circuit unit 1.

As with the first embodiment, the electronic circuit unit 1 according to the second embodiment comprises an electronic circuit body 10, a first connector CA, a second connector CB, a base member 50, and a cover 80. Meanwhile, the structure of the first connector CA, the second connector CB, the base member 50 and the cover 80 of the electronic circuit unit 1 according to the second embodiment is different from the structure of these components according to the first embodiment. Moreover, the structure of the assembly jig 100 that is used upon assembling the electronic circuit unit 1 according to the second embodiment is different from the structure of the assembly jig 100 according to the first embodiment.

The base member 50 according to the second embodiment is configured by the base member 50 according to the first embodiment additionally including a plurality of (four) guide protrusion through-holes 56a penetrating in the plate thickness direction thereof. Guide protrusions 106A, 106B described later of the assembly jig 100 can be inserted through each of the guide protrusion through-holes 56a.

In the second embodiment, of the first connector CA and the second connector CB, the structure of the first connector housing 30A and the second connector housing 30B is different from the first embodiment.

Here, of the first connector CA and the second connector CB, the specific structure of the first connector housing 30A and the connector housing 30B is explained.

The outer shape of the connector housing 30A (30B) is a substantial rectangular parallelepiped extending in a direction (horizontal direction) that is parallel to the array direction of the circuit-side terminal 14A (14B). Specifically, the connector housing 30A (30B) includes a lower wall 132, a pair of side walls 133, and an upper wall 131. The lower wall 132 extends in a horizontal direction. The lower wall 132 comes into contact with the placing face 52 when the connector housing 30A (30B) is placed on the placing face 52. The side walls 133 extend upward from the left and right ends of the lower wall 132. The upper wall 131 extends across the upper end portion of these side walls 133.

A plurality of terminal housing chambers (terminal insertion part) 136 extending with respect to left and right direction and in the front-back direction are formed on the inner side of the connector housing 30A (30B). Each of the terminal housing chamber 136 is opened in the front-back direction. Each of the wire-side terminals 20A (20B) is inserted into each of the terminal housing chambers 136. Each of the wire-side terminals 20A (20B) is retained by the connector housing 30A (30B) in a posture of being arranged along a direction that is parallel to the horizontal direction (array direction of the circuit-side terminal 14A (14B)). The circuit-side terminal 14A (14B) is inserted from the forward terminal insertion direction (direction in which the wire-side terminal 20A (20B) is inserted into the terminal housing chamber 136) of the terminal housing chamber 136. In the terminal housing chamber 136, the circuit-side terminal 14A (14B) is inserted into the electrical contacted part 24 of the wire-side terminal 20A (20B), and the circuit-side terminal 14A (14B) fit with the wire-side terminal 20A (20B).

As shown in FIG. 16, in the second embodiment, the protruding direction end of the circuit-side terminal 14A (14B) is inserted into the terminal insertion direction front end of the terminal housing chamber 136.

The connector housing 30A (30B) includes a plurality of retainer insertion holes (openings) 131a. The retainer insertion hole (opening) 131a vertically penetrates the upper wall 131 of the connector housing 30A (30B). Each of the retainer insertion hole (opening) 131a is in communication with each of the terminal housing chambers 136. Each of the retainer insertion holes 131a extends in a rearward terminal insertion direction from a position corresponding to the terminal insertion direction rear end (terminal contacted part) of the electrical contacted part 24 of the wire-side terminal 20A (20B) that is housed in each of the terminal housing chambers 136.

The connector housing 30A (30B) includes a connector locked part (protrusion part, contacted part) 134 and a standing wall part 135. The connector locked part 134 and the standing wall part 135 protrude outwardly from the upper wall 131 and the left and right walls 133 of the connector housing 30A (30B). A part of the connector locked part 134 and a part of the standing wall part 135 protrude upward from the upper wall 131 of the connector housing 30A (30B), and extend in a horizontal direction across the entire upper wall 131. The other end of the connector locked part 134 and the other end of the standing wall part 135 protrude to the outer left and right sides from the left and right walls 133 of the connector housing 30A (30B), and extend in a vertical direction across the entire vertical direction of the side walls 133. The connector locked part 134 and the standing wall part 135 mutually extend in parallel in a state of being separated in the front-back direction. The connector locked part 134 is positioned in a terminal insertion direction that is more rearward than the retainer insertion hole 131a. The standing wall part 135 is positioned in a terminal insertion direction that is more rearward than the connector locked part 134. The protruding dimension of the standing wall part 135 from the upper wall 131 and the left and right walls 133 is greater than the protruding dimension of the connector locked part 134.

In the second embodiment, of the cover 80, the structure of the first fitting-portion covering part 90A and the second fitting-portion covering part 90B is different from the first embodiment. In other words, in the first embodiment and the second embodiment, the structure of the main-body covering part 81 is the same. Here, of the cover 80, the specific structure of the first fitting-portion covering part 90A and the second fitting-portion covering part 90B is explained.

The first fitting-portion covering part 90A covers the fitting-portion of the first circuit-side terminal 14A and the first wire-side terminal 20A from a side opposing to the placing face 52. As with the first embodiment, the first fitting-portion covering part 90A extends rearward (first protruding direction) from the rear end of the main-body covering part 81 (end on the first circuit-side terminal 14A side).

The second fitting-portion covering part 90B covers the fitting-portion of the second circuit-side terminal 14B and the second wire-side terminal 20B from a side opposing to the placing face 52. The second fitting-portion covering part 90B extends forward (second protruding direction) from the front end of the main-body covering part 81 (end on the second circuit-side terminal 14B side).

The first fitting-portion covering part 90A and the second fitting-portion covering part 90B have a symmetrical shape and structure in the front-back direction. The first fitting-portion covering part 90A and the second fitting-portion covering part 90B respectively include an upper wall 192, a pair of side walls 194, and a plurality of retainer parts (terminal restricting parts) 196. The upper wall 192 of the first fitting-portion covering part 90A extends rearward (first protruding direction) from the upper wall 82c of the main-body part 82 of the main-body covering part 81. The upper wall 192 of the second fitting-portion covering part 90B extends forward (second protruding direction) from the upper wall 82c of the main-body part 82 of the main-body covering part 81. The side walls 194 of each of the fitting-portion covering parts 90A (90B) respectively extend downward from the left and right edges of the upper wall 192. The retainer part 196 of each of the fitting-portion covering parts 90A (90B) protrudes downward from the upper wall 192.

The portion of the connector housing 30A (30B) in a terminal insertion direction that is more forward than the standing wall part 135 (excluding the front end of the terminal insertion direction covered by the main-body covering part 81) is housed in the region that is encompassed by the side walls 194 and the upper wall 192 of the fitting-portion covering part 90A (90B). In the ensuing explanation, of the portion in a terminal insertion direction that is more forward than the standing wall part 135 of the connector housing 30A (30B), the portion excluding the front end of the terminal insertion direction covered by the main-body covering part 81 is referred to as a "housing main-body covering part 137".

A connector locking groove 195 (restricting part, recess part) which expands toward the outer side face is formed on the inner side face of the fitting-portion covering part 90A (90B). Specifically, the connector locking groove 195 is formed on the bottom face of the upper wall 192 of the fitting-portion covering part 90A (90B), the left side face of the right side wall 194, and the right side face of the left side wall 194.

The inner side face of the fitting-portion covering part 90A (90B) on which the connector locking groove 195 is formed faces the outer side face of the housing main-body covering part 137 in a state where the housing main-body covering part 137 is housed in the fitting-portion covering part 90A (90B). Specifically, the bottom face of the upper wall 192 of the fitting-portion covering part 90A (90B) faces the top face of the housing main-body covering part 137. The left side face of the right side wall 194 of the fitting-portion covering part 90A (90B) and the right side face of the left side wall 194 respectively face the left and right side walls 133 of the housing main-body covering part 137.

The connector locking groove 195 extends across the entire periphery of the inner side face of the fitting-portion covering part 90A (90B). More specifically, a part of the connector locking groove 195 extends across the entire horizontal direction of the upper wall 192 of the fitting-portion covering part 90A (90B). The other end of the connector locking groove 195 extends vertically across the entire side walls 194 of the fitting-portion covering part 90A (90B) sequentially to the foregoing part. In a state where the housing main-body covering part 137 is housed in the fitting-portion covering part 90A (90B), the connector locked part 134 of the connector housing 30A (30B) is inserted into the inner side of the connector locking groove 195 across the entire longitudinal direction thereof.

In the second embodiment, the configuration is such that the entire connector locked part 134 is inserted into the connector locking groove 195. Specifically, the distance between the bottom face of the upper wall 192 of the fitting-portion covering part 90A (90B) and the lower end of the side walls 194 is set to be substantially the same as the distance between the top face of the upper wall 131 of the housing main-body covering part 137, from which the connector locked part 134 is protruding, and the bottom face of the lower wall 132. Moreover, the distance between the horizontally opposing faces of the side walls 194 of the fitting-portion covering part 90A (90B) is set to be substantially the same as the distance between the horizontally opposing faces of the left and right side walls 133 of the housing main-body covering part 137.

Moreover, the width of the connector locking groove 195 in the front-back direction is set to be substantially the same as the width of the connector locked part 134 in the front-back direction. In a state where the connector locked part 134 is inserted into the connector locking groove 195, the inner side face of the connector locking groove 195 extends along the outer side face of the connector locked part 134. Of the inner side face of the connector locking groove 195, the portion on a side opposing to the main-body covering part 81; that is, the portion of the terminal protruding direction tip side (rear side portion regarding the connector locking groove 195 of the first fitting-portion covering part 90A, and front side portion regarding the connector locking groove 195 of the second fitting-portion covering part 90B) can come into contact with the opposing outer side face of the connector locked part 134 toward the main-body covering part 81 side.

The length of the upper wall 192 and the side walls 194 of the fitting-portion covering part 90A (90B) in the front-back direction is set to a dimension where the terminal protruding direction tip end of the walls 192, 194 will approach the standing wall part 135 in a state where the housing main-body covering part 137 is housed in the fitting-portion covering part 90A (90B). The terminal protruding direction tip end face 191*a* of the upper wall 192 and the side walls 194 of the fitting-portion covering part 90A (90B) extends in a direction that is orthogonal to the front-back direction. Here, as described above, the protruding dimension of the standing wall part 135 is greater than the protruding dimension of the connector locked part 134. Thus, in a state where the housing main-body covering part 137 is housed in the fitting-portion covering part 90A (90B), the standing wall part 135 faces the terminal protruding direction tip end face 191*a* of the fitting-portion covering part 90A (90B).

The respective retainer parts 196 are arranged horizontally in correspondence with the respective retainer insertion holes 131*a*. Each of the retainer parts 196 is inserted into each of the retainer insertion holes 131*a*. In a state of being inserted into each of the retainer insertion holes 131*a*, each of the retainer parts 196 comes into contact with the electrical contacted part 24 of each of the wire-side terminals 20A (20B) in the terminal housing chamber 136 from the rearward terminal insertion direction. Based on the foregoing contact, each of the retainer parts 196 restricts each of the wire-side terminals 20A (20B) from coming off the terminal housing chamber 136.

Cover locked protrusions 194*a* protruding downward are respectively provided to the side walls 194 of the fitting-portion covering part 90A (90B). The cover locked protrusion 194*a* is configured the same as the cover locked protrusion 94*a* according to the first embodiment. In a state of being inserted through the cover locking hole 54*a*, the cover locked protrusion 194*a* comes into contact with the bottom face of the base member 50 from the lower side.

Figure 20:
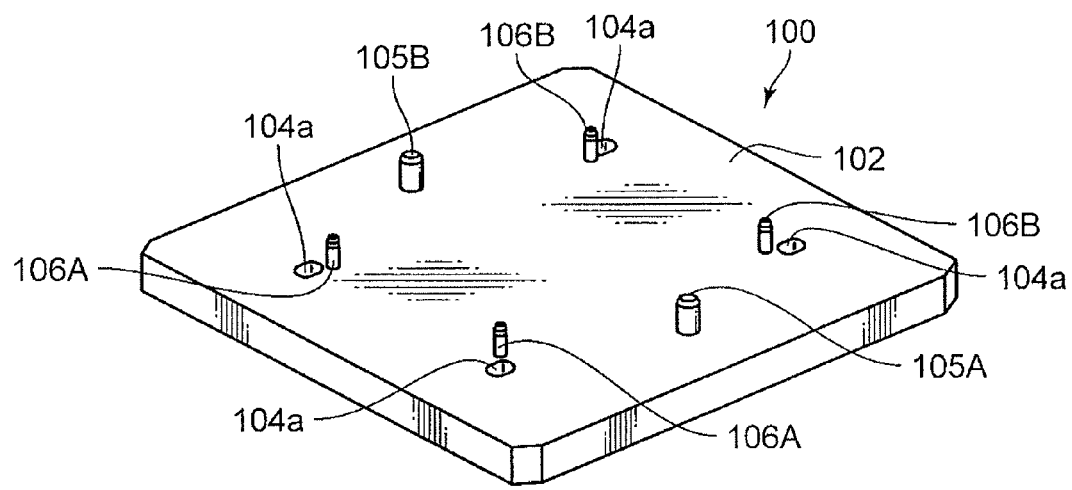
FIG. 20 is a schematic perspective view of the assembly jig according to the second embodiment.

The manufacturing method (assembly method) of the electronic circuit unit 1 is now explained. In the second embodiment, the assembly jig 100 shown in FIG. 20 is used.

The assembly jig 100 according to the second embodiment is configured by the assembly jig 100 according to the first embodiment additionally including a pair of temporary locking protrusions (temporary locking members) 105A, 105B, a pair of first guide protrusions (guiding parts) 106A, and a pair of second guide protrusions (guiding parts) 106B. The temporary locking protrusion 105A protrudes upward from the top face 102 of the assembly jig 100. The outer diameter of the temporary locking protrusions 105A, 105B is smaller than the outer diameter of the bolt 60. The first guide protrusion (guiding part) 106A and the second guide protrusion (guiding part) 106B protrude upward from the top face 102 of the assembly jig 100.

The distance between the first guide protrusions 106A with respect to left and right direction coincides with the width of the housing main-body covering part 137 of the first connector housing 30A with respect to left and right direction. The first guide protrusion 106A is positioned, as described later, in a temporary locked state where the electronic circuit body 10 is temporarily locked to the assembly jig 100, near the protruding direction tip portion of the first circuit-side terminal 14A and at the outer left and right sides of the first circuit-side terminal 14A.

The distance between the second guide protrusions 106B with respect to left and right direction coincides with the width of the housing main-body covering part 137 of the second connector housing 30B with respect to left and right direction. The second guide protrusion 106B is positioned, as described later, in the temporary locked state, near the protruding direction tip portion of the second circuit-side terminal 14B and at the outer left and right sides of the second circuit-side terminal 14B.

The assembly method of the electronic circuit unit 1 using the assembly jig 100 according to the second embodiment includes the follows steps.

(2) Assembly Method of Electronic Circuit Unit 1 According to Second Embodiment (2-1) Connecting Step of Connecting the Wire 40 to the Respective Connectors CA, CB In this step, the wires 40 are respectively connected to the first connector CA and the second connector CB. Specifically, the wire-side terminals 20A, 20B are pressure-bonded in advance to the terminal of the respective wires 40. The wire-side terminals 20A, 20B are respectively inserted into the terminal housing chamber 136. The wire-side terminals 20A, 20B are locked within the terminal housing chamber 136 by using the lance 32*b*.

(2-2) Placing Step

Figure 21:
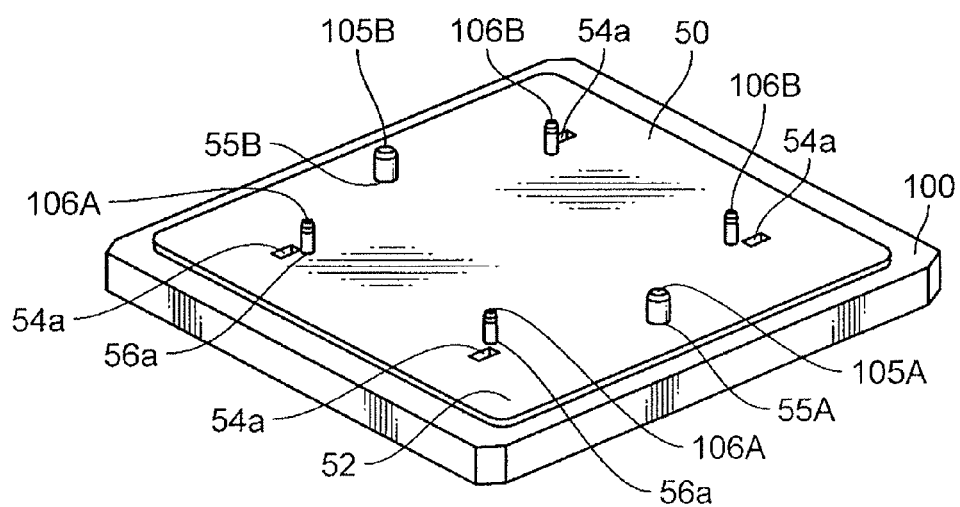
FIG. 21 is a schematic perspective view showing a state where the assembly jig shown in FIG. 20 is temporarily locked with the base member.

In this step, foremost, as shown in FIG. 21, the base member 50 is placed on the top face 102 of the assembly jig 100, and the base member 50 is temporarily locked to the assembly jig 100. Here, the temporary locking protrusions 105A, 105B are respectively inserted into the bolt through-holes 55A, 55B of the base member 50. The guide protrusions 106A, 106B are respectively inserted into each of the guide protrusion through-holes 56*a* of the base member 50. Moreover, the placing face 52 of the base member 50 is disposed to face upward. In this temporary locked state, the position of each of the locking protrusion insertion holes 104*a* coincides with the position of each of the cover locking holes 54*a* of the base member 50.

Figure 22:
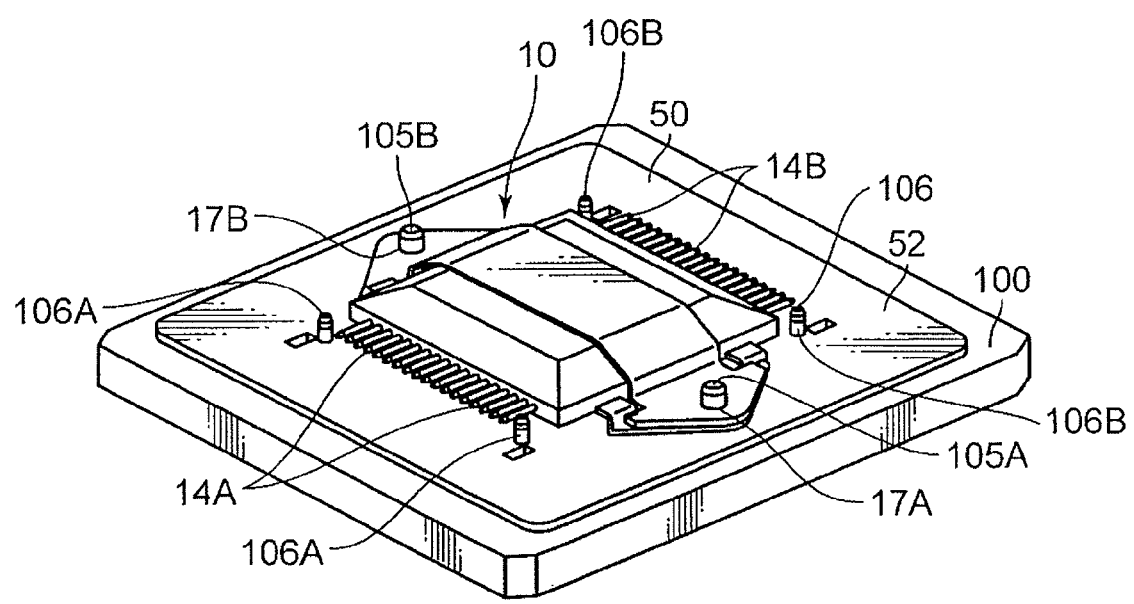
FIG. 22 is a schematic perspective view showing a state where the electronic circuit body is placed on the placing face of the base member in the state shown in FIG. 21.

Next, as shown in FIG. 22, the electronic circuit body 10 is placed on the placing face 52 of the base member 50. Here, the temporary locking protrusions 105A, 105B are respectively inserted into the bolt through-holes 17A, 17B of the electronic circuit body 10. Moreover, the array direction of the first circuit-side terminal 14A and the array direction of the second circuit-side terminal 14B are parallel to the placing face 52. As a result of the temporary locking protrusions 105A, 105B being inserted into the bolt through-holes 17A, 17B, the electronic circuit body 10 is temporarily locked to the assembly jig 100. In this temporary locked state, the first guide protrusions 106A and the second guide protrusion 106B are positioned near the protruding direction tip portion of the first circuit-side terminal 14A and the second circuit-side terminal 14B, and at the outer left and right sides of the first circuit-side terminal 14A and the second circuit-side terminal 14B.

(2-3) Fitting Step

In this step, the first connector CA is connected to the electronic circuit body 10, and the first wire-side terminal 20A retained by the first connector CA fit with the first circuit-side terminal 14A. Moreover, the second connector CB is connected to the electronic circuit body 10, and the second wire-side terminal 20B retained by the second connector CB fit with the second circuit-side terminal 14B.

Figure 23:
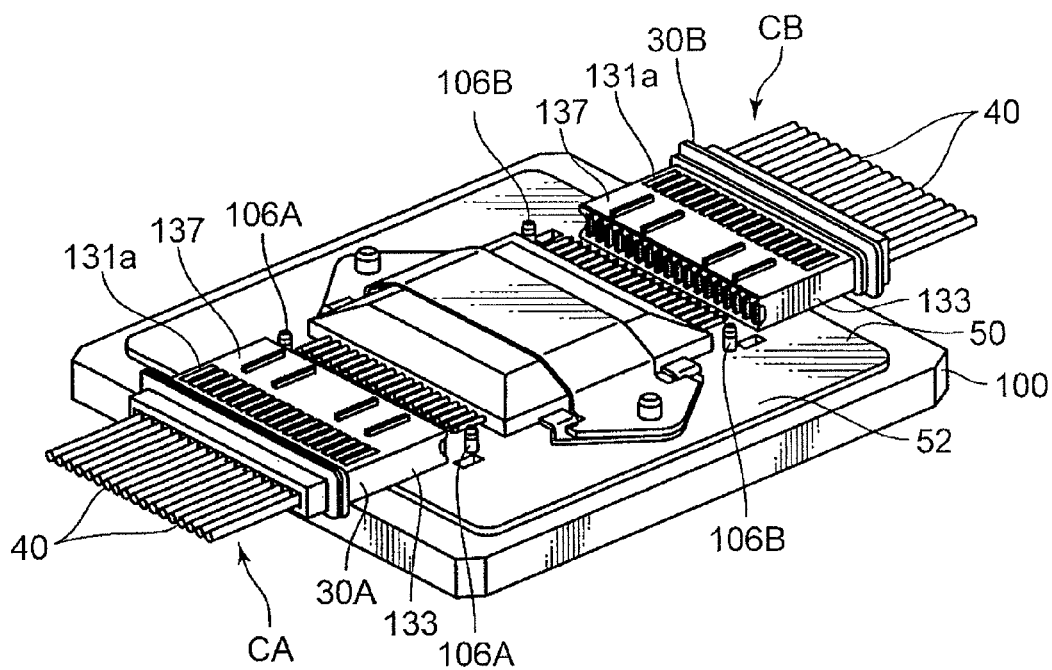
FIG. 23 is a schematic perspective view showing a state before both connectors are connected to the electronic circuit body in the state shown in FIG. 22.

Specifically, foremost, as shown in FIG. 23, in a posture of the retainer insertion hole 131a opening upward, the first connector CA is disposed at a position (first detached position) that is more rearward than the first fitting position where the first connector CA and the electronic circuit body 10 are connected.

Moreover, in a posture of the retainer insertion hole 131a opening upward, the second connector CB is disposed at a position (second detached position) that is more forward than the second fitting position where the second connector CB and the electronic circuit body 10 are connected.

Figure 24:
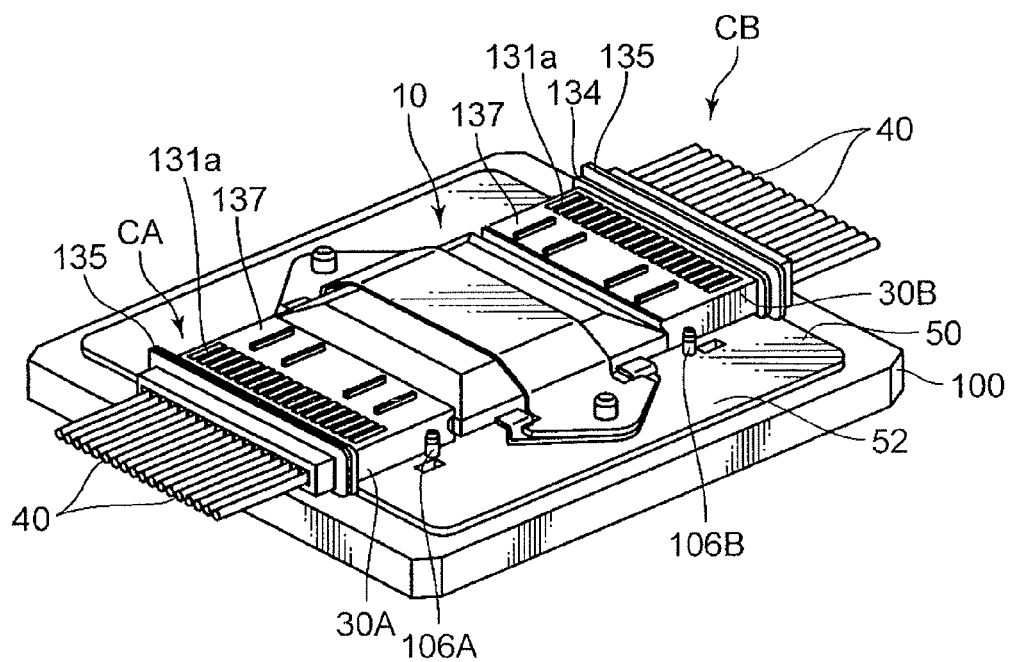
FIG. 24 is a schematic perspective view showing a state where both connectors are connected to the electronic circuit body in the state shown in FIG. 23.

Thereafter, as shown in FIG. 24, the first connector CA is pressed forward (toward the electronic circuit body 10 side) while sliding the left and right walls 133 of the housing main-body covering part 137 along the first guide protrusions 106A. Here, the first circuit-side terminal 14A is inserted into the terminal housing chamber 136 of the first connector CA. As a result of the first connector CA being pressed up to the first fitting position, the electrical contacted part 24 fit with the first circuit-side terminal 14A in the terminal housing chamber 136.

Moreover, the second connector CB is pressed rearward (toward the electronic circuit body 10 side) while sliding the left and right walls 133 of the housing main-body covering part 137 along the second guide protrusions 106B. Here, the second circuit-side terminal 14B is inserted into the terminal housing chamber 136 of the second connector CB. As a result of the second connector CB being pressed up to the second fitting position, the electrical contacted part 24 fit with the second circuit-side terminal 14B in the terminal housing chamber 136.

Here, in the second embodiment, the connectors CA, CB are moved while sliding the left and right walls 133 of the housing main-body covering part 137 along each of the guide protrusions 106A, 106B, and the connectors CA, CB can be moved accurately to the fitting position.

(2-4) Fastening Step

Figure 25:
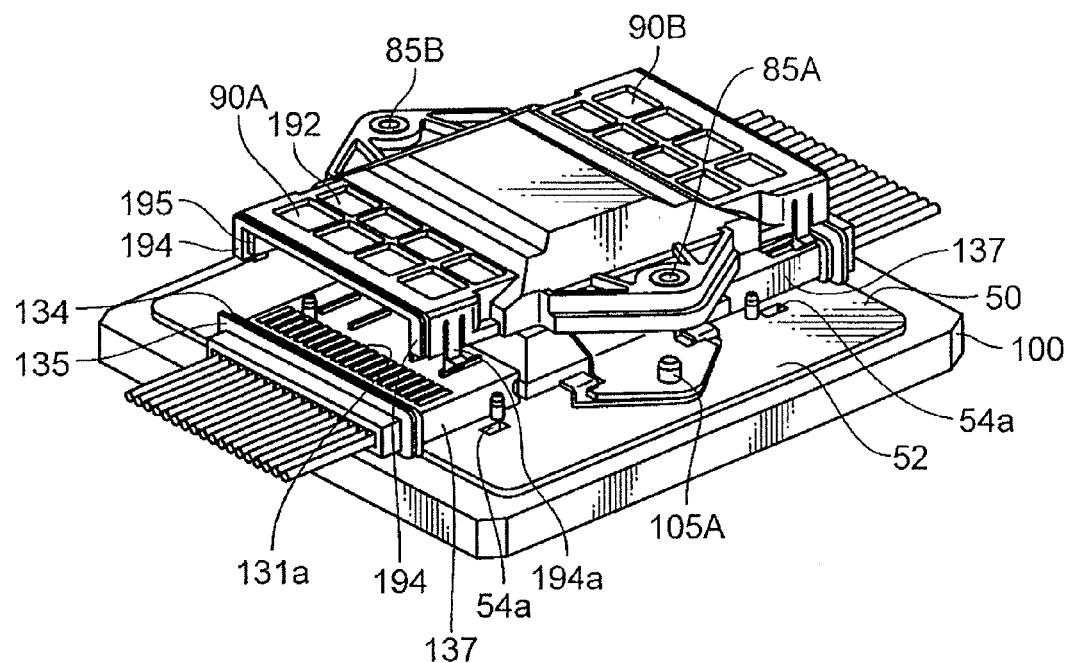
FIG. 25 is a schematic perspective view showing a state before the cover is placed over the electronic circuit body and both connectors in the state shown in FIG. 24.

In this step, as shown in FIG. 25, the cover 80 is placed over the mutually connected electronic circuit body 10 and connectors CA, CB from a side (upper side) opposing to the placing face 52, and placed on the placing face 52 of the base member 50. The cover 80 is thereafter fixed to the base member 50.

Specifically, the temporary locking protrusions 105A, 105B are respectively inserted into the bolt through-holes 85A, 85B of the cover 80. Moreover, the cover locked protrusion 194a of the cover 80 is inserted into the cover locking hole 54a of the base member 50 and into the locking protrusion insertion hole 104a of the assembly jig 100. Subsequently, the cover 80 is placed over the electronic circuit body 10 and the connectors CA, CB from the upper side.

Here, the main-body covering part 81 of the cover 80 is placed over the electronic circuit main body 10a and the placing member 19 of the electronic circuit body 10.

Moreover, the first fitting-portion covering part 90A of the cover 80 is placed over the housing main-body covering part 137 of the first connector housing 30A. Here, each of the retainers 196 of the first fitting-portion covering part 90A is inserted into each of the retainer insertion holes 131a of the first connector housing 30A. Moreover, the connector locked part 134 of the first connector housing 30A is inserted into the connector locking groove 195 of the cover 80.

Moreover, the second fitting-portion covering part 90B of the cover 80 is placed over the housing main-body covering part 137 of the second connector housing 30B. Here, each of the retainers 196 of the second fitting-portion covering part 90B is inserted into each of the retainer insertion holes 131a of the second connector housing 30B. Moreover, the connector locked part 134 of the second connector housing 30B is inserted into the connector locking groove 195 of the cover 80.

As described above, the hole diameter of the locking protrusion insertion hole 104a is greater than the hole diameter of the cover locking hole 54a. Thus, the cover locked protrusion 194a comes into contact with the bottom face of the base member 50, from below, in the cover locking hole 54a. Based on the foregoing contact, the cover 80 is fixed to the base member 50. In a state where the cover 80 is placed on and fixed to the placing face 52, the lower end of each of the side walls 82a, 82b, 84d of the main-body covering part 81 of the cover 80 and the entire lower end of each of the side walls 194 of the fitting-portion covering part 90A (90B) come into contact with the placing face 52.

Moreover, each of the connector locked parts 134 is inserted into each of the connector locking grooves 195. Consequently, each of the connectors CA, CB is retained at the fitting position by the cover 80. Specifically, when rearward force (in a direction from the fitting position to the detached position) is applied to the first connector CA, the inner side face of the connector locking groove 95 comes into contact with the connector locked part 134 of the first connector CA from the front side (in a direction from the first detached position to the first fitting position). This contact restricts the detachment of the first connector CA to the detached position. Similarly, when rearward force (in a direction from the fitting position to the detached position) is applied to the second connector CB, the inner side face of the connector locking groove 195 comes into contact with the connector locked part 134 of the second connector CB from the rear side (in a direction from the second detached position to the second fitting position). This contact restricts the detachment of the second connector CB to the detached position.

Here, pursuant to each of the connector locked parts 134 being inserted into each of the connector locking grooves 195, in a view from the front-back direction, the gap between the inner side face of each of the fitting-portion covering parts 90A, 90B and the outer side face of reach of the opposing housing main-body covering parts 137 is blocked. As described above, the connector locked part 134 extends across the entire horizontal direction of the upper wall 131 of the connector housing 30A (30B) and extends across the entire vertical direction of the left and right walls 133. In addition, the connector locking groove 195 extends in correspondence with the overall connector locked part 134. Thus, the entire gap is blocked.

In addition, as a result of each of the retainer parts 196 being inserted into each of the retainer insertion holes 131*a*, each of the wire-side terminals 20A, 20B is retained at a terminal fitting position of fitting with each of the circuit-side terminals 14A, 14B. Specifically, when force working from the terminal fitting position to the terminal detached position (position in a terminal insertion direction that is more rearward than the terminal fitting position and position where the first wire-side terminal 20A and the first circuit-side terminal 14A do not fit) is applied to the first wire-side terminal 20A, the retainer part 196 comes into contact with the terminal insertion direction rear end of the electrical contacted part 24 of the first wire-side terminal 20A toward a forward terminal insertion direction. This contact restricts the first wire-side terminal 20A from becoming detached from the terminal fitting position to the terminal detached position. Similarly, when force working from the terminal fitting position to the terminal detached position (position where the second wire-side terminal 20B and the second circuit-side terminal 14B do not fit) is applied to the second wire-side terminal 20B, the retainer part 196 comes into contact with the terminal insertion direction rear end of the electrical contacted part 24 of the second wire-side terminal 20B toward a forward terminal insertion direction. This contact restricts the second wire-side terminal 20B from becoming detached from the terminal fitting position to the terminal detached position.

Pursuant to the cover 80 being fixed to the base member 50 as described above, the connectors CA, CB are retained at the fitting position, and the wire-side terminals 20A, 20B are retained at the terminal fitting position.

In a state where the cover 80 is fixed to the base member 50, the end of the first fitting-portion covering part 90A (90B) is disposed between the standing wall part 135 and the connector locked part 134, and the end face 191*a* thereof faces the standing wall part 135 at a position that is near the standing wall part 135.

Subsequently, the temporary locking protrusions 105A, 105B are removed from each of the bolt through-holes 85A, 85B, 17A, 17B, 55A, 55B of the cover 80, the electronic circuit body 10 and the base member 50. Moreover, the guide protrusions 106A, 106B are removed from the guide protrusion through-hole 56*a* of the base member 50. Subsequently, while maintaining a state where the electronic circuit body 10 and the connectors CA, CB are connected and a state where the cover 80 is fixed to the base member 50 while retaining the connectors CA, CB, the electronic circuit body 10, the connectors CA, CB, the cover 80 and the base member 50 are removed from the assembly jig 100.

Next, the bolt 60 is inserted through the bolt through-holes 85A, 85B of the cover 80, the bolt through-holes 17A, 17B of the electronic circuit body 10, and the bolt through-holes 55A, 55B of the base member 50. Moreover, a nut is fastened to the end of the bolt 60. Consequently, the electronic circuit body 10 that is connected to each of the connectors CA, CB and the cover 80 are fixed to the base member 50 in a mutually coupled state.

The assembly of the electronic circuit unit 1 according to the second embodiment is thereby complete.

In the electronic circuit unit 1 according to the second embodiment also, as with the first embodiment, the placing face 52 of the base member 50 and the fitting-portion covering parts 90A, 90B of the cover 80 cover the housing main-body covering part 137 and by extension the fitting-portion of the wire-side terminals 20A, 20B and the circuit-side terminals 14A, 14B retained in the housing main-body covering part 137 from either side. Thus, with a simple configuration of providing the cover 80, it is possible to effectively obviate the foreign material contained in the oil flowing within the casing from infiltrating the fitting-portion and by extension between the respective terminals in a usage state where the electronic circuit unit 1 is housed within the casing of the automatic transmission. It is thereby possible to prevent troubles such as the short-circuit between circuits with the foreign material acting as the medium. To put it differently, with the electronic circuit unit 1, the electronic circuit unit 1 and the wire (for instance, heat-resistant wire) 40 can be connected while obviating, based on a simple structure, troubles caused by the foreign material existing within the casing of the automatic transmission (specifically, preventing the infiltration of foreign material with an inexpensive structure).

In particular, the cover 80 includes a main-body covering part 81 for covering the electronic circuit main body 10*a*, and the fitting-portion covering parts 90A, 90B have a shape of extending from the main-body covering part 81 to the protruding direction of the circuit-side terminals 14A, 14B. Thus, the infiltration of foreign material from the electronic circuit main body 10*a* side to the fitting-portion side can be effectively obviated.

Moreover, in the second embodiment, as a result of the connector locked part 134 being inserted into the connector locking groove 195 of the fitting-portion covering part 90A (90B), the gap between the inner side face of the fitting-portion covering part 90A (90B) and the outer side face of the housing main-body covering part 137 is blocked. Thus, it is possible to obviate foreign material from infiltrating from the outside to the fitting-portion side through the gap.

In addition, by inserting the connector locked part 134 into the connector locking groove 195, the connector CA (CB) is retained at the fitting position. Thus, in the second embodiment, with a simple configuration of providing the connector locking groove 195 and the connector locked part 134, it is possible to yield the function of obviating the infiltration of foreign material and the function of retaining the connector CA (CB). In other words, with the electronic circuit unit 1 of the second embodiment, by using the cover 80, it is possible to retain the connector CA (CB) at the fitting position and improve the reliability of the connection between the connector CA (CB) and the electronic circuit body 10 while obviating the infiltration of foreign material.

However, the present invention also covers a configuration where the function of obviating the infiltration of foreign material and the retention function are realized by individual elements. In other words, the connector locking groove 195 and the connector locked part 134 do not need to come into contact in the fitting direction, and the fitting-portion covering parts 90A, 90B may be separately provided with a contacted part that comes into contact with the connectors CA, CB toward the fitting direction side.

In addition, the end face 191*a* of the first fitting-portion covering part 90A (90B) is disposed between the standing wall part 135 and the connector locked part 134 in a state of approaching and facing the standing wall part 135. Thus, the standing wall part 135 and the end face 191*a* obviate the infiltration of foreign material to the connector locked part 134 side. Consequently, it is possible to more reliably obviate the infiltration of foreign material to the fitting-portion.

Specifically, so-called labyrinth structure configured from the standing wall part 135 and the connector locked part 134 and the end face 191*a* is formed near the end on which the end face 191*a* of the first fitting-portion covering part 90A (90B)

is formed. In other words, external foreign material cannot enter the fitting-portion without going through the gap between the standing wall part 135 and the end face 191*a*, in addition to the gap between the connector locked part 134 and the connector locking groove 195. Thus, it is possible to more reliably obviate the infiltration of foreign material from the outside to the fitting-portion.

Here, the configuration for forming the labyrinth structure is not limited to the configuration described above. For example, it is also possible to adopt a configuration of providing a protrusion, which protrudes toward the outer side face of the housing covering part 137, to the inner side face of the fitting-portion covering parts 90A, 90B, providing a groove to the housing covering part 137 into which the foregoing protrusion can be inserted, and providing a standing wall part, which extends in parallel to the protrusion and faces the end face of the terminal insertion direction rear end of the connectors CA, CB, to the fitting-portion covering parts 90A, 90B.

Moreover, the retainer part 196 may be omitted. However, if the retainer part 196 is provided to the cover 80, the configuration can be simplified in comparison to a case of separately providing parts for regulating the detachment of the wire-side terminals 20A, 20B from the terminal fitting position.

Moreover, the method of assembling the electronic circuit unit 1 is not limited to the method described above.

Another assembly method of the electronic circuit unit 1 according to the second embodiment is now explained with reference to FIG. 26 to FIG. 28. With this method, the cover locked protrusion 194*a* is omitted from the cover 80 that is used. Moreover, as the assembly jig 200, as shown in FIG. 26, used is a type where the locking protrusion insertion hole 104*a* is omitted and the top face is configured from a temporary placing face 202 having the same shape as the placing face 52.

Foremost, the wire 40 is connected to each of the connectors CA, CB. In other words, the connecting step of connecting the wire 40 to each of the connectors CA, CB described in (2-1) is performed.

Figure 26:
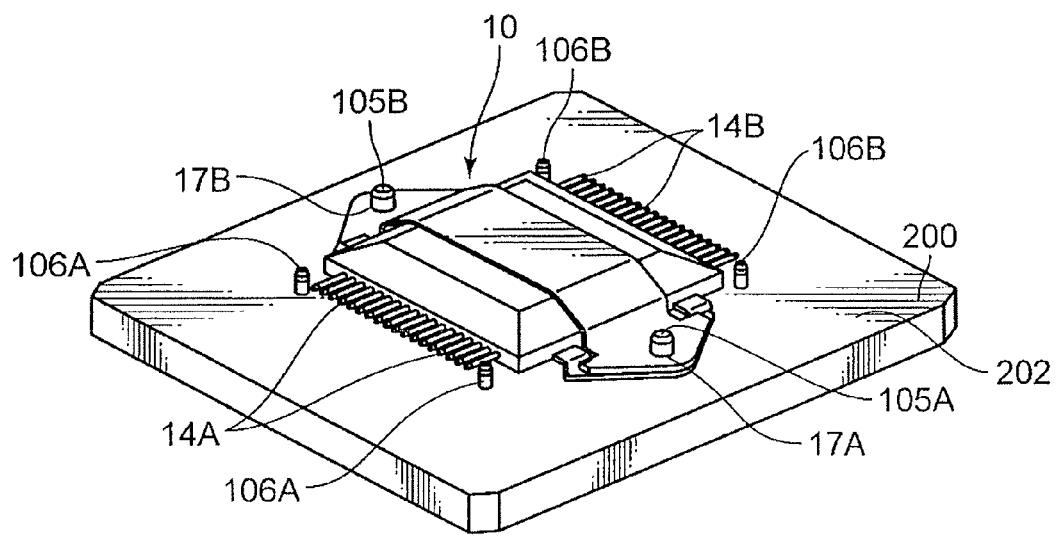
FIG. 26 is a schematic perspective view showing a state where the assembly jig shown according to another example is temporarily locked with an electronic circuit body.

Next, as shown in FIG. 26, the electronic circuit body 10 is placed on the temporary placing face 202 of the assembly jig 200. Here, the side of the electronic circuit body 10 that is placed on placing face 52 is caused to face the temporary placing face 202 side. Specifically, the temporary locking protrusions 105A, 105B are respectively inserted into the bolt through-holes 17A, 17B of the electronic circuit body 10. Subsequently, the electronic circuit body 10 is placed on the temporary placing face 202 so that the array direction of the first circuit-side terminal 14A and the array direction of the second circuit-side terminal 14B become parallel with the placing face 52. As a result of the temporary locking protrusions 105A, 105B being inserted into the bolt through-holes 17A, 17B, the electronic circuit body 10 is temporarily locked to the assembly jig 200 (temporary placing step).

Next, the fitting step described in (2-3) is performed. In other words, the first connector CA is connected to the electronic circuit body 10. The first wire-side terminal 20A retained by the first connector CA fit with the first circuit-side terminal 14A. Moreover, the second connector CB is connected to the electronic circuit body 10. The second wire-side terminal 20B retained by the second connector CB fit with the second circuit-side terminal 14B.

Figure 27:
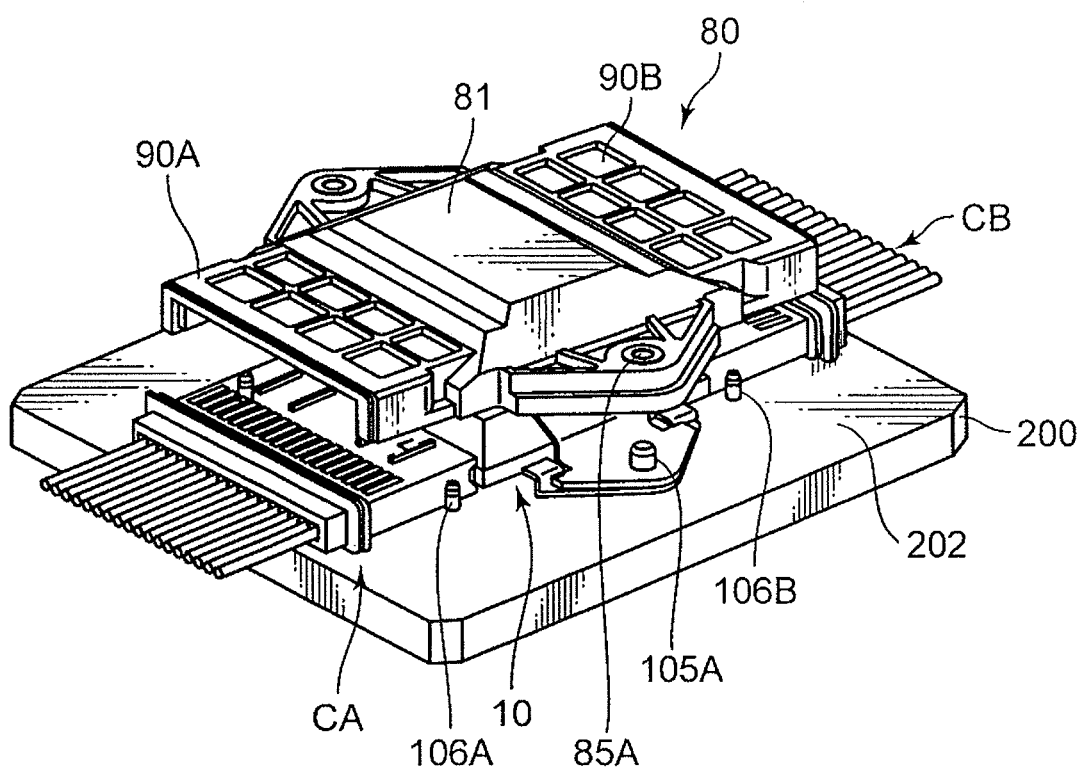
FIG. 27 is a schematic perspective view showing a state where both connectors are connected to the electronic circuit body in the state shown in FIG. 26.

Next, as shown in FIG. 27, the cover 80 is placed on the temporary placing face 202 while being placed over the mutually connected electronic circuit body 10 and connectors CA, CB from the upper side (side opposing to the temporary placing face 202).

Specifically, the cover 80 is placed over the electronic circuit body 10 and the connectors CA, CB from the upper side while respectively inserting the temporary locking protrusions 105A, 105B into the bolt through-holes 85A, 85B of the cover 80. As a result of the temporary locking protrusions 105A, 105B being inserted into the bolt through-holes 85A, 85B, the cover 80 is temporarily locked to the assembly jig 200 (temporary locking step). Here, the main-body covering part 81 of the cover 80 covers the electronic circuit main body 10*a* and the placing member 19 of the electronic circuit body 10 from a side opposing to the temporary placing face 202. Moreover, the fitting-portion covering part 90A (90B) of the cover 80 covers the housing main-body covering part 137 of the connectors CA, CB from a side opposing to the temporary placing face 202. Each of the retainer parts 196 of the cover 80 is inserted into each of the corresponding retainer insertion holes 131*a*. In addition, the connector locked part 134 is inserted into the connector locking groove 195.

Figure 28:
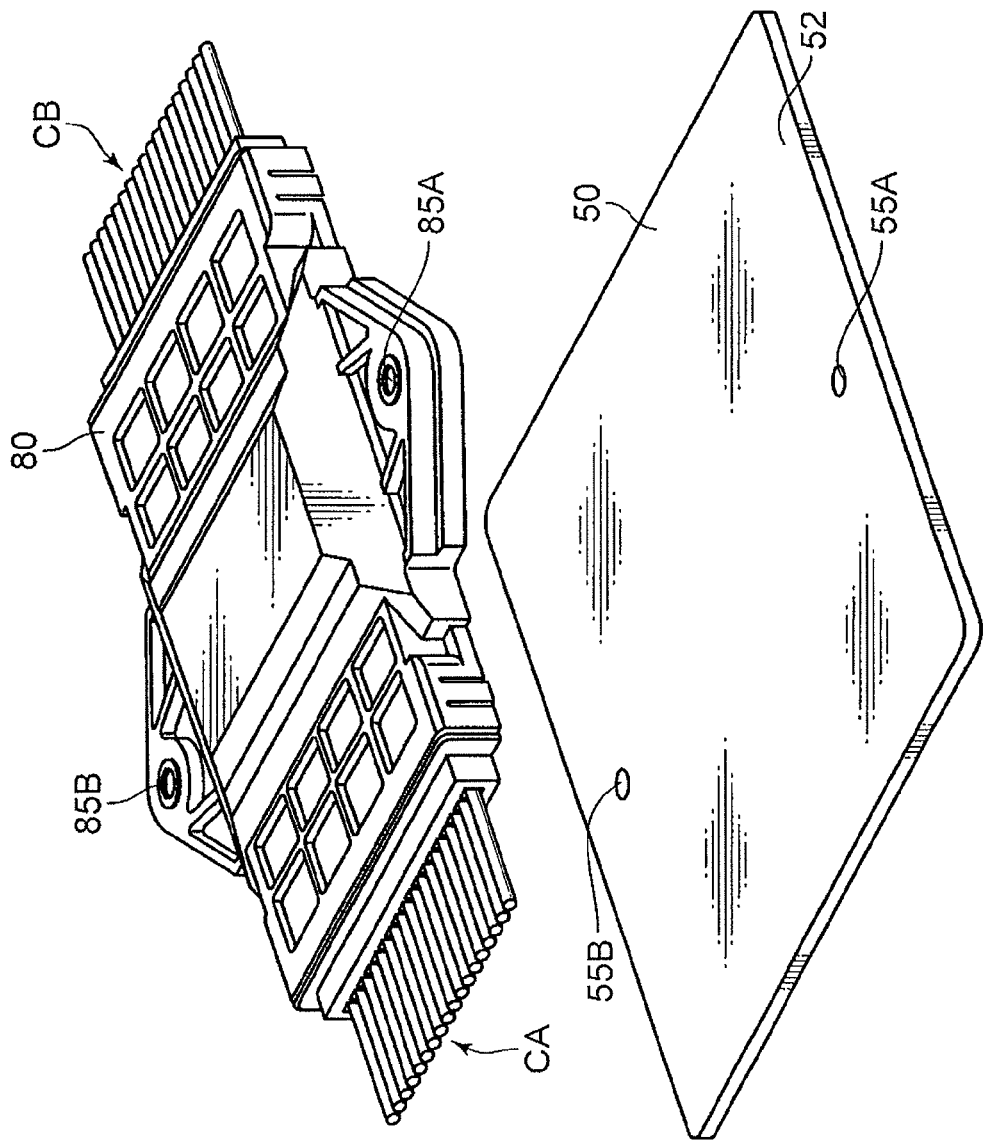
FIG. 28 is a schematic perspective view showing a state where the cover is placed over the electronic circuit body and both connectors in the state shown in FIG. 27.

Next, as shown in FIG. 28, the electronic circuit body 10, the connectors CA, CB and the cover 80 are removed from the assembly jig 200 while maintaining their relative positions.

Subsequently, the electronic circuit body 10, the connectors CA, CB and the cover 80 are placed on the placing face 52 of the base member 50 while maintaining their relative positions (fastening step).

Specifically, the temporary locking protrusions 105A, 105B are removed from the bolt through-holes 17A, 17B of the electronic circuit body 10 and the bolt through-holes 85A, 85B of the cover 80. Subsequently, the electronic circuit body 10, the connectors CA, CB and the cover 80 are removed from the assembly jig 200. Next, the cover 80 and the mutually connected electronic circuit body 10 and connectors CA, CB are placed on the placing face 52 of the base member 50. Here, the bolt through-holes 17A, 17B of the electronic circuit body 10 and the bolt through-holes 85A, 85B of the cover 80 and the bolt through-holes 55A, 55B of the base member 50 are caused to coincide. Thereafter, the bolt 60 is inserted into the bolt through-holes 85A, 85B of the cover 80, the bolt through-holes 17A, 17B of the electronic circuit body 10, and the bolt through-holes 55A, 55B of the base member 50. Subsequently, a nut is fastened to the end of the bolt 60, and, based on the bolt 60, the electronic circuit body 10 connected to each of the connectors CA, CB and the cover 80 are fixed to the base member 50 in a mutually coupled state.

The assembly of the electronic circuit unit 1 according to different example is complete.

Moreover, in the first embodiment and the second embodiment, the shape of the base member 50 can be set arbitrarily. The shape of the base member 50 may be changed arbitrarily according to the placing portion of the electronic circuit unit within the casing of the automatic transmission.

Figure 29:
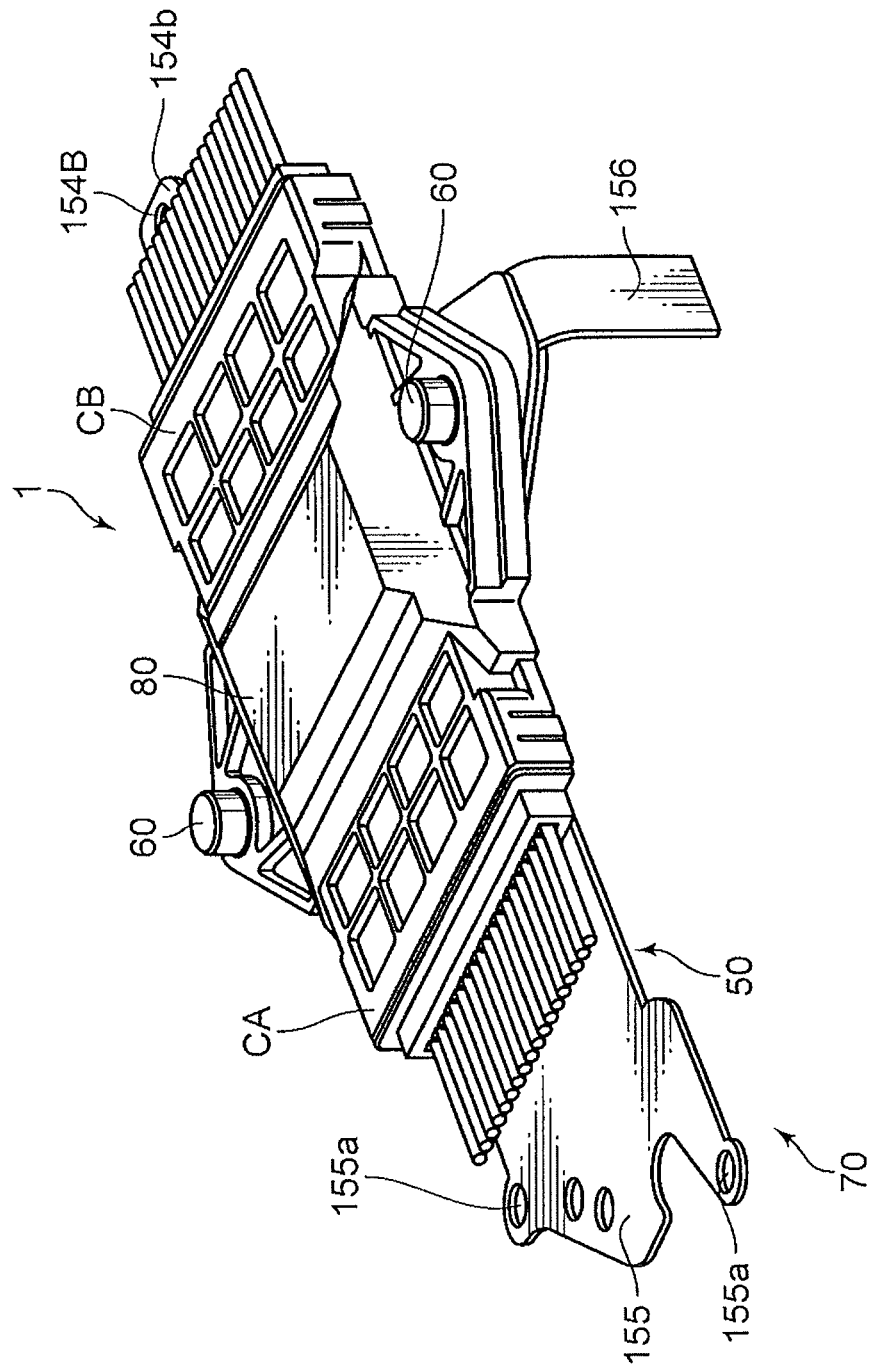
FIG. 29 is a schematic perspective view of an electronic circuit unit comprising the electronic circuit body and both connectors shown in FIG. 14, and a base member having a special shape.
Figure 30:
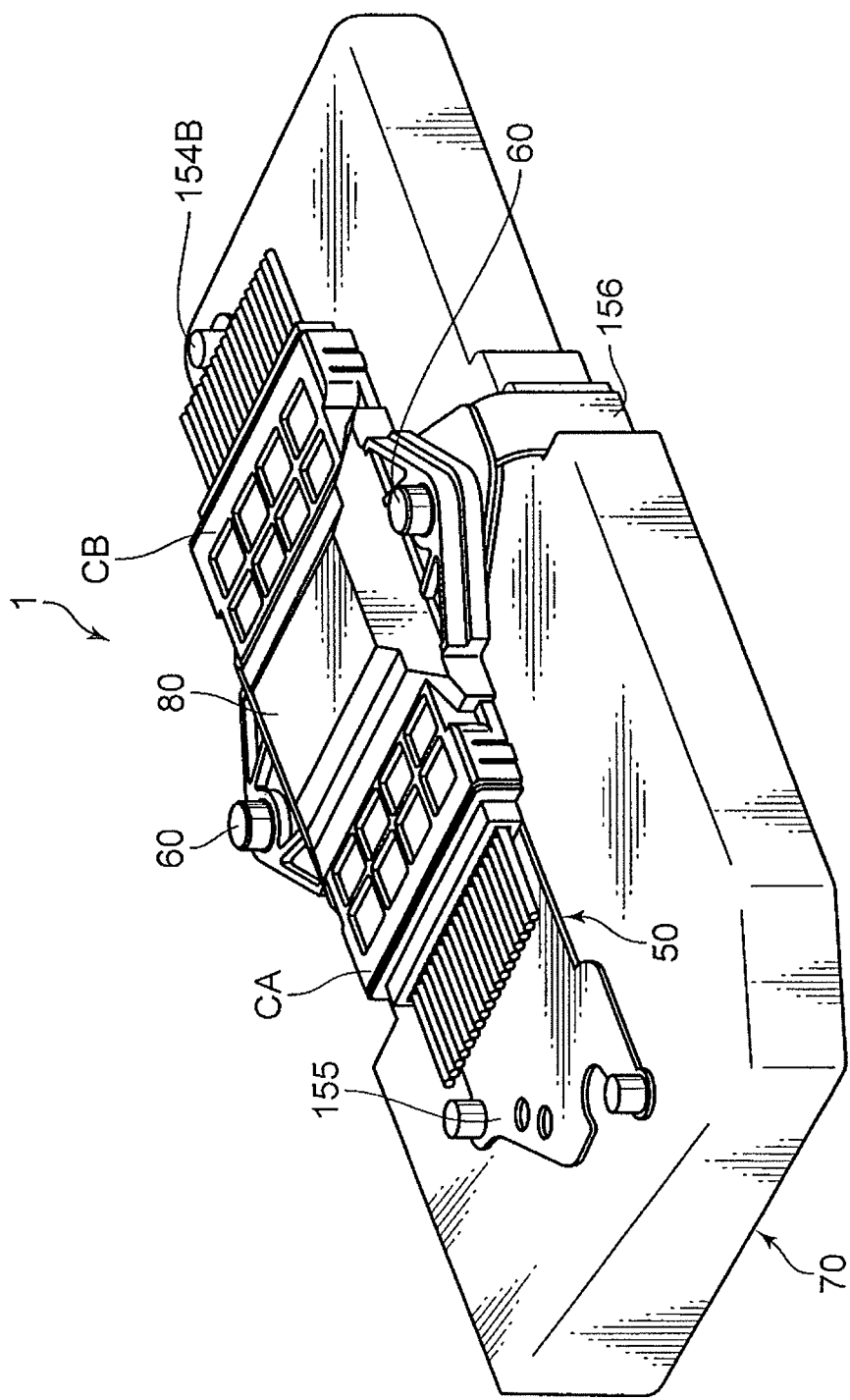
FIG. 30 is a schematic perspective view showing a state where the electronic circuit unit shown in FIG. 29 is fixed on the valve unit of the automatic transmission.

For example, the shape of the base member 50 shown in FIG. 29 was set in consideration of placing the electronic circuit unit on the top face of the valve unit 70 which takes on a complex shape as shown in FIG. 30. The base member 50 includes, in addition to the main-body portion on which the electronic circuit body 10 and both connectors CA, CB are placed, placing parts 154B, 155 and a positioning piece 156 that expand in mutually different directions from the main-body portion. A bolt through-hole 154*b* through which a placing bolt is inserted penetrates the placing part 154B. A plurality of bolt through-holes 155*a* are similarly provided to the placing part 155. The positioning piece 156 stabilizes the electronic circuit unit 1 disposed on the valve unit 70 by coming into contact with a specific portion of the valve unit 70.

Moreover, in the first embodiment and the second embodiment, the structure of fixing the electronic circuit body 10 and the cover 80 to the base member 50 is not limited to the structure of inserting the common bolt 60 through the bolt through-holes 17A, 17B, 85A, 85B of the base member 50 and the cover 80 disposed at the same position and fastening the bolt 60 with a nut. For example, the electronic circuit body 10 and the cover 80 may also be fixed to the base member 50 at different positions using different bolts. However, if the electronic circuit body 10 and the cover 80 are fixed using the common bolt 60, the number of parts can be reduced and the time and effort required for the assembly can be reduced in comparison to the case of using a plurality of bolts.

Moreover, in the first embodiment and the second embodiment, it is possible to omit the cover locked protrusion 94a (194a) and fix the cover 80 to the base member 50 only using the bolt 60.

As explained above, the present invention provides an electronic circuit body including a main-body and a plurality of circuit-side terminals, the main-body having a build-in electronic circuit, the circuit-side terminals being mutually protruding outwardly from the main-body in a common direction; a connector including a plurality of wire-side terminals and a connector housing, the wire-side terminals each having a fitting part adapted to fit with the respective circuit-side terminals, and the wire-side terminals being fixed to respective ends of a plurality of wires, the connector housing being adapted to hold the wire-side terminals in an array corresponding to an array of the circuit-side terminals; a base member including a placing face on which the electronic circuit body and the connector are to be placed, and the electronic circuit body being fixed on the placing face; and a cover placed on the placing face and fastened to the base member, wherein the cover includes: a main-body covering part adapted to cover the main-body of the electronic circuit body from a side opposing to the placing face in an assembled state where the cover and the electronic circuit body are placed on the placing face and where the circuit-side terminals fit on the fitting parts; a fitting-portion covering part extending from the main-body covering part in a protruding direction of the circuit-side terminals, the fitting-portion covering part being adapted to cover a fitting-portion of the circuit-side terminals and the fitting parts from a side opposing to the placing face in the assembled state; and a connector holder adapted to hold the connector at a fitting position where the circuit-side terminals fit with the fitting parts in the assembled state.

According to the present invention, the fit state of the respective terminals can be maintained favorably with a simple configuration, and it is possible to effectively obviate foreign material contained in the oil or the like flowing within the casing of the automatic transmission from infiltrating, for example, the electronic circuit body side.

Specifically, the cover includes a main-body covering part for covering the electronic circuit main body, a fitting-portion covering part for covering a fitting-portion of the respective terminals, and a connector holder that holds the connector. In addition, the cover and the base member coordinate and protect the electronic circuit main body and the fitting-portion from either side. Thus, the infiltration of foreign material to the electronic circuit body side is effectively obviated. In particular, the fitting-portion covering part of the cover extends from the main-body covering part to the protruding direction of the circuit-side terminals. Thus, it is possible to effectively obviate foreign material from infiltrating from the electronic circuit main body side to the fitting-portion side.

In the present invention, preferably, the circuit-side terminals and the fitting parts fit in a fitting direction that coincides with the protruding direction of the circuit-side terminals; and the fitting-portion covering part has a shape adapted to cover the circuit-side terminals from a side opposing to the placing face in a state where the cover and the electronic circuit body are placed on the placing face and where the connector is positioned in a detached position where the fitting parts and the circuit-side terminals are detached, and the fitting-portion covering part has a shape adapted to farm, in the state, an insertion space between the fitting-portion covering part and the placing face so as to allow the connector to be inserted from the detached position to the fitting position along the fitting direction.

With the foregoing configuration, the circuit-side terminals fit with the fitting parts of the wire-side terminals as a result of the connector being inserted between the fitting-portion covering part and the placing face in a state where the circuit-side terminals are covered with the fitting-portion covering part. Thus, the fitting-portions of the respective terminals can be covered with the fitting-portion covering part more reliably.

In the foregoing configuration, preferably, the cover includes a guiding part adapted to guide the connector from the detached position to the fitting position along the fitting direction when the connector is inserted between the fitting-portion covering part and the placing face.

As a result of adopting the foregoing configuration, the fitting part of the wire-side terminals can be easily disposed at a position of fitting with the circuit-side terminals, and at a position of being covered by the fitting-portion covering part upon fitting.

Moreover, preferably, the cover includes terminal isolating parts, each of the terminal isolating parts is placed between the respective circuit-side terminals.

According to the foregoing configuration, the terminal isolating part can more reliably obviate the short-circuit of the circuit-side terminals. Moreover, the terminal isolating part obviates the deformation of the circuit-side terminals and enables the more reliable fitting of the circuit-side terminals and the fitting parts.

Moreover, in the foregoing configuration, preferably, the connector housing includes an opposing face that is farmed between the wire-side terminals, the opposing face faces, in the assembled state, a part of the electronic circuit body of the main-body between the circuit-side terminals, at least a part of the opposing face forms a groove part recessed into the protruding direction of the circuit-side terminals, and the terminal isolating part has a shape extending, in the assembled state, from an end on an electronic circuit body side of the opposing face to an opposing face side, or from a position of an electronic circuit body side closer than the end, so that at least a part of the terminal isolating part is placed in the groove part in the assembled state, and the terminal isolating part includes an outer side face extending along an inner side face of the groove part.

With the foregoing configuration, as a result of the terminal isolating part being disposed in the groove part and the outer side face of the terminal isolating part extending along the inner side face of the groove part, the distance between the adjacent terminals in a direction along the opposing faces will increase. Thus, it is possible to effectively obviate the occurrence of short-circuits between the adjacent terminals caused by foreign material infiltrating between the outer side face of the terminal isolating part and the inner side face of the groove part.

Here, adopted may be a type where the connector housing includes a locked protrusion that is provided at a portion covered by the fitting-portion covering part, the locked protrusion protrudes toward an inner side face of the fitting-portion covering part, and the locked protrusion is adapted to flexurally deform in a direction opposing to its protruding direction, an inner side face of the fitting-portion covering part is formed with a locking hole as the connector holder, the locking hole is adapted to be engaged with the locked protrusion when the connector is in the fitting position, and a protruding dimension of the locked protrusion is set to a dimension so that, when the connector is inserted between the fitting-portion covering part and the placing face, the locked protrusion is to be flexurally deformed by being pressed by the inner side face of the fitting-portion covering part until the locked protrusion reaches a position where the locked protrusion is to be engaged with the locking hole, and, when the locked protrusion reaches the position, the locked protrusion is to elastically return the original shape to be engaged with the locking hole at the position.

According to the foregoing configuration, with a simple procedure of moving the connector to a predetermined position while flexurally deforming the locking protrusion and thereby elastically returning the locking protrusion, the connector can be easily retained in the fitting position.

Moreover, in the present invention, preferably a terminal array direction of the circuit-side terminals are substantially parallel with the placing face of the base member in a state where the electronic circuit body is placed on the placing face, and the connector holder holds the connector in a posture so that an array direction of the wire-side terminals is substantially parallel with the placing face.

According to the foregoing configuration, the circuit-side terminal is covered by the cover from a side opposing to the placing face in a state where the circuit-side terminals are arranged along the placing face. Thus, it is possible to suppress the unit dimension (thickness dimension) in a direction that is orthogonal to the placing face.

Moreover, in the present invention, preferably, the electronic circuit body includes a plurality of first circuit-side terminals and a plurality of second circuit-side terminals as the circuit-side terminal, the first circuit-side terminals protrude from the main-body of the electronic circuit body in a common first protruding direction, and the second circuit-side terminals protrude from the main-body of the electronic circuit body in a second protruding direction opposing to the first protruding direction; first connectors and second connectors are included as the connector, the first connector includes a plurality of first wire-side terminals each having a first fitting part adapted to fit with the respective first circuit-side terminals, the first wire-side terminals are fixed to respective ends of a plurality of wires, and the first connector has a first connector housing to hold the first wire-side terminals in an array corresponding to an array of the first circuit-side terminals, the second connector includes a plurality of second wire-side terminals each having a second fitting part adapted to fit with the respective second circuit-side terminals, and the second wire-side terminals are fixed to respective ends of a plurality of wires, the second connector has a second connector housing to hold the second wire-side terminals in an array corresponding to an array of the second circuit-side terminals; the cover includes a first fitting-portion covering part and a second fitting-portion covering part as the fitting-portion covering part, the first fitting-portion covering part extends from the main-body covering part in the first protruding direction, the first fitting-portion covering part is adapted to cover a fitting-portion of the first circuit-side terminals and the first fitting parts from a side opposing to the placing face in a first assembled state where the cover and the electronic circuit body are placed on the placing face and where the first circuit-side terminals fit with the first fitting parts, the second fitting-portion covering part extends from the main-body covering part in the second protruding direction, the second fitting-portion covering part is adapted to cover a fitting-portion of the second circuit-side terminals and the second fitting parts from a side opposing to the placing face in a second assembled state where the cover and the electronic circuit body are placed on the placing face and where the second circuit-side terminals fit with the second fitting parts; and the cover includes a first connector holder and a second connector holder as the connector holder, first connector holder is adapted to hold the first connector at a first fitting position where the first circuit-side terminals fit with the first fitting parts in the first assembled state, the second connector holder is adapted to hold the second connector at a second fitting position where the second circuit-side terminals fit with the second fitting parts in the second assembled state.

With the foregoing configuration, in comparison to a configuration where all circuit-side terminals face only one direction, numerous circuit-side terminals can be arranged in a small space. In addition, the common cover maintains the fit state of the fitting parts of the first and second wire-side terminals and the first and second circuit-side terminals, and protects the electronic circuit main body and the respective fitting-portions. Consequently, the structure can be simplified in comparison to a case where a separate cover is provided according to the first and second circuit-side terminals.

In the foregoing configuration, preferably, the first circuit-side terminals fit with the first fitting parts in a fitting direction that coincides with the first protruding direction, the second circuit-side terminals fit with the second fitting parts in a fitting direction that coincides with the second protruding direction, the first fitting-portion covering part has a shape adapted to cover the first circuit-side terminals from a side opposing to the placing face in a state where the cover and the electronic circuit body are placed on the placing face and where the first connector is positioned in a first detached position where the first fitting parts and the first circuit-side terminals are detached, and the first fitting-portion covering part has a shape adapted to form, in the state, an insertion space between the first fitting-portion covering part and the placing face so as to allow the first connector to be inserted from the first detached position to the first fitting position along the first protruding direction, and the second fitting-portion covering part has a shape adapted to cover the second circuit-side terminals from a side opposing to the placing face in a state where the cover and the electronic circuit body are placed on the placing face and where the second connector is positioned in a second detached position where the second fitting parts and the second circuit-side terminals are detached, and the second fitting-portion covering part has a shape adapted to form, in the state, an insertion space between the second fitting-portion covering part and the placing face so as to allow the second connector to be inserted from the second detached position to the second fitting position along the second protruding direction.

As a result of adopting the foregoing configuration, with a simple procedure of placing the electronic circuit body and the cover on the placing face and thereafter inserting the first connector and the second connector respectively between the cover and the placing face, the fitting of the fitting parts of the respective connectors and the respective circuit-side terminals, and the protection of the respective fitting-portions can be realized.

Moreover, in the present invention, preferably, the connector housing includes a contacted part adapted to be contacted with the cover, the cover includes a restricting part as the connector holder, the restricting part is adapted to prevent, in the assembled state, the connector from leaving the fitting position to a detached position apart from the fitting position in a fitting direction, where the circuit-side terminals and the fitting parts are detached, the fitting-portion covering part has a shape adapted to cover the fitting-portion so that, in the assembled state, the connector housing extends, or the wires extend outwardly from a portion between the fitting-portion covering part and the placing face along the protruding direction of the circuit-side terminals, the fitting-portion covering part and the main-body covering part are disposed at respective positions where the fitting-portion covering part and the main-body covering part cover respectively the fitting-portion and the main-body when the cover is placed over both the electronic circuit body and the connector in a state where the circuit-side terminals fit with the fitting parts, and the restricting part is disposed at a position where the contacted part is adapted to be come in contact with the restricting part from a detached position side toward a fitting position side when the cover is placed over both the electronic circuit body and the connector in a state where the circuit-side terminals fit with the fitting parts.

According to the foregoing configuration, the connector can be reliable retained in the fitting position by using the restricting part. Moreover, as a result of the cover being placed on the placing face on which are placed the electronic circuit body in which the circuit-side terminals and the fitting parts are in a fit state, and the connector, the cover can be disposed at a position of protecting the electronic circuit main body and the fitting-portion, and regulating the detachment of the connector. Thus, the fitting of the respective terminals is performed at the point in time that the cover is not covering the respective terminals. Consequently, the fitting of the respective terminals can be performed more reliably.

In the foregoing configuration, preferably, each of the connector housing and the fitting-portion covering part includes an opposing face that mutually face to each other in a direction which is substantially orthogonal to the protruding direction of the circuit-side terminals, one of the connector housing and the fitting-portion covering part includes a protrusion part adapted to protrude from the opposing face toward the other opposing face, the other opposing face has formed therein a recess part into which the protrusion part is inserted so as to block a gap between the opposing faces in a view from the protruding direction of the circuit-side terminals, and the protrusion part and the recess part extend across an overall direction encompassing the fitting-portion of each of the opposing faces.

According to the foregoing configuration, by inserting the protrusion part into the recess part, the gap between the opposing face of the connector housing and the opposing face of the fitting-portion covering part is blocked. Thus, it is possible to reliably obviate foreign material or the like from infiltrating from the outside to the fitting-portion side through the gap between the opposing faces. In particular, the protrusion part and the recess part are extending across an overall direction encompassing the fitting-portion. Consequently, it is possible to more reliably obviate the infiltration of foreign material or the like.

In the foregoing configuration, preferably, the electronic circuit body has a shape where the protruding direction of the circuit-side terminals coincide with the fitting direction, and the recess part and the protrusion part have a shape where one of these parts is adapted to contact with the other one from a detached position side toward a fitting position side.

As a result of adopting the foregoing configuration, the recess part and the protrusion part obviate the infiltration of foreign material, and restrict the detachment of the connector from the fitting position. In other words, the recess part and the protrusion part function to obviate the infiltration of foreign material, and also function as the restricting part and the contacted part. Accordingly, it is possible to obtain the foregoing effect with a simple configuration in comparison to a case of individually providing the elements having the foregoing functions.

Moreover, preferably, one of the connector housing and the fitting-portion covering part includes a standing wall part provided at a position displaced toward a tip-end side of the circuit-side terminals from a portion where the protrusion part is provided, the standing wall part extends substantially parallel with the protrusion part, and an end of the tip-end side of the circuit-side terminals of the other one of the connector housing and the fitting-portion covering part includes an end face disposed between the protrusion part and the standing wall part in the assembled state, the end face faces the standing wall part in the assembled state.

According to the foregoing configuration, in addition to the protrusion part and a recess part, one end of the connector housing and the fitting-portion covering part and the standing wall part obviate the infiltration of foreign material or the like from the outside to the fitting-portion. Consequently, it is possible to more reliably obviate the infiltration of foreign material or the like from the outside to the fitting-portion.

Moreover, preferably, the electronic circuit body has a shape so that, in a state where the electronic circuit body being placed on the placing face, a terminal array direction of the circuit-side terminals and the placing face are being substantially parallel, and that the protruding direction of the circuit-side terminals coincide with the fitting direction; each of the wire-side terminals includes a terminal contacted part adapted to be contacted with the fitting-portion covering part; the connector housing includes terminal insertion parts into which each of the wire-side terminals is inserted in the fitting direction; each of the terminal insertion parts includes an opening through which the terminal contacted part of the wire-side terminals inserted into the terminal insertion part is exposed to outside, from a side opposing to a side of the placing face on which the connector housing to be placed; the fitting-portion covering part includes a terminal restricting part adapted to be inserted into the opening so as to prevent, in the assembled state, the wire-side terminals from leaving the terminal fitting position, where the fitting parts fit with the circuit-side terminals, to a terminal detached position where the fitting parts and the circuit-side terminals are separated along the fitting direction and are detached; and the terminal restricting part comes into contact with the terminal contacted part from a terminal detached position side toward a terminal fitting position side when the cover is placed over both the electronic circuit body and the connector from a side opposing to a side of the placing face on which the electronic circuit body and the connector are placed in a state where the circuit-side terminals fit with the fitting parts.

According to the foregoing configuration, the terminal restricting part restricts the wire-side terminals from becoming detached from the terminal fitting position. Thus, the fit state of the wire-side terminal and the circuit-side terminal is more reliably maintained. In particular, the cover includes the terminal restricting part. In addition, the terminal restricting part is disposed at a position of regulating the detachment of the wire-side terminals pursuant to the cover being placed on the placing face on which are placed the electronic circuit body in which the circuit-side terminal and the fitting part are in a fit state, and the connector. Thus, the configuration can be simplified in comparison to a case of providing the parts for regulating the detachment of the terminals separate from the cover. Moreover, the detachment of the terminals can be restricted with a simple procedure of placing the cover on the placing face.

Moreover, preferably, the electronic circuit body includes a plurality of first circuit-side terminals and a plurality of second circuit-side terminals as the circuit-side terminal, the first circuit-side terminals protrude from the main-body of the electronic circuit body in a common first protruding direction, and the second circuit-side terminals protrude from the main-body of the electronic circuit body in a second protruding direction opposing to the first protruding direction; first connectors and second connectors are included as the connector, the first connector includes a plurality of first wire-side terminals each having a first fitting part adapted to fit with the respective first circuit-side terminals, the first wire-side terminals are fixed to respective ends of a plurality of wires, and the first connector has a first connector housing to hold the first wire-side terminals in an array corresponding to an array of the first circuit-side terminals, the second connector includes a plurality of second wire-side terminals each having a second fitting part adapted to fit with the respective second circuit-side terminals, the second wire-side terminals are fixed to respective ends of a plurality of wires, and the second connector has a second connector housing to hold the second wire-side terminals in an array corresponding to an array of the second circuit-side terminals; the first connector housing includes a first contacted part adapted to be contacted with the cover; the second connector housing includes a second contacted part adapted to be contacted with the cover; the cover includes a first fitting-portion covering part and a second fitting-portion covering part as the fitting-portion covering part, the first fitting-portion covering part has a shape extending from the main-body covering part in the first protruding direction so that the first fitting-portion covering part covers a first fitting-portion of the first circuit-side terminals and the first fitting parts, from a side opposing to the placing face, in an assembled state where the cover and the electronic circuit body are placed on the placing face, where the first circuit-side terminals fit with the first fitting parts, and where the second circuit-side terminals fit with the second fitting parts, the second fitting-portion covering part has a shape extending from the main-body covering part in the second protruding direction so that the second fitting-portion covering part covers a second fitting-portion of the second circuit-side terminals and the second fitting parts, from a side opposing to the placing face, in the assembled state; a first restricting part and a second restricting part are included as the restricting part, the first restricting part is adapted to restrict, in the assembled state, the first connector from leaving a first fitting position where the first circuit-side terminals fit with the first fitting parts, to a first detached position where the first circuit-side terminals and the first fitting parts are detached, thereby preventing the first connector from detaching the first fitting position in a fitting direction, the second restricting part is adapted to prevent, in the assembled state, the second connector from leaving a second fitting position where the second circuit-side terminals fit with the second fitting parts, to a second detached position where the second circuit-side terminals and the second fitting parts are detached, thereby preventing the second connector from detaching the second fitting position in a fitting direction; the first fitting-portion covering part has a shape adapted to cover the first fitting-portion so that, in the assembled state, the first connector housing or the wires held by the first connector housing are allowed to extend, in the first protruding direction, outwardly from a portion between the first fitting-portion covering part and the placing face, the first fitting-portion covering part is disposed at a position where the first fitting-portion covering part is adapted to cover, in a state where the first circuit-side terminals fit with the first fitting parts, the first fitting-portion when the cover is placed over the electronic circuit body and the first connector from a side opposing to a placing face side where the electronic circuit body and the first connector are placed; the second fitting-portion covering part has a shape adapted to cover the second fitting-portion so that, in the assembled state, the second connector housing is, or the wires held by the second connector housing are allowed to extend, in the second protruding direction, outwardly from a portion between the second fitting-portion covering part and the placing face, the second fitting-portion covering part is disposed at a position where the second fitting-portion covering part is adapted to cover, in a state where the second circuit-side terminals fit with the second fitting parts, the second fitting-portion when the cover is placed over the electronic circuit body and the second connector from a side opposing to placing face side where the electronic circuit body and the second connector are placed; the first restricting part is disposed at a position where the first restricting part is adapted to come into contact with the first contacted part from the first detached position side toward the first fitting position thereby restricting the first connector to move when the cover is placed over the electronic circuit body and the first connector from a side opposing to a side of the placing face on which the electronic circuit body and the first connector are placed, in a state where the first circuit-side terminals fit with the first fitting parts; and the second restricting part is disposed at a position where the second restricting part is adapted to come into contact with the second contacted part from the second detached position side toward the second fitting position thereby restricting the second connector to move when the cover is placed over the electronic circuit body and the second connector from a side opposing to a side of the placing face on which the electronic circuit body and the second connector are placed, in a state where the second circuit-side terminals fit with the second fitting parts.

With the foregoing configuration, in comparison to a case of all circuit-side terminals facing only one direction, numerous circuit-side terminations can be arranged in a small space. In addition, the common cover maintains the fit state of the fitting parts of the first and second wire-side terminals and the first and second circuit-side terminals, and protects the electronic circuit main body and the respective fitting-portions. Consequently, the structure can be simplified in comparison to a case where a separate cover is provided according to the first and second circuit-side terminals.

Moreover, in the present invention, preferably, while there is no particular limitation in the specific configuration for fixing the electronic circuit body and the connector to the base member, preferably adopted is a configuration comprising a fastening member adapted to fasten the electronic circuit body and the cover to the base member, and, preferably, each of the electronic circuit body and the cover includes a placing part, the placing part is formed with a fastening member through-hole through which the fastening member is adapted to be inserted; and, in a state where the cover and the electronic circuit body are fixed to the base member, the placing parts overlap in a direction that is orthogonal to the placing face of the base member, and the fastening member through-holes formed in the respective placing parts coincide with each other.

According to the foregoing structure, with a simple structure of inserting the common fastening member into the fastening member through-hole of the respective placing parts of the electronic circuit body and the connector, the electronic circuit body and the connector can be fastened on the placing face.

As a method of manufacturing the electronic circuit unit to be mounted on an automatic transmission for a vehicle, preferably adopted is a method comprising a fastening step to fasten the electronic circuit body and the cover to the base member in a state of being placed on the placing face, and a fit-part holding step wherein the connector is disposed at a fitting position where the fitting parts fit with the circuit-side terminals, to hold the connector at the fitting position by the connector holder, and, preferably, the fastening step includes placing the cover on the placing face, after placing the electronic circuit body on the placing face, at a position where the main-body covering part covers the main-body of the electronic circuit body from a side opposing to a placing face side and where the fitting-portion covering part covers the circuit-side terminals from a side opposing to the placing face side; and, the fit-part holding step includes inserting the connector between the fitting-portion covering part and the placing face from the detached position to the fitting position along the fitting direction thereby fitting the fitting parts and the circuit-side terminals.

With the foregoing method, after disposing the cover at a position where the main-body covering part covers the main-body of the electronic circuit body and at a position where the fitting-portion covering part covers the circuit-side terminal, the connector is inserted between the fitting-portion covering part and the placing face so as to fit the circuit-side terminals and the fitting parts. Thus, with a simple procedure of inserting the connector between the cover and the placing face, the fitting-portion of the fitting parts and the circuit-side terminals can be disposed at a position of being covered by the fitting-portion covering part.

In the foregoing method, preferably, the method employs an assembly jig and a fastening member, the assembly jig is adapted to temporarily lock the base member and the electronic circuit body, the fastening member is adapted to fasten the electronic circuit body and the cover to the base member; the assembly jig includes a temporary locking member adapted to temporarily lock the base member and the electronic circuit body; and each of the base member, the electronic circuit body, and the cover includes a placing part, the placing part is foisted with a through-hole through which the temporary locking member being adapted to be inserted, wherein the fastening step includes: a step of inserting the temporary locking member through the through-hole in the placing part of the base member to temporarily lock the base member to the assembly jig; a step of placing the electronic circuit body on the placing face of the base member that has been temporarily locked to the assembly jig, while inserting the temporary locking member through the through-hole in the placing part of the electronic circuit body; a step of fastening the cover onto the placing face of the base member that has been temporarily locked to the assembly jig, while inserting the temporary locking member through the through-hole in the placing part of the cover; a step of detaching, from the assembly jig, the base member on which the electronic circuit body and the cover are placed, by removing the temporary locking member from the through-holes in the respective placing parts of the base member, the electronic circuit body, and the cover; and a step of inserting the fastening member through each of the through-holes to fasten the electronic circuit body and the cover to the base member with the fastening member.

According to the foregoing method, the common temporary locking member temporarily locks the electronic circuit body and the cover on the placing face. Consequently, the positioning accuracy of the electronic circuit body and the cover can be improved. In other words, the cover can be more reliably disposed at a position of covering the fitting-portion of the circuit-side terminals and the wire-side terminals and the electronic circuit main body. In addition, the common fastening member fixes the electronic circuit body and the cover to the base member. Thus, the electronic circuit body and the cover can be reliably fixed to the foregoing position.

Moreover, as a method of manufacturing the electronic circuit unit to be mounted on an automatic transmission for a vehicle, adopted may be a method comprising a placing step of placing the electronic circuit body on the placing face, a fitting step of fitting the circuit-side terminals of the electronic circuit body and the fitting parts, and a fastening step of fastening the cover on the placing face, including steps of placing the cover over the electronic circuit body and the connector from a side opposing to the placing face, covering the main-body of the electronic circuit body with the main-body covering part from a side opposing to the placing face, covering the fitting-portion of the circuit-side terminals and the fitting parts with the fitting-portion covering part, contacting the restricting part with the contacted part provided to the connector housing from a detached position side toward a fitting position side, and fastening the cover to the base member.

With the foregoing method, after placing the electronic circuit body on the placing face and fitting the fitting parts with the circuit-side terminals of the electronic circuit body, the cover is fixed to the base member in a posture of covering the electronic circuit main body and the fitting-portion. Thus, the electronic circuit main body and the fitting-portion can be reliably covered with the cover.

In the foregoing method, preferably, the method employs an assembly jig, a guiding part, and a fastening member, the assembly jig includes a temporary locking member adapted to temporarily lock the electronic circuit body to the base member, the guiding part is adapted to guide the connector in the fitting position direction along the fitting direction; the temporary locking member and the fastening member are adapted to be inserted in a through-hole which is formed in the base member; each of the electronic circuit body and the cover has a through-hole adapted to pass through the temporary locking member and the fastening member; the placing step includes a step of inserting the temporary locking member into the through-hole in the base member to temporarily lock the base member to the assembly jig, and a step of placing the electronic circuit body on the placing face of the temporarily locked base member while inserting the temporary locking member into the through-hole in the placing part of the electronic circuit body; the fitting step includes a step of disposing the connector at the fitting position by guiding the connector by means of a guiding part of the assembly jig; and the fastening step includes a step of inserting the temporary locking member into the through-hole in the placing part of the cover to fasten the cover to the base member that has been temporarily locked to the assembly jig, a step of removing the temporary locking member from the respective through-holes of the base member, the electronic circuit body, and the cover thereby detaching, from the assembly jig, the base member on which the electronic circuit body, the connector, and the cover are placed, and a step of inserting a fastening member through each of the through-holes to fasten the electronic circuit body and the cover to the base member by using the fastening member.

With the foregoing method, the common assembly jig positions the electronic circuit body and the connector. Thus, the fitting of the circuit-side terminals of the electronic circuit body and the fitting parts held by the connector can be performed more reliably. Moreover, the cover is fixed to the base member in a state where the common temporary locking member is inserted into the through-hole in the placing part of the cover and the through-hole in the placing part of the electronic circuit body. Thus, the positioning accuracy of the cover and the electronic circuit body and the connector can be improved. Consequently, the cover can be more reliably disposed at a position of covering the electronic circuit main body and the fitting-portion. In addition, as a result of the common fastening member being inserted through the though-hole of the placing part of the cover and the through-hole in the placing part of the electronic circuit body, these components are fixed to the base member. Consequently, the cover can be more reliably fixed at a position of covering the electronic circuit main body and the fitting-portion. Moreover, the guiding part guides the connector to the fitting position. Thus, the fitting of the respective terminals can be easily and reliably realized.

Moreover, as a method of manufacturing the electronic circuit unit to be mounted on an automatic transmission for a vehicle, preferably, the method employs an assembly jig and a fastening member, the assembly jig including a temporary placing face, a temporary locking member, and a guiding part, the temporary placing face being adapted to place the electronic circuit body, the connector, and the cover, the temporary locking member being adapted to temporarily lock the base member and the electronic circuit body, the guiding part being adapted to guide the connector in the fitting position direction along the fitting direction; each of the electronic circuit body and the cover has a through-hole adapted to pass through the temporary locking member and the fastening member, and the base member is formed with a through-hole through which the fastening member is adapted to be inserted, the method includes: a temporary placing step to place the electronic circuit body on the temporary placing face in such a way that the temporary locking member is inserted into the through-hole in the placing part of the electronic circuit body so that the electronic circuit body is temporarily locked to the assembly jig; a fitting step to fit the circuit-side terminals of the electronic circuit body with the fitting parts in such a way that the guiding part of the assembly jig guides the connector thereby disposing the connector at the fitting position; a temporary locking step, wherein the cover is placed to cover the electronic circuit body and the connector from a side opposing to a side of the placing part on which the electronic circuit body and the connector are placed, allowing the temporary locking member to be inserted into the through-hole in the placing part of the cover, the temporary locking step is adapted to temporary lock the cover to the assembly jig so that the main-body covering part covers the main-body of the electronic circuit body from a side opposing to a side of the placing face on which the electronic circuit body and the connector are placed, the fitting-portion covering part covers a fitting-portion of the circuit-side terminals and the fitting parts, and the restricting part comes into contact with a contacted part provided on the connector housing from a detached position side toward a fitting position side; and a fastening step to fasten the electronic circuit body and the cover to the base member by the fastening member, wherein the temporary locking member is removed from the respective through-holes of the electronic circuit body and the cover thereby removing the electronic circuit body, the connector, and the cover from the assembly jig while retaining relative positions thereof, the electronic circuit body, the connector, and the cover are placed on the placing face of the base member while retaining the relative positions thereof, and the fastening member is inserted into each of the through-holes.

According to the foregoing method, the cover can be disposed at a position of covering the electronic circuit main body and the fitting-portion from a side opposing to the placing face, and at a position where the detachment of the connector from the fitting position can be restricted.

The invention claimed is:
1. An electronic circuit unit to be mounted within a casing of an automatic transmission for a vehicle, comprising:
   an electronic circuit body including a main-body and a plurality of circuit-side terminals, the main-body having a build-in electronic circuit, the circuit-side terminals being mutually protruding outwardly from the main-body in a common direction;
   a connector including a plurality of wire-side terminals and a connector housing, the wire-side terminals each having a fitting part adapted to fit with the respective circuit-side terminals, and the wire-side terminals being fixed to respective ends of a plurality of wires, the connector housing being adapted to hold the wire-side terminals in an array corresponding to an array of the circuit-side terminals;
   a base member including a placing face on which the electronic circuit body and the connector are to be placed, and the electronic circuit body being fixed on the placing face; and
   a cover placed on the placing face and fastened to the base member,
   wherein the cover includes:
   a main-body covering part adapted to cover the main-body of the electronic circuit body from a side opposing to the placing face in an assembled state where the cover and the electronic circuit body are placed on the placing face and where the circuit-side terminals fit on the fitting parts;
   a fitting-portion covering part extending from the main-body covering part in a protruding direction of the circuit-side terminals, the fitting-portion covering part being adapted to cover a fitting-portion of the circuit-side terminals and the fitting parts from a side opposing to the placing face in the assembled state; and
   a connector holder adapted to hold the connector at a fitting position where the circuit-side terminals fit with the fitting parts in the assembled state.
2. The electronic circuit unit to be mounted on an automatic transmission for a vehicle according to claim 1, wherein:
   the circuit-side terminals and the fitting parts fit in a fitting direction that coincides with the protruding direction of the circuit-side terminals; and
   the fitting-portion covering part has a shape adapted to cover the circuit-side terminals from a side opposing to the placing face in a state where the cover and the electronic circuit body are placed on the placing face and where the connector is positioned in a detached position where the fitting parts and the circuit-side terminals are detached, and the fitting-portion covering part has a shape adapted to form, in the state, an insertion space between the fitting-portion covering part and the placing face so as to allow the connector to be inserted from the detached position to the fitting position along the fitting direction.

3. The electronic circuit unit to be mounted on an automatic transmission for a vehicle according to claim 2, wherein the cover includes a guiding part adapted to guide the connector from the detached position to the fitting position along the fitting direction when the connector is inserted between the fitting-portion covering part and the placing face.

4. The electronic circuit unit to be mounted on an automatic transmission for a vehicle according to claim 2, wherein the cover includes terminal isolating parts, each of the terminal isolating parts is placed between the respective circuit-side terminals.

5. The electronic circuit unit to be mounted on an automatic transmission for a vehicle according to claim 4, wherein:
the connector housing includes an opposing face that is formed between the wire-side terminals, the opposing face faces, in the assembled state, a part of the electronic circuit body of the main-body between the circuit-side terminals;
at least a part of the opposing face forms a groove part recessed into the protruding direction of the circuit-side terminals; and
the terminal isolating part has a shape extending, in the assembled state, from an end on an electronic circuit body side of the opposing face to an opposing face side, or from a position of an electronic circuit body side closer than the end, so that at least a part of the terminal isolating part is placed in the groove part in the assembled state, and the terminal isolating part includes an outer side face extending along an inner side face of the groove part.

6. The electronic circuit unit to be mounted on an automatic transmission for a vehicle according to claim 2, wherein:
the connector housing includes a locked protrusion that is provided at a portion covered by the fitting-portion covering part, the locked protrusion protrudes toward an inner side face of the fitting-portion covering part, and the locked protrusion is adapted to flexurally deform in a direction opposing to its protruding direction;
an inner side face of the fitting-portion covering part is formed with a locking hole as the connector holder, the locking hole is adapted to be engaged with the locked protrusion when the connector is in the fitting position; and
a protruding dimension of the locked protrusion is set to a dimension so that, when the connector is inserted between the fitting-portion covering part and the placing face, the locked protrusion is to be flexurally deformed by being pressed by the inner side face of the fitting-portion covering part until the locked protrusion reaches a position where the locked protrusion is to be engaged with the locking hole, and, when the locked protrusion reaches the position, the locked protrusion is to elastically return the original shape to be engaged with the locking hole at the position.

7. The electronic circuit unit to be mounted on an automatic transmission for a vehicle according to claim 1, wherein:
a terminal array direction of the circuit-side terminals are substantially parallel with the placing face of the base member in a state where the electronic circuit body is placed on the placing face; and
the connector holder holds the connector in a posture so that an array direction of the wire-side terminals is substantially parallel with the placing face.

8. The electronic circuit unit to be mounted on an automatic transmission for a vehicle according to claim 1, wherein:
the electronic circuit body includes a plurality of first circuit-side terminals and a plurality of second circuit-side terminals as the circuit-side terminal, the first circuit-side terminals protrude from the main-body of the electronic circuit body in a common first protruding direction, and the second circuit-side terminals protrude from the main-body of the electronic circuit body in a second protruding direction opposing to the first protruding direction;
first connectors and second connectors are included as the connector, the first connector includes a plurality of first wire-side terminals each having a first fitting part adapted to fit with the respective first circuit-side terminals, the first wire-side terminals are fixed to respective ends of a plurality of wires, and the first connector has a first connector housing to hold the first wire-side terminals in an array corresponding to an array of the first circuit-side terminals, the second connector includes a plurality of second wire-side terminals each having a second fitting part adapted to fit with the respective second circuit-side terminals, and the second wire-side terminals are fixed to respective ends of a plurality of wires, the second connector has a second connector housing to hold the second wire-side terminals in an array corresponding to an array of the second circuit-side terminals;
the cover includes a first fitting-portion covering part and a second fitting-portion covering part as the fitting-portion covering part, the first fitting-portion covering part extends from the main-body covering part in the first protruding direction, the first fitting-portion covering part is adapted to cover a fitting-portion of the first circuit-side terminals and the first fitting parts from a side opposing to the placing face in a first assembled state where the cover and the electronic circuit body are placed on the placing face and where the first circuit-side terminals fit with the first fitting parts, the second fitting-portion covering part extends from the main-body covering part in the second protruding direction, the second fitting-portion covering part is adapted to cover a fitting-portion of the second circuit-side terminals and the second fitting parts from a side opposing to the placing face in a second assembled state where the cover and the electronic circuit body are placed on the placing face and where the second circuit-side terminals fit with the second fitting parts; and
the cover includes a first connector holder and a second connector holder as the connector holder, first connector holder is adapted to hold the first connector at a first fitting position where the first circuit-side terminals fit with the first fitting parts in the first assembled state, the second connector holder is adapted to hold the second connector at a second fitting position where the second circuit-side terminals fit with the second fitting parts in the second assembled state.

9. The electronic circuit unit to be mounted on an automatic transmission for a vehicle according to claim 8, wherein:
the first circuit-side terminals fit with the first fitting parts in a fitting direction that coincides with the first protruding direction,
the second circuit-side terminals fit with the second fitting parts in a fitting direction that coincides with the second protruding direction,
the first fitting-portion covering part has a shape adapted to cover the first circuit-side terminals from a side opposing to the placing face in a state where the cover and the electronic circuit body are placed on the placing face and where the first connector is positioned in a first detached position where the first fitting parts and the first circuit-side terminals are detached, and the first fitting-portion covering part has a shape adapted to form, in the state, an insertion space between the first fitting-portion covering part and the placing face so as to allow the first connector to be inserted from the first detached position to the first fitting position along the first protruding direction, and the second fitting-portion covering part has a shape adapted to cover the second circuit-side terminals from a side opposing to the placing face in a state where the cover and the electronic circuit body are placed on the placing face and where the second connector is positioned in a second detached position where the second fitting parts and the second circuit-side terminals are detached, and the second fitting-portion covering part has a shape adapted to form, in the state, an insertion space between the second fitting-portion covering part and the placing face so as to allow the second connector to be inserted from the second detached position to the second fitting position along the second protruding direction.

10. The electronic circuit unit to be mounted on an automatic transmission for a vehicle according to claim 1, wherein:

the connector housing includes a contacted part adapted to be contacted with the cover, the cover includes a restricting part as the connector holder, the restricting part is adapted to prevent, in the assembled state, the connector from leaving the fitting position to a detached position apart from the fitting position in a fitting direction, where the circuit-side terminals and the fitting parts are detached, the fitting-portion covering part has a shape adapted to cover the fitting-portion so that, in the assembled state, the connector housing extends, or the wires extend outwardly from a portion between the fitting-portion covering part and the placing face along the protruding direction of the circuit-side terminals, the fitting-portion covering part and the main-body covering part are disposed at respective positions where the fitting-portion covering part and the main-body covering part cover respectively the fitting-portion and the main-body when the cover is placed over both the electronic circuit body and the connector in a state where the circuit-side terminals fit with the fitting parts, and the restricting part is disposed at a position where the contacted part is adapted to be come in contact with the restricting part from a detached position side toward a fitting position side when the cover is placed over both the electronic circuit body and the connector in a state where the circuit-side terminals fit with the fitting parts.

11. The electronic circuit unit to be mounted on an automatic transmission for a vehicle according to claim 10, wherein:

each of the connector housing and the fitting-portion covering part includes an opposing face that mutually face to each other in a direction which is substantially orthogonal to the protruding direction of the circuit-side terminals, one of the connector housing and the fitting-portion covering part includes a protrusion part adapted to protrude from the opposing face toward the other opposing face, the other opposing face has formed therein a recess part into which the protrusion part is inserted so as to block a gap between the opposing faces in a view from the protruding direction of the circuit-side terminals, and the protrusion part and the recess part extend across an overall direction encompassing the fitting-portion of each of the opposing faces.

12. The electronic circuit unit to be mounted on an automatic transmission for a vehicle according to claim 11, wherein:

the electronic circuit body has a shape where the protruding direction of the circuit-side terminals coincide with the fitting direction; and the recess part and the protrusion part have a shape where one of these parts is adapted to contact with the other one from a detached position side toward a fitting position side.

13. The electronic circuit unit to be mounted on an automatic transmission for a vehicle according to claim 11, wherein:

one of the connector housing and the fitting-portion covering part includes a standing wall part provided at a position displaced toward a tip-end side of the circuit-side terminals from a portion where the protrusion part is provided, the standing wall part extends substantially parallel with the protrusion part, and an end of the tip-end side of the circuit-side terminals of the other one of the connector housing and the fitting-portion covering part includes an end face disposed between the protrusion part and the standing wall part in the assembled state, the end face faces the standing wall part in the assembled state.

14. The electronic circuit unit to be mounted on an automatic transmission for a vehicle according to claim 10, wherein:

the electronic circuit body has a shape so that, in a state where the electronic circuit body being placed on the placing face, a terminal array direction of the circuit-side terminals and the placing face are being substantially parallel, and that the protruding direction of the circuit-side terminals coincide with the fitting direction;

each of the wire-side terminals includes a terminal contacted part adapted to be contacted with the fitting-portion covering part;

the connector housing includes terminal insertion parts into which each of the wire-side terminals is inserted in the fitting direction;

each of the terminal insertion parts includes an opening through which the terminal contacted part of the wire-side terminals inserted into the terminal insertion part is exposed to outside, from a side opposing to a side of the placing face on which the connector housing to be placed;

the fitting-portion covering part includes a terminal restricting part adapted to be inserted into the opening so as to prevent, in the assembled state, the wire-side terminals from leaving the terminal fitting position, where the fitting parts fit with the circuit-side terminals, to a terminal detached position where the fitting parts and the circuit-side terminals are separated along the fitting direction and are detached; and the terminal restricting part comes into contact with the terminal contacted part from a terminal detached position side toward a terminal fitting position side when the cover is placed over both the electronic circuit body and the connector from a side opposing to a side of the placing face on which the electronic circuit body and the connector are placed in a state where the circuit-side terminals fit with the fitting parts.

15. The electronic circuit unit to be mounted on an automatic transmission for a vehicle according to claim 10, wherein:
- the electronic circuit body includes a plurality of first circuit-side terminals and a plurality of second circuit-side terminals as the circuit-side terminal, the first circuit-side terminals protrudes from the main-body of the electronic circuit body to a common first protruding direction, and the second circuit-side terminals protrudes from the main-body of the electronic circuit body to a second protruding direction opposing to the first protruding direction;
- first connectors and second connectors are included as the connector, the first connector includes a plurality of first wire-side terminals each having a first fitting part adapted to fit with the respective first circuit-side terminals, the first wire-side terminals are fixed to respective ends of a plurality of wires, and the first connector has a first connector housing to hold the first wire-side terminals in an array corresponding to an array of the first circuit-side terminals, the second connector includes a plurality of second wire-side terminals each having a second fitting part adapted to fit with the respective second circuit-side terminals, the second wire-side terminals are fixed to respective ends of a plurality of wires, and the second connector has a second connector housing to hold the second wire-side terminals in an array corresponding to an array of the second circuit-side terminals;
- the first connector housing includes a first contacted part adapted to be contacted with the cover;
- the second connector housing includes a second contacted part adapted to be contacted with the cover;
- the cover includes a first fitting-portion covering part and a second fitting-portion covering part as the fitting-portion covering part, the first fitting-portion covering part has a shape extending from the main-body covering part in the first protruding direction so that the first fitting-portion covering part covers a first fitting-portion of the first circuit-side terminals and the first fitting parts, from a side opposing to the placing face, in an assembled state where the cover and the electronic circuit body are placed on the placing face, where the first circuit-side terminals fit with the first fitting parts, and where the second circuit-side terminals fit with the second fitting parts, the second fitting-portion covering part has a shape extending from the main-body covering part in the second protruding direction so that the second fitting-portion covering part covers a second fitting-portion of the second circuit-side terminals and the second fitting parts, from a side opposing to the placing face, in the assembled state;
- a first restricting part and a second restricting part are included as the restricting part, the first restricting part is adapted to restrict, in the assembled state, the first connector from leaving a first fitting position where the first circuit-side terminals fit with the first fitting parts, to a first detached position where the first circuit-side terminals and the first fitting parts are detached, thereby preventing the first connector from detaching the first fitting position in a fitting direction, the second restricting part is adapted to prevent, in the assembled state, the second connector from leaving a second fitting position where the second circuit-side terminals fit with the second fitting parts, to a second detached position where the second circuit-side terminals and the second fitting parts are detached, thereby preventing the second connector from detaching the second fitting position in a fitting direction;
- the first fitting-portion covering part has a shape adapted to cover the first fitting-portion so that, in the assembled state, the first connector housing or the wires held by the first connector housing are allowed to extend, in the first protruding direction, outwardly from a portion between the first fitting-portion covering part and the placing face, the first fitting-portion covering part is disposed at a position where the first fitting-portion covering part is adapted to cover, in a state where the first circuit-side terminals fit with the first fitting parts, the first fitting-portion when the cover is placed over the electronic circuit body and the first connector from a side opposing to a placing face side where the electronic circuit body and the first connector are placed;
- the second fitting-portion covering part has a shape adapted to cover the second fitting-portion so that, in the assembled state, the second connector housing is, or the wires held by the second connector housing are allowed to extend, in the second protruding direction, outwardly from a portion between the second fitting-portion covering part and the placing face, the second fitting-portion covering part is disposed at a position where the second fitting-portion covering part is adapted to cover, in a state where the second circuit-side terminals fit with the second fitting parts, the second fitting-portion when the cover is placed over the electronic circuit body and the second connector from a side opposing to placing face side where the electronic circuit body and the second connector are placed;
- the first restricting part is disposed at a position where the first restricting part is adapted to come into contact with the first contacted part from the first detached position side toward the first fitting position thereby restricting the first connector to move when the cover is placed over the electronic circuit body and the first connector from a side opposing to a side of the placing face on which the electronic circuit body and the first connector are placed, in a state where the first circuit-side terminals fit with the first fitting parts; and
- the second restricting part is disposed at a position where the second restricting part is adapted to come into contact with the second contacted part from the second detached position side toward the second fitting position thereby restricting the second connector to move when the cover is placed over the electronic circuit body and the second connector from a side opposing to a side of the placing face on which the electronic circuit body and the second connector are placed, in a state where the second circuit-side terminals fit with the second fitting parts.

16. The electronic circuit unit to be mounted on an automatic transmission for a vehicle according to claim 1, further comprising a fastening member adapted to fasten the electronic circuit body and the cover to the base member,
wherein:
- each of the electronic circuit body and the cover includes a placing part, the placing part is formed with a fastening member through-hole through which the fastening member is adapted to be inserted; and
- in a state where the cover and the electronic circuit body are fixed to the base member, the placing parts overlap in a direction that is orthogonal to the placing face of the base member, and the fastening member through-holes formed in the respective placing parts coincide with each other.

17. A method of manufacturing the electronic circuit unit to be mounted on an automatic transmission for a vehicle according to claim 1,
the method comprising:
a fastening step to fasten the electronic circuit body and the cover to the base member in a state of being placed on the placing face; and
a fit-part holding step wherein the connector is disposed at a fitting position where the fitting parts fit with the circuit-side terminals, to hold the connector at the fitting position by the connector holder,
wherein:
the fastening step includes placing the cover on the placing face, after placing the electronic circuit body on the placing face, at a position where the main-body covering part covers the main-body of the electronic circuit body from a side opposing to a placing face side and where the fitting-portion covering part covers the circuit-side terminals from a side opposing to the placing face side; and
the fit-part holding step includes inserting the connector between the fitting-portion covering part and the placing face from the detached position to the fitting position along the fitting direction thereby fitting the fitting parts and the circuit-side terminals.

18. The method of manufacturing the electronic circuit unit to be mounted on an automatic transmission for a vehicle according to claim 17, wherein:
the method employs an assembly jig and a fastening member, the assembly jig is adapted to temporarily lock the base member and the electronic circuit body, the fastening member is adapted to fasten the electronic circuit body and the cover to the base member;
the assembly jig includes a temporary locking member adapted to temporarily lock the base member and the electronic circuit body; and
each of the base member, the electronic circuit body, and the cover includes a placing part, the placing part is formed with a through-hole through which the temporary locking member being adapted to be inserted,
wherein the fastening step includes:
a step of inserting the temporary locking member through the through-hole in the placing part of the base member to temporarily lock the base member to the assembly jig;
a step of placing the electronic circuit body on the placing face of the base member that has been temporarily locked to the assembly jig, while inserting the temporary locking member through the through-hole in the placing part of the electronic circuit body;
a step of fastening the cover onto the placing face of the base member that has been temporarily locked to the assembly jig, while inserting the temporary locking member through the through-hole in the placing part of the cover;
a step of detaching, from the assembly jig, the base member on which the electronic circuit body and the cover are placed, by removing the temporary locking member from the through-holes in the respective placing parts of the base member, the electronic circuit body, and the cover; and
a step of inserting the fastening member through each of the through-holes to fasten the electronic circuit body and the cover to the base member with the fastening member.

19. A method of manufacturing the electronic circuit unit to be mounted on an automatic transmission for a vehicle according to claim 10, comprising:
a placing step of placing the electronic circuit body on the placing face;
a fitting step of fitting the circuit-side terminals of the electronic circuit body and the fitting parts; and
a fastening step of fastening the cover on the placing face, including steps of placing the cover over the electronic circuit body and the connector from a side opposing to the placing face, covering the main-body of the electronic circuit body with the main-body covering part from a side opposing to the placing face, covering the fitting-portion of the circuit-side terminals and the fitting parts with the fitting-portion covering part, contacting the restricting part with the contacted part provided to the connector housing from a detached position side toward a fitting position side, and fastening the cover to the base member.

20. The method of manufacturing the electronic circuit unit to be mounted on an automatic transmission for a vehicle according to claim 19, wherein:
the method employs an assembly jig, a guiding part, and a fastening member, the assembly jig includes a temporary locking member adapted to temporarily lock the electronic circuit body to the base member, the guiding part is adapted to guide the connector in the fitting position direction along the fitting direction;
the temporary locking member and the fastening member are adapted to be inserted in a through-hole which is formed in the base member;
each of the electronic circuit body and the cover has a through-hole adapted to pass through the temporary locking member and the fastening member;
the placing step includes a step of inserting the temporary locking member into the through-hole in the base member to temporarily lock the base member to the assembly jig, and a step of placing the electronic circuit body on the placing face of the temporarily locked base member while inserting the temporary locking member into the through-hole in the placing part of the electronic circuit body;
the fitting step includes a step of disposing the connector at the fitting position by guiding the connector by means of a guiding part of the assembly jig; and
the fastening step includes a step of inserting the temporary locking member into the through-hole in the placing part of the cover to fasten the cover to the base member that has been temporarily locked to the assembly jig, a step of removing the temporary locking member from the respective through-holes of the base member, the electronic circuit body, and the cover thereby detaching, from the assembly jig, the base member on which the electronic circuit body, the connector, and the cover are placed, and a step of inserting a fastening member through each of the through-holes to fasten the electronic circuit body and the cover to the base member by using the fastening member.

21. A method of manufacturing the electronic circuit unit to be mounted on an automatic transmission for a vehicle according to claim 10, wherein:
the method employs an assembly jig and a fastening member, the assembly jig including a temporary placing face, a temporary locking member, and a guiding part, the temporary placing face being adapted to place the electronic circuit body, the connector, and the cover, the temporary locking member being adapted to temporarily lock the base member and the electronic circuit body, the guiding part being adapted to guide the connector in the fitting position direction along the fitting direction;

each of the electronic circuit body and the cover has a through-hole adapted to pass through the temporary locking member and the fastening member, and the base member is formed with a through-hole through which the fastening member is adapted to be inserted, the method comprising:

a temporary placing step to place the electronic circuit body on the temporary placing face in such a way that the temporary locking member is inserted into the through-hole in the placing part of the electronic circuit body so that the electronic circuit body is temporarily locked to the assembly jig;

a fitting step to fit the circuit-side terminals of the electronic circuit body with the fitting parts in such a way that the guiding part of the assembly jig guides the connector thereby disposing the connector at the fitting position;

a temporary locking step, wherein the cover is placed to cover the electronic circuit body and the connector from a side opposing to a side of the placing part on which the electronic circuit body and the connector are placed, allowing the temporary locking member to be inserted into the through-hole in the placing part of the cover, the temporary locking step is adapted to temporary lock the cover to the assembly jig so that the main-body covering part covers the main-body of the electronic circuit body from a side opposing to a side of the placing face on which the electronic circuit body and the connector are placed, the fitting-portion covering part covers a fitting-portion of the circuit-side terminals and the fitting parts, and the restricting part comes into contact with a contacted part provided on the connector housing from a detached position side toward a fitting position side; and a fastening step to fasten the electronic circuit body and the cover to the base member by the fastening member, wherein the temporary locking member is removed from the respective through-holes of the electronic circuit body and the cover thereby removing the electronic circuit body, the connector, and the cover from the assembly jig while retaining relative positions thereof, the electronic circuit body, the connector, and the cover are placed on the placing face of the base member while retaining the relative positions thereof, and the fastening member is inserted into each of the through-holes.

* * * * *